(12) United States Patent
Costa et al.

(10) Patent No.: US 12,482,731 B2
(45) Date of Patent: Nov. 25, 2025

(54) MULTI-LEVEL 3D STACKED PACKAGE AND METHODS OF FORMING THE SAME

(71) Applicant: Qorvo US, Inc., Greensboro, NC (US)

(72) Inventors: Julio C. Costa, Oak Ridge, NC (US); George Maxim, Saratoga, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 307 days.

(21) Appl. No.: 18/254,162

(22) PCT Filed: Dec. 13, 2021

(86) PCT No.: PCT/US2021/063094
§ 371 (c)(1),
(2) Date: May 23, 2023

(87) PCT Pub. No.: WO2022/126016
PCT Pub. Date: Jun. 16, 2022

(65) Prior Publication Data
US 2024/0030117 A1    Jan. 25, 2024

Related U.S. Application Data

(60) Provisional application No. 63/124,456, filed on Dec. 11, 2020.

(51) Int. Cl.
*H01L 23/498* (2006.01)
*H01L 23/00* (2006.01)
*H01L 25/065* (2023.01)

(52) U.S. Cl.
CPC .. *H01L 23/49816* (2013.01); *H01L 23/49822* (2013.01); *H01L 24/16* (2013.01);
(Continued)

(58) Field of Classification Search
CPC ......... H01L 23/49816; H01L 23/49822; H01L 24/16; H01L 24/32; H01L 24/73;
(Continued)

(56) References Cited

U.S. PATENT DOCUMENTS 4,093,562 A    6/1978  Kishimoto
4,366,202 A   12/1982  Borovsky
(Continued)

FOREIGN PATENT DOCUMENTS

CN    1256300 A     6/2000
CN    1696231 A    11/2005
(Continued)

OTHER PUBLICATIONS

US 10,896,908 B2, 01/2021, Costa et al. (withdrawn)
(Continued)

*Primary Examiner* — Tu-Tu V Ho
(74) *Attorney, Agent, or Firm* — Withrow & Terranova, P.L.L.C.

(57) ABSTRACT

The present disclosure relates to a multi-level three-dimensional (3D) package with multiple package levels vertically stacked. Each package level includes a redistribution structure and a die section over the redistribution structure. Each die section includes a thinned die that includes substantially no silicon substrate and has a thickness between several micrometers and several tens of micrometers, a mold compound, and an intermediary mold compound. Herein, the thinned die and the mold compound are deposed over the redistribution structure, the mold compound surrounds the thinned die and extends vertically beyond a top surface of the thinned die to define an opening over the thinned die and within the mold compound, the intermediary mold compound resides over the thinned die and fills the opening within the inner mold compound, such that a top surface of
(Continued)

the intermediary mold compound and a top surface of the mold compound are coplanar.

26 Claims, 37 Drawing Sheets

(52) U.S. Cl.
CPC ............... *H01L 24/32* (2013.01); *H01L 24/73* (2013.01); *H01L 25/0657* (2013.01); *H01L 2224/16146* (2013.01); *H01L 2224/16235* (2013.01); *H01L 2224/32146* (2013.01); *H01L 2224/32235* (2013.01); *H01L 2224/73253* (2013.01); *H01L 2225/06517* (2013.01); *H01L 2225/06586* (2013.01); *H01L 2924/15321* (2013.01); *H01L 2924/182* (2013.01)

(58) Field of Classification Search
CPC ....... H01L 25/0657; H01L 2224/16146; H01L 2224/16235; H01L 2224/32146; H01L 2224/32235; H01L 2224/73253; H01L 2225/06517; H01L 2225/06586; H01L 2924/15321; H01L 2924/182
USPC ........................................................ 257/737
See application file for complete search history.

(56) References Cited

U.S. PATENT DOCUMENTS

| | | |
|---|---|---|
| 5,013,681 A | 5/1991 | Godbey et al. |
| 5,061,663 A | 10/1991 | Bolt et al. |
| 5,069,626 A | 12/1991 | Patterson et al. |
| 5,164,687 A | 11/1992 | Kurian et al. |
| 5,294,295 A | 3/1994 | Gabriel |
| 5,362,972 A | 11/1994 | Yazawa et al. |
| 5,391,257 A | 2/1995 | Sullivan et al. |
| 5,459,368 A | 10/1995 | Onishi et al. |
| 5,646,432 A | 7/1997 | Iwaki et al. |
| 5,648,013 A | 7/1997 | Uchida et al. |
| 5,699,027 A | 12/1997 | Tsuji et al. |
| 5,709,960 A | 1/1998 | Mays et al. |
| 5,729,075 A | 3/1998 | Strain |
| 5,831,369 A | 11/1998 | Fürbacher et al. |
| 5,920,142 A | 7/1999 | Onishi et al. |
| 6,072,557 A | 6/2000 | Kishimoto |
| 6,084,284 A | 7/2000 | Adamic, Jr. |
| 6,137,125 A | 10/2000 | Costas et al. |
| 6,154,366 A | 11/2000 | Ma et al. |
| 6,154,372 A | 11/2000 | Kalivas et al. |
| 6,235,554 B1 | 5/2001 | Akram et al. |
| 6,236,061 B1 | 5/2001 | Walpita |
| 6,268,654 B1 | 7/2001 | Glenn et al. |
| 6,271,469 B1 | 8/2001 | Ma et al. |
| 6,377,112 B1 | 4/2002 | Rozsypal |
| 6,423,570 B1 | 7/2002 | Ma et al. |
| 6,426,559 B1 | 7/2002 | Bryan et al. |
| 6,441,498 B1 | 8/2002 | Song |
| 6,446,316 B1 | 9/2002 | Fürbacher et al. |
| 6,578,458 B1 | 6/2003 | Akram et al. |
| 6,649,012 B2 | 11/2003 | Masayuki et al. |
| 6,703,688 B1 | 3/2004 | Fitzgerald |
| 6,713,859 B1 | 3/2004 | Ma |
| 6,841,413 B2 | 1/2005 | Liu et al. |
| 6,864,156 B1 | 3/2005 | Conn |
| 6,864,540 B1 | 3/2005 | Divakaruni et al. |
| 6,902,950 B2 | 6/2005 | Ma et al. |
| 6,943,429 B1 | 9/2005 | Glenn et al. |
| 6,964,889 B2 | 11/2005 | Ma et al. |
| 6,992,400 B2 | 1/2006 | Tikka et al. |
| 7,042,072 B1 | 5/2006 | Kim et al. |
| 7,049,692 B2 | 5/2006 | Nishimura et al. |
| 7,064,391 B1 | 6/2006 | Conn |
| 7,109,635 B1 | 9/2006 | McClure et al. |
| 7,183,172 B2 | 2/2007 | Lee et al. |
| 7,190,064 B2 | 3/2007 | Wakabayashi et al. |
| 7,238,560 B2 | 7/2007 | Sheppard et al. |
| 7,279,750 B2 | 10/2007 | Jobetto |
| 7,288,435 B2 | 10/2007 | Aigner et al. |
| 7,307,003 B2 | 12/2007 | Reif et al. |
| 7,342,303 B1 | 3/2008 | Berry et al. |
| 7,393,770 B2 | 7/2008 | Wood et al. |
| 7,402,901 B2 | 7/2008 | Hatano et al. |
| 7,427,824 B2 | 9/2008 | Iwamoto et al. |
| 7,489,032 B2 | 2/2009 | Jobetto |
| 7,596,849 B1 | 10/2009 | Carpenter et al. |
| 7,619,347 B1 | 11/2009 | Bhattacharjee |
| 7,635,636 B2 | 12/2009 | McClure et al. |
| 7,714,535 B2 | 5/2010 | Yamazaki et al. |
| 7,723,838 B2 | 5/2010 | Takeuchi et al. |
| 7,749,882 B2 | 7/2010 | Kweon et al. |
| 7,790,543 B2 | 9/2010 | Abadeer et al. |
| 7,816,231 B2 | 10/2010 | Dyer et al. |
| 7,843,072 B1 | 11/2010 | Park et al. |
| 7,855,101 B2 | 12/2010 | Furman et al. |
| 7,868,419 B1 | 1/2011 | Kerr et al. |
| 7,910,405 B2 | 3/2011 | Okada et al. |
| 7,955,955 B2 | 6/2011 | Lane et al. |
| 7,960,218 B2 | 6/2011 | Ma et al. |
| 8,004,089 B2 | 8/2011 | Jobetto |
| 8,183,151 B2 | 5/2012 | Lake |
| 8,299,633 B2 | 10/2012 | Su |
| 8,420,447 B2 | 4/2013 | Tay et al. |
| 8,503,186 B2 | 8/2013 | Lin et al. |
| 8,563,403 B1 | 10/2013 | Farooq et al. |
| 8,568,547 B2 | 10/2013 | Yamazaki et al. |
| 8,643,148 B2 | 2/2014 | Lin et al. |
| 8,658,475 B1 | 2/2014 | Kerr |
| 8,664,044 B2 | 3/2014 | Jin et al. |
| 8,772,853 B2 | 7/2014 | Hong et al. |
| 8,791,532 B2 | 7/2014 | Graf et al. |
| 8,802,495 B2 | 8/2014 | Kim et al. |
| 8,803,242 B2 | 8/2014 | Marino et al. |
| 8,816,407 B2 | 8/2014 | Kim et al. |
| 8,835,978 B2 | 9/2014 | Mauder et al. |
| 8,906,755 B1 | 12/2014 | Hekmatshoartabari et al. |
| 8,921,990 B2 | 12/2014 | Park et al. |
| 8,927,968 B2 | 1/2015 | Cohen et al. |
| 8,941,248 B2 | 1/2015 | Lin et al. |
| 8,963,321 B2 | 2/2015 | Lenniger et al. |
| 8,983,399 B2 | 3/2015 | Kawamura et al. |
| 9,064,883 B2 | 6/2015 | Meyer et al. |
| 9,165,793 B1 | 10/2015 | Wang et al. |
| 9,214,337 B2 | 12/2015 | Carroll et al. |
| 9,349,700 B2 | 5/2016 | Hsieh et al. |
| 9,368,429 B2 | 6/2016 | Ma et al. |
| 9,406,637 B2 | 8/2016 | Wakisaka et al. |
| 9,461,001 B1 | 10/2016 | Tsai et al. |
| 9,520,428 B2 | 12/2016 | Fujimori |
| 9,530,709 B2 | 12/2016 | Leipold et al. |
| 9,613,831 B2 | 4/2017 | Morris et al. |
| 9,646,856 B2 | 5/2017 | Meyer et al. |
| 9,653,428 B1 | 5/2017 | Hiner et al. |
| 9,698,081 B2 | 7/2017 | Yu et al. |
| 9,786,586 B1 | 10/2017 | Shih |
| 9,812,350 B2 | 11/2017 | Costa |
| 9,824,951 B2 | 11/2017 | Leipold et al. |
| 9,824,974 B2 | 11/2017 | Gao et al. |
| 9,859,254 B1 | 1/2018 | Yu et al. |
| 9,875,971 B2 | 1/2018 | Bhushan et al. |
| 9,941,245 B2 | 4/2018 | Skeete et al. |
| 10,134,837 B1 | 11/2018 | Fanelli et al. |
| 10,727,212 B2 | 7/2020 | Moon et al. |
| 10,784,348 B2 | 9/2020 | Fanelli et al. |
| 10,882,740 B2 | 1/2021 | Costa et al. |
| 11,646,289 B2 | 5/2023 | Costa et al. |
| 12,199,065 B2 * | 1/2025 | Yu ........................... H01L 24/03 |
| 2001/0004131 A1 | 6/2001 | Masayuki et al. |
| 2002/0070443 A1 | 6/2002 | Mu et al. |
| 2002/0074641 A1 | 6/2002 | Towle et al. |
| 2002/0127769 A1 | 9/2002 | Ma et al. |
| 2002/0127780 A1 | 9/2002 | Ma et al. |
| 2002/0137263 A1 | 9/2002 | Towle et al. |

(56) References Cited

U.S. PATENT DOCUMENTS

| | | |
|---|---|---|
| 2002/0185675 A1 | 12/2002 | Furukawa |
| 2003/0207515 A1 | 11/2003 | Tan et al. |
| 2004/0021152 A1 | 2/2004 | Nguyen et al. |
| 2004/0093901 A1 | 5/2004 | Kim et al. |
| 2004/0164367 A1 | 8/2004 | Park |
| 2004/0166642 A1 | 8/2004 | Chen et al. |
| 2004/0173790 A1 | 9/2004 | Yeo et al. |
| 2004/0219765 A1 | 11/2004 | Reif et al. |
| 2004/0266159 A1 | 12/2004 | Gardecki et al. |
| 2005/0037595 A1 | 2/2005 | Nakahata |
| 2005/0077511 A1 | 4/2005 | Fitzergald |
| 2005/0079686 A1 | 4/2005 | Aigner et al. |
| 2005/0212419 A1 | 9/2005 | Vazan et al. |
| 2005/0258447 A1 | 11/2005 | Oi et al. |
| 2005/0260842 A1 | 11/2005 | Kaltalioglu et al. |
| 2006/0009041 A1 | 1/2006 | Iyer et al. |
| 2006/0057782 A1 | 3/2006 | Gardes et al. |
| 2006/0099781 A1 | 5/2006 | Beaumont et al. |
| 2006/0105496 A1 | 5/2006 | Chen et al. |
| 2006/0108585 A1 | 5/2006 | Gan et al. |
| 2006/0110887 A1 | 5/2006 | Huang |
| 2006/0124961 A1 | 6/2006 | Sakaguchi et al. |
| 2006/0228074 A1 | 10/2006 | Lipson et al. |
| 2006/0261446 A1 | 11/2006 | Wood et al. |
| 2007/0020807 A1 | 1/2007 | Geefay et al. |
| 2007/0034910 A1 | 2/2007 | Shie |
| 2007/0045738 A1 | 3/2007 | Jones et al. |
| 2007/0069393 A1 | 3/2007 | Asahi et al. |
| 2007/0075317 A1 | 4/2007 | Kato et al. |
| 2007/0121326 A1 | 5/2007 | Nall et al. |
| 2007/0122943 A1 | 5/2007 | Foong et al. |
| 2007/0158746 A1 | 7/2007 | Ohguro |
| 2007/0181992 A1 | 8/2007 | Lake |
| 2007/0190747 A1 | 8/2007 | Humpston et al. |
| 2007/0194342 A1 | 8/2007 | Kinzer |
| 2007/0252481 A1 | 11/2007 | Iwamoto et al. |
| 2007/0276092 A1 | 11/2007 | Kanae et al. |
| 2008/0020513 A1 | 1/2008 | Jobetto |
| 2008/0050852 A1 | 2/2008 | Hwang et al. |
| 2008/0050901 A1 | 2/2008 | Kweon et al. |
| 2008/0087959 A1 | 4/2008 | Monfray et al. |
| 2008/0157303 A1 | 7/2008 | Yang |
| 2008/0164528 A1 | 7/2008 | Cohen et al. |
| 2008/0251927 A1 | 10/2008 | Zhao et al. |
| 2008/0265978 A1 | 10/2008 | Englekirk |
| 2008/0272497 A1 | 11/2008 | Lake |
| 2008/0277800 A1 | 11/2008 | Hwang et al. |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0090979 A1 | 4/2009 | Zhu et al. |
| 2009/0179266 A1 | 7/2009 | Abadeer et al. |
| 2009/0230542 A1 | 9/2009 | Lin et al. |
| 2009/0243097 A1 | 10/2009 | Koroku et al. |
| 2009/0261460 A1 | 10/2009 | Kuan et al. |
| 2009/0302484 A1 | 12/2009 | Lee et al. |
| 2010/0003803 A1 | 1/2010 | Oka et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0105209 A1 | 4/2010 | Winniczek et al. |
| 2010/0109122 A1 | 5/2010 | Ding et al. |
| 2010/0120204 A1 | 5/2010 | Kunimoto |
| 2010/0127340 A1 | 5/2010 | Sugizaki |
| 2010/0173436 A1 | 7/2010 | Ouellet et al. |
| 2010/0200919 A1 | 8/2010 | Kikuchi |
| 2010/0314637 A1 | 12/2010 | Kim et al. |
| 2011/0003433 A1 | 1/2011 | Harayama et al. |
| 2011/0018126 A1 | 1/2011 | Kling et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0133341 A1 | 6/2011 | Shimizu et al. |
| 2011/0171792 A1 | 7/2011 | Chang et al. |
| 2011/0227158 A1 | 9/2011 | Zhu |
| 2011/0272800 A1 | 11/2011 | Chino |
| 2011/0272824 A1 | 11/2011 | Pagaila |
| 2011/0294244 A1 | 12/2011 | Hattori et al. |
| 2012/0003813 A1 | 1/2012 | Chuang et al. |
| 2012/0045871 A1 | 2/2012 | Lee et al. |
| 2012/0068276 A1 | 3/2012 | Lin et al. |
| 2012/0091520 A1 | 4/2012 | Nakamura |
| 2012/0094418 A1 | 4/2012 | Grama et al. |
| 2012/0098074 A1 | 4/2012 | Lin et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2012/0313243 A1 | 12/2012 | Chang et al. |
| 2013/0001665 A1 | 1/2013 | Zhu et al. |
| 2013/0015429 A1 | 1/2013 | Hong et al. |
| 2013/0037929 A1 | 2/2013 | Essig et al. |
| 2013/0049205 A1 | 2/2013 | Meyer et al. |
| 2013/0082399 A1 | 4/2013 | Kim et al. |
| 2013/0099315 A1 | 4/2013 | Zhu et al. |
| 2013/0105966 A1 | 5/2013 | Kelkar et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0221493 A1 | 8/2013 | Kim et al. |
| 2013/0241040 A1 | 9/2013 | Tojo et al. |
| 2013/0280826 A1 | 10/2013 | Scanlan et al. |
| 2013/0299871 A1 | 11/2013 | Mauder et al. |
| 2013/0334698 A1 | 12/2013 | Mohammed et al. |
| 2014/0015131 A1 | 1/2014 | Meyer et al. |
| 2014/0021583 A1 | 1/2014 | Lo et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0219604 A1 | 8/2014 | Hackler, Sr. et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0323064 A1 | 10/2014 | McCarthy |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2014/0356602 A1 | 12/2014 | Oh et al. |
| 2015/0015321 A1 | 1/2015 | Dribinsky et al. |
| 2015/0021754 A1 | 1/2015 | Lin et al. |
| 2015/0060956 A1 | 3/2015 | Chen |
| 2015/0060967 A1 | 3/2015 | Yokoyama et al. |
| 2015/0076713 A1 | 3/2015 | Tsai et al. |
| 2015/0097302 A1 | 4/2015 | Wakisaka et al. |
| 2015/0108666 A1 | 4/2015 | Engelhardt et al. |
| 2015/0115416 A1 | 4/2015 | Costa et al. |
| 2015/0130045 A1 | 5/2015 | Tseng et al. |
| 2015/0136858 A1 | 5/2015 | Finn et al. |
| 2015/0162307 A1 | 6/2015 | Chen et al. |
| 2015/0171006 A1 | 6/2015 | Hung et al. |
| 2015/0171243 A1 | 6/2015 | Lee |
| 2015/0197419 A1 | 7/2015 | Cheng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380394 A1 | 12/2015 | Jang et al. |

(56) References Cited

U.S. PATENT DOCUMENTS

| | | |
|---|---|---|
| 2015/0380523 A1 | 12/2015 | Hekmatshoartabari et al. |
| 2016/0002510 A1 | 1/2016 | Champagne et al. |
| 2016/0056544 A1 | 2/2016 | Garcia et al. |
| 2016/0079137 A1 | 3/2016 | Leipold et al. |
| 2016/0079233 A1 | 3/2016 | Deboy et al. |
| 2016/0093580 A1 | 3/2016 | Scanlan et al. |
| 2016/0100489 A1 | 4/2016 | Costa et al. |
| 2016/0118414 A1 | 4/2016 | Singh et al. |
| 2016/0126111 A1 | 5/2016 | Leipold et al. |
| 2016/0126196 A1 | 5/2016 | Leipold et al. |
| 2016/0133591 A1 | 5/2016 | Hong et al. |
| 2016/0141249 A1 | 5/2016 | Kang et al. |
| 2016/0141263 A1 | 5/2016 | Lin et al. |
| 2016/0155706 A1 | 6/2016 | Yoneyama et al. |
| 2016/0260745 A1 | 9/2016 | Huang et al. |
| 2016/0284568 A1 | 9/2016 | Morris et al. |
| 2016/0284570 A1 | 9/2016 | Morris et al. |
| 2016/0300771 A1 | 10/2016 | Lin |
| 2016/0343592 A1 | 11/2016 | Costa et al. |
| 2016/0343604 A1 | 11/2016 | Costa et al. |
| 2016/0347609 A1 | 12/2016 | Yu et al. |
| 2016/0362292 A1 | 12/2016 | Chang et al. |
| 2017/0005000 A1 | 1/2017 | Beyne |
| 2017/0024503 A1 | 1/2017 | Connelly |
| 2017/0032957 A1 | 2/2017 | Costa et al. |
| 2017/0033026 A1 | 2/2017 | Ho et al. |
| 2017/0053938 A1 | 2/2017 | Whitefield |
| 2017/0062284 A1 | 3/2017 | Mason et al. |
| 2017/0062366 A1 | 3/2017 | Enquist |
| 2017/0077028 A1 | 3/2017 | Maxim et al. |
| 2017/0084596 A1 | 3/2017 | Scanlan |
| 2017/0098587 A1 | 4/2017 | Leipold et al. |
| 2017/0190572 A1 | 7/2017 | Pan et al. |
| 2017/0200648 A1 | 7/2017 | Lee et al. |
| 2017/0207350 A1 | 7/2017 | Leipold et al. |
| 2017/0263539 A1 | 9/2017 | Gowda et al. |
| 2017/0271200 A1 | 9/2017 | Costa |
| 2017/0323804 A1 | 11/2017 | Costa et al. |
| 2017/0323860 A1 | 11/2017 | Costa et al. |
| 2017/0334710 A1 | 11/2017 | Costa et al. |
| 2017/0358511 A1 | 12/2017 | Costa et al. |
| 2018/0005991 A1 | 1/2018 | Seidemann et al. |
| 2018/0019184 A1 | 1/2018 | Costa et al. |
| 2018/0019185 A1 | 1/2018 | Costa et al. |
| 2018/0042110 A1 | 2/2018 | Cok |
| 2018/0044169 A1 | 2/2018 | Hatcher, Jr. et al. |
| 2018/0044177 A1 | 2/2018 | Vandemeer et al. |
| 2018/0047653 A1 | 2/2018 | Costa et al. |
| 2018/0076174 A1 | 3/2018 | Costa et al. |
| 2018/0138082 A1 | 5/2018 | Costa et al. |
| 2018/0138092 A1 | 5/2018 | Lee et al. |
| 2018/0138227 A1 | 5/2018 | Shimotsusa et al. |
| 2018/0145678 A1 | 5/2018 | Maxim et al. |
| 2018/0151461 A1 | 5/2018 | Cho |
| 2018/0166358 A1 | 6/2018 | Costa et al. |
| 2018/0240759 A1 | 8/2018 | Haji-Rahim et al. |
| 2018/0240797 A1 | 8/2018 | Yokoyama et al. |
| 2018/0261470 A1 | 9/2018 | Costa et al. |
| 2018/0269188 A1 | 9/2018 | Yu et al. |
| 2018/0275485 A1 | 9/2018 | Hurwitz |
| 2018/0277632 A1 | 9/2018 | Fanelli et al. |
| 2018/0331041 A1 | 11/2018 | Liao et al. |
| 2018/0342439 A1 | 11/2018 | Costa et al. |
| 2019/0013254 A1 | 1/2019 | Costa et al. |
| 2019/0013255 A1 | 1/2019 | Costa et al. |
| 2019/0043812 A1 | 2/2019 | Leobandung |
| 2019/0057922 A1 | 2/2019 | Costa et al. |
| 2019/0074263 A1 | 3/2019 | Costa et al. |
| 2019/0074271 A1 | 3/2019 | Costa et al. |
| 2019/0104653 A1 | 4/2019 | Jandzinski et al. |
| 2019/0172826 A1 | 6/2019 | Or-Bach et al. |
| 2019/0172842 A1 | 6/2019 | Whitefield |
| 2019/0189599 A1 | 6/2019 | Baloglu et al. |
| 2019/0229101 A1 | 7/2019 | Lee |
| 2019/0237421 A1 | 8/2019 | Tsuchiya |
| 2019/0287953 A1 | 9/2019 | Moon et al. |
| 2019/0288006 A1 | 9/2019 | Paul et al. |
| 2019/0304910 A1 | 10/2019 | Fillion |
| 2019/0304977 A1 | 10/2019 | Costa et al. |
| 2019/0312110 A1 | 10/2019 | Costa et al. |
| 2019/0326159 A1 | 10/2019 | Costa et al. |
| 2019/0378819 A1* | 12/2019 | Costa ............... H01L 21/30604 |
| 2019/0378821 A1 | 12/2019 | Costa et al. |
| 2020/0006193 A1 | 1/2020 | Costa et al. |
| 2020/0027814 A1 | 1/2020 | Ichiryu et al. |
| 2020/0058541 A1 | 2/2020 | Konishi et al. |
| 2020/0115220 A1 | 4/2020 | Hammond et al. |
| 2020/0118838 A1 | 4/2020 | Hammond et al. |
| 2020/0176347 A1 | 6/2020 | Costa et al. |
| 2020/0234978 A1 | 7/2020 | Costa et al. |
| 2020/0235024 A1 | 7/2020 | Costa et al. |
| 2020/0235040 A1 | 7/2020 | Costa et al. |
| 2020/0235054 A1 | 7/2020 | Costa et al. |
| 2020/0235059 A1 | 7/2020 | Cok et al. |
| 2020/0235066 A1 | 7/2020 | Costa et al. |
| 2020/0235074 A1 | 7/2020 | Costa et al. |
| 2021/0134699 A1 | 5/2021 | Costa et al. |
| 2021/0167031 A1 | 6/2021 | Costa et al. |
| 2021/0183693 A1 | 6/2021 | Costa et al. |
| 2021/0188624 A1 | 6/2021 | Costa et al. |
| 2021/0348078 A1 | 11/2021 | Haramoto et al. |
| 2022/0285205 A1 | 9/2022 | Chetry et al. |

FOREIGN PATENT DOCUMENTS

| | | |
|---|---|---|
| CN | 101785098 A | 7/2010 |
| CN | 101901953 A | 12/2010 |
| CN | 102084505 A | 6/2011 |
| CN | 102956468 A | 3/2013 |
| CN | 103000537 A | 3/2013 |
| CN | 103383927 A | 11/2013 |
| CN | 103681575 A | 3/2014 |
| CN | 103730429 A | 4/2014 |
| CN | 103811474 A | 5/2014 |
| CN | 103872012 A | 6/2014 |
| CN | 104134607 A | 11/2014 |
| CN | 106057747 A | 10/2016 |
| CN | 106098609 A | 11/2016 |
| CN | 106158786 A | 11/2016 |
| CN | 107481998 A | 12/2017 |
| CN | 108028225 A | 5/2018 |
| DE | 102014117594 A1 | 6/2016 |
| EP | 1098386 A1 | 5/2001 |
| EP | 2862204 A1 | 4/2015 |
| EP | 2996143 A1 | 3/2016 |
| JP | S505733 Y1 | 2/1975 |
| JP | S5338954 A | 4/1978 |
| JP | H11-220077 A | 8/1999 |
| JP | 200293957 A | 3/2002 |
| JP | 2002252376 A | 9/2002 |
| JP | 2002100767 A | 10/2003 |
| JP | 2004273604 A | 9/2004 |
| JP | 2004327557 A | 11/2004 |
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| JP | 2009200274 A | 9/2009 |
| JP | 2009302526 A | 12/2009 |
| JP | 2011216780 A | 10/2011 |
| JP | 2011243596 A | 12/2011 |
| JP | 2012129419 A | 7/2012 |
| JP | 2012156251 A | 8/2012 |
| JP | 2013162096 A | 8/2013 |
| JP | 2013222745 A | 10/2013 |
| JP | 2013254918 A | 12/2013 |
| JP | 2014509448 A | 4/2014 |
| TW | 201409612 A | 3/2014 |
| TW | 201448172 A | 12/2014 |
| TW | 201503315 A | 1/2015 |
| TW | 201705382 A | 2/2017 |
| TW | 201719827 A | 6/2017 |

(56) References Cited

FOREIGN PATENT DOCUMENTS

| TW | 201724310 A | 7/2017 |
|---|---|---|
| TW | 201733056 A | 9/2017 |
| TW | 201738943 A | 11/2017 |
| TW | 201826332 A | 7/2018 |
| TW | 201834084 A | 9/2018 |
| TW | 201835971 A | 10/2018 |
| TW | 201839858 A | 11/2018 |
| TW | 201839870 A | 11/2018 |
| WO | 2007074651 A1 | 7/2007 |
| WO | 2010080068 A1 | 7/2010 |
| WO | 2015074439 A1 | 5/2015 |
| WO | 2018083961 A1 | 5/2018 |
| WO | 2018125242 A1 | 7/2018 |
| WO | 2018168391 A1 | 9/2018 |
| WO | 2022125722 A1 | 6/2022 |

OTHER PUBLICATIONS

Notice of Allowance for U.S. Appl. No. 17/306,194, mailed Aug. 24, 2023, 10 pages.
Notice of Allowance for U.S. Appl. No. 16/390,496, mailed Aug. 24, 2023, 24 pages.
Notice of Allowance for U.S. Appl. No. 17/970,078, mailed Aug. 25, 2023, 10 pages.
Applicant-Initiated Interview Summary for U.S. Appl. No. 16/678,551, mailed Aug. 22, 2023, 7 pages.
Applicant-Initiated Interview Summary for U.S. Appl. No. 16/844,406, mailed Sep. 13, 2023, 2 pages.
Final Office Action for U.S. Appl. No. 16/844,406, mailed Sep. 28, 2023, 7 pages.
Final Office Action for U.S. Appl. No. 17/121,194, mailed Sep. 7, 2023, 24 pages.
Notice of Allowance for U.S. Appl. No. 17/389,977, mailed Aug. 16, 2023, 8 pages.
Corrected Notice of Allowability for U.S. Appl. No. 17/389,977, mailed Sep. 20, 2023, 5 pages.
First Office Action for Chinese Patent Application No. 201980077328.4, mailed Aug. 28, 2023, 15 pages.
Notice of Preliminary Rejection for Korean Patent Application No. 1020217026777, mailed Jul. 28, 2023, 12 pages.
Quayle Action for U.S. Appl. No. 16/678,551, mailed Oct. 4, 2023, 6 pages.
Non-Final Office Action for U.S. Appl. No. 16/678,602, mailed Oct. 6, 2023, 18 pages.
Notice of Allowance for for U.S. Appl. No. 16/844,406, mailed, Nov. 16, 2023, 11 pages.
Notice of Allowance for U.S. Appl. No. 17/121,194, mailed Oct. 23, 2023, 8 pages.
Final Office Action for U.S. Appl. No. 17/102,957, mailed Oct. 26, 2023, 27 pages.
Corrected Notice of Allowability for U.S. Appl. No. 17/389,977, mailed Oct. 25, 2023, 5 pages.
Board Opinion for Chinese Patent Application No. 201780058052.6, mailed Oct. 8, 2023, 15 pages.
First Office Action for Chinese Patent Application No. 201980050433.9, mailed Sep. 4, 2023, 20 pages.
First Office Action for Chinese Patent Application No. 201980090320.1, mailed Sep. 5, 2023, 11 pages.
Office Action for Taiwanese Patent Application No. 109102892, mailed Sep. 13, 2023, 18 pages.
Preliminary Examination Report for Taiwanese Patent Application No. 109102893, mailed Sep. 7, 2023, 10 pages.
Raskin, Jean-Pierre et al., "Substrate Crosstalk Reduction Using SOI Technology," IEEE Transactions on Electron Devices, vol. 44, No. 12, Dec. 1997, pp. 2252-2261.
Rong, B., et al., "Surface-Passivated High-Resistivity Silicon Substrates for RFICs," IEEE Electron Device Letters, vol. 25, No. 4, Apr. 2004, pp. 176-178.
Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, mailed Jul. 18, 2013, 20 pages.
Final Office Action for U.S. Appl. No. 13/852,648, mailed Nov. 26, 2013, 21 pages.
Applicant-Initiated Interview Summary for U.S. Appl. No. 13/852,648, mailed Jan. 27, 2014, 4 pages.
Advisory Action for U.S. Appl. No. 13/852,648, mailed Mar. 7, 2014, 4 pages.
Notice of Allowance for U.S. Appl. No. 13/852,648, mailed Jun. 16, 2014, 9 pages.
Notice of Allowance for U.S. Appl. No. 13/852,648, mailed Sep. 26, 2014, 8 pages.
Notice of Allowance for U.S. Appl. No. 13/852,648, mailed Jan. 22, 2015, 8 pages.
Non-Final Office Action for U.S. Appl. No. 13/852,648, mailed Jun. 24, 2015, 20 pages.
Final Office Action for U.S. Appl. No. 13/852,648, mailed Oct. 22, 2015, 20 pages.
Non-Final Office Action for U.S. Appl. No. 13/852,648, mailed Feb. 19, 2016, 12 pages.
Final Office Action for U.S. Appl. No. 13/852,648, mailed Jul. 20, 2016, 14 pages.
Non-Final Office Action for U.S. Appl. No. 14/315,765, mailed Jan. 2, 2015, 6 pages.
Final Office Action for U.S. Appl. No. 14/315,765, mailed May 11, 2015, 17 pages.
Advisory Action for U.S. Appl. No. 14/315,765, mailed Jul. 22, 2015, 3 pages.
Non-Final Office Action for U.S. Appl. No. 14/260,909, mailed Mar. 20, 2015, 20 pages.
Final Office Action for U.S. Appl. No. 14/260,909, mailed Aug. 12, 2015, 18 pages.
Non-Final Office Action for U.S. Appl. No. 14/260,909, mailed Dec. 5, 2014, 15 pages.
Notice of Allowance for U.S. Appl. No. 14/261,029, mailed Apr. 27, 2015, 10 pages.
Corrected Notice of Allowabiiity for U.S. Appl. No. 14/261,029, mailed Nov. 17, 2015, 5 pages.
Non-Final Office Action for U.S. Appl. No. 14/529,870, mailed Feb. 12, 2016, 14 pages.
Notice of Allowance for U.S. Appl. No. 14/529,870, mailed Jul. 15, 2016, 8 pages.
Non-Final Office Action for U.S. Appl. No. 15/293,947, mailed Apr. 7, 2017, 12 pages.
Notice of Allowance for U.S. Appl. No. 15/293,947, mailed Aug. 14, 2017, 7 pages.
Non-Final Office Action for U.S. Appl. No. 14/715,830, mailed Apr. 13, 2016, 16 pages.
Final Office Action for U.S. Appl. No. 14/715,830, mailed Sep. 6, 2016, 13 pages.
Advisory Action for U.S. Appl. No. 14/715,830, mailed Oct. 31, 2016, 6 pages.
Notice of Allowance for U.S. Appl. No. 14/715,830, mailed Feb. 10, 2017, 8 pages.
Notice of Allowance for U.S. Appl. No. 14/715,830, mailed Mar. 2, 2017, 8 pages.
Non-Final Office Action for U.S. Appl. No. 14/851,652, mailed Oct. 7, 2016, 10 pages.
Notice of Allowance for U.S. Appl. No. 14/851,652, mailed Apr. 11, 2017, 9 pages.

(56) References Cited

OTHER PUBLICATIONS

Corrected Notice of Allowance for U.S. Appl. No. 14/851,652, mailed Jul. 24, 2017, 6 pages.
Corrected Notice of Allowance for U.S. Appl. No. 14/851,652, mailed Sep. 6, 2017, 5 pages.
Notice of Allowance for U.S. Appl. No. 14/959,129, mailed Oct. 11, 2016, 8 pages.
Non-Final Office Action for U.S. Appl. No. 15/173,037, mailed Jan. 10, 2017, 8 pages.
Final Office Action for U.S. Appl. No. 15/173,037, mailed May 2, 2017, 13 pages.
Advisory Action for U.S. Appl. No. 15/173,037, mailed Jul. 20, 2017, 3 pages.
Notice of Allowance for U.S. Appl. No. 15/173,037, mailed Aug. 9, 2017, 7 pages.
Non-Final Office Action for U.S. Appl. No. 15/085,185, mailed Feb. 15, 2017, 10 pages.
Non-Final Office Action for U.S. Appl. No. 15/085,185, mailed Jun. 6, 2017, 5 pages.
Non-Final Office Action for U.S. Appl. No. 15/229,780, mailed Jun. 30, 2017, 12 pages.
Non-Final Office Action for U.S. Appl. No. 15/262,457, mailed Aug. 7, 2017, 10 pages.
Notice of Allowance for U.S. Appl. No. 15/408,560, mailed Sep. 25, 2017, 8 pages.
Notice of Allowance for U.S. Appl. No. 15/287,202, mailed Aug. 25, 2017, 11 pages.
Non-Final Office Action for U.S. Appl. No. 15/353,346, mailed May 23, 2017, 15 pages.
Notice of Allowance for U.S. Appl. No. 15/353,346, mailed Sep. 25, 2017, 9 pages.
Final Office Action for U.S. Appl. No. 16/844,406, mailed Jun. 24, 2022, 17 pages.
Advisory Action for U.S. Appl. No. 16/844,406, mailed Jul. 26, 2022, 3 pages.
Non-Final Office Action for U.S. Appl. No. 16/844,406, mailed Oct. 6, 2022, 17 pages.
Notice of Allowance for U.S. Appl. No. 17/109,935, mailed Apr. 20, 2022, 15 pages.
Corrected Notice of Allowability U.S. Appl. No. 17/109,935, mailed Jul. 1, 2022, 4 pages.
Corrected Notice of Allowability U.S. Appl. No. 17/109,935, mailed Jul. 27, 2022, 4 pages.
Corrected Notice of Allowability U.S. Appl. No. 17/109,935, mailed Sep. 14, 2022, 4 pages.
Notice of Allowance for U.S. Appl. No. 17/109,935, mailed Oct. 28, 2022, 7 pages.
Corrected Notice of Allowability for U.S. Appl. No. 17/109,935, mailed Nov. 10, 2022, 4 pages.
Corrected Notice of Allowability for U.S. Appl. No. 17/109,935, mailed Jan. 10, 2023, 4 pages.
Final Office Action for U.S. Appl. No. 17/102,957, mailed Aug. 18, 2022, 12 pages.
Advisory Action for U.S. Appl. No. 17/102,957, mailed Oct. 27, 2022, 7 pages.
Notice of Preliminary Rejection for Korean Patent Application No. 10-2018-7006660, mailed Sep. 3, 2022, 6 pages.
First Office Action for Chinese Patent Application No. 201780062516.0, mailed Nov. 2, 2022, 10 pages.
First Office Action for Chinese Patent Application No. 201780063121.2, mailed Nov. 23, 2022, 12 pages.
Notice of Reasons for Rejection for Japanese Patent Application No. 2022032477, mailed Oct. 3, 2022, 4 pages.
First Office Action for Chinese Patent Application No. 201780058052.6, mailed Nov. 2, 2022, 22 pages.
International Search Report and Written Opinion for International Patent Application No. PCT/US2021/063093, mailed May 4, 2022, 15 pages.
Invitation to Pay Additional Fees and Partial International Search for International Patent Application No. PCT/US2021/063094, mailed Apr. 19, 2022, 15 pages.
International Search Report and Written Opinion for International Patent Application No. PCT/US2021/063094, mailed Aug. 9, 2022, 24 pages.
International Search Report and Written Opinion for International Patent Application No. PCT/US2021/062509, mailed Mar. 29, 2022, 20 pages.
Non-Final Office Action for U.S. Appl. No. 16/426,527, mailed Feb. 9, 2023, 9 pages.
Final Office Action for U.S. Appl. No. 16/426,527, mailed May 25, 2023, 9 pages.
Notice of Allowance for U.S. Appl. No. 16/426,527, mailed Jun. 22, 2023, 8 pages.
Notice of Allowance for U.S. Appl. No. 16/427,019, mailed Mar. 10, 2023, 10 pages.
Non-Final Office Action for U.S. Appl. No. 16/678,551, mailed Mar. 28, 2023, 14 pages.
Final Office Action for U.S. Appl. No. 16/678,551, mailed May 26, 2023, 16 pages.
Notice of Allowance for U.S. Appl. No. 17/573,112, mailed Mar. 8, 2023, 8 pages.
Notice of Allowance for U.S. Appl. No. 17/554,477, mailed Mar. 7, 2023, 8 pages.
Final Office Action for U.S. Appl. No. 16/844,406, mailed Mar. 6, 2023, 13 pages.
Advisory Action for U.S. Appl. No. 16/844,406, mailed May 12, 2023, 3 pages.
Non-Final Office Action for U.S. Appl. No. 16/844,406, mailed Jun. 23, 2023, 18 pages.
Corrected Notice of Allowability for U.S. Appl. No. 17/109,935, mailed Mar. 1, 2023, 4 pages.
Corrected Notice of Allowability for U.S. Appl. No. 17/109,935, mailed Apr. 12, 2023, 4 pages.
Non-Final Office Action for U.S. Appl. No. 17/121,194, mailed May 9, 2023, 22 pages.
Non-Final Office Action for U.S. Appl. No. 17/102,957, mailed Apr. 13, 2023, 24 pages.
Non-Final Office Action for U.S. Appl. No. 17/389,977, mailed Mar. 28, 2023, 10 pages.
Written Decision on Registration for Korean Patent Application No. 10-2018-7006660, mailed Feb. 24, 2023, 8 pages.
Decision to Grant for Japanese Patent Application No. 2022032477, mailed Mar. 14, 2023, 5 pages.
Decision of Rejection for Chinese Patent Application No. 201780058052.6, mailed Mar. 30, 2023, 16 pages.
Preliminary Examination Report for Taiwanese Patent Application No. 108140788, mailed Dec. 9, 2022, 13 pages.
Office Action for Taiwanese Patent Application No. 109102892, mailed Apr. 14, 2023, 18 pages.
Preliminary Examination Report for Taiwanese Patent Application No. 109102895, mailed May 30, 2023, 18 pages.
Preliminary Examination Report for Tawainese Patent Application No. 109102896, mailed Jul. 4, 2023, 19 pages.
Advisory Action for U.S. Appl. No. 16/678,551, mailed Jul. 28, 2023, 3 pages.
Office Action for Taiwanese Patent Application No. 108119536, mailed Jul. 13, 2023, 6 pages.
First Office Action for Chinese Patent Application No. 201980079375.2, mailed May 5, 2023, 17 pages.
Notice of Allowance for U.S. Appl. No. 16/454,809, mailed Nov. 25, 2020, 8 pages.
Non-Final Office Action for U.S. Appl. No. 16/427,019, mailed Nov. 19, 2020, 19 pages.
Non-Final Office Action for U.S. Appl. No. 16/678,573, mailed Feb. 19, 2021, 11 pages.
Non-Final Office Action for U.S. Appl. No. 16/678,602, mailed Feb. 19, 2021, 10 pages.
First Office Action for Chinese Patent Application No. 201680058198.6, mailed Dec. 29, 2020, 14 pages.

(56) References Cited

OTHER PUBLICATIONS

International Preliminary Report on Patentability for International Patent Application No. PCT/US2019/025591, mailed Oct. 15, 2020, 6 pages.
International Preliminary Report on Patentability for International Patent Application No. PCT/US2019/034645, mailed Jan. 14, 2021, 9 pages.
Advisory Action for U.S. Appl. No. 16/390,496, mailed Mar. 1, 2021, 3 pages.
Notice of Allowance for U.S. Appl. No. 16/390,496, mailed Apr. 5, 2021, 7 pages.
Notice of Allowance for U.S. Appl. No. 16/426,527, mailed May 14, 2021, 9 pages.
Final Office Action for U.S. Appl. No. 16/427,019, mailed May 21, 2021, 16 pages.
Non-Final Office Action for U.S. Appl. No. 16/678,551, mailed Apr. 7, 2021, 9 pages.
Final Office Action and Examiner-Initiated Interview Summary for U.S. Appl. No. 16/678,551, mailed Jun. 28, 2021, 9 pages.
Applicant-Initiated Interview Summary for U.S. Appl. No. 16/678,573, mailed May 7, 2021, 2 pages.
Final Office Action and Examiner-Initiated Interview Summary for U.S. Appl. No. 16/678,573, mailed Jun. 28, 2021, 10 pages.
Notice of Allowance for U.S. Appl. No. 16/678,619, mailed Jul. 8, 2021, 10 pages.
Final Office Action for U.S. Appl. No. 16/678,602, mailed Jun. 1, 2021, 9 pages.
Notice of Reasons for Refusal for Japanese Patent Application No. 2020119130, mailed Jun. 29, 2021, 4 pages.
Notice of Reasons for Rejection for Japanese Patent Application No. 2019507765, mailed Jun. 28, 2021, 4 pages.
Search Report for Japanese Patent Application No. 2019507768, mailed Jul. 15, 2021, 42 pages.
Notice of Reasons for Refusal for Japanese Patent Application No. 2019507768, mailed Jul. 26, 2021, 4 pages.
Supplementary Examination Report for Singapore Patent Application No. 11201901194S, mailed Mar. 10, 2021, 3 pages.
Reasons for Rejection for Japanese Patent Application No. 2019507767, mailed Jun. 25, 2021, 5 pages.
International Preliminary Report on Patentability for International Patent Application No. PCT/US2019/063460, mailed Jun. 10, 2021, 9 pages.
International Preliminary Report on Patentability for International Patent Application No. PCT/US2019/055317, mailed Apr. 22, 2021, 11 pages.
International Preliminary Report on Patentability for International Patent Application No. PCT/US2019/055321, mailed Apr. 22, 2021, 14 pages.
Office Action for Taiwanese Patent Application No. 108140788, mailed Mar. 25, 2021, 18 pages.
Corrected Notice of Allowability for U.S. Appl. No. 16/426,527, mailed Aug. 18, 2021, 4 pages.
Advisory Action for U.S. Appl. No. 16/427,019, mailed Aug. 2, 2021, 3 pages.
Non-Final Office Action for U.S. Appl. No. 16/678,586, mailed Aug. 12, 2021, 16 pages.
Notice of Allowance and Examiner-Initiated Interview Summary for U.S. Appl. No. 16/678,602, mailed Aug. 12, 2021, 11 pages.
International Preliminary Report on Patentability for International Patent Application No. PCT/US2019/034699, mailed Aug. 5, 2021, 9 pages.
International Preliminary Report on Patentability for International Patent Application No. PCT/US2020/014662, mailed Aug. 5, 2021, 11 pages.
International Preliminary Report on Patentability for International Patent Application No. PCT/US2020/014665, mailed Aug. 5, 2021, 10 pages.
International Preliminary Report on Patentability for International Patent Application No. PCT/US2020/014666, mailed Aug. 5, 2021, 11 pages.
International Preliminary Report on Patentability for International Patent Application No. PCT/US2020/014667, mailed Aug. 5, 2021, 8 pages.
International Preliminary Report on Patentability for International Patent Application No. PCT/US2020/014669, mailed Aug. 5, 2021, 9 pages.
Advisory Action and Examiner-Initiated Interview Summary for U.S. Appl. No. 16/678,551, mailed Sep. 13, 2021, 3 pages.
Notice of Allowance and Examiner-Initiated Interview Summary for U.S. Appl. No. 16/678,551, mailed Oct. 21, 2021, 8 pages.
Advisory Action and Examiner-Initiated Interview Summary for U.S. Appl. No. 16/678,573, mailed Sep. 10, 2021, 3 pages.
Notice of Allowance and Examiner-Initiated Interview Summary for U.S. Appl. No. 16/678,573, mailed Oct. 21, 2021, 7 pages.
Corrected Notice of Allowability for U.S. Appl. No. 16/678,602, mailed Aug. 26, 2021, 4 pages.
Decision to Grant for Japanese Patent Application No. 2020119130, mailed Sep. 7, 2021, 4 pages.
Second Office Action for Chinese Patent Application No. 201680058198.6, mailed Sep. 8, 2021, 8 pages.
Borel, S. et al., "Control of Selectivity between SiGe and Si in Isotropic Etching Processes," Japanese Journal of Applied Physics, vol. 43, No. 6B, 2004, pp. 3964-3966.
Non-Final Office Action for U.S. Appl. No. 16/426,527, mailed Feb. 16, 2022, 9 pages.
Non-Final Office Action for U.S. Appl. No. 16/427,019, mailed Dec. 2, 2021, 17 pages.
Corrected Notice of Allowability for U.S. Appl. No. 16/678,551, mailed Nov. 24, 2021, 3 pages.
Corrected Notice of Allowability for U.S. Appl. No. 16/678,551, mailed Jan. 27, 2022, 3 pages.
Corrected Notice of Allowability for U.S. Appl. No. 16/678,573, mailed Nov. 24, 2021, 3 pages.
Notice of Allowance for Japanese Patent Application No. 2019507767, mailed Jan. 19, 2022, 6 pages.
Decision to Grant for Japanese Patent Application No. 2019507768, mailed Feb. 10, 2022, 6 pages.
International Search Report and Written Opinion for International Patent Application No. PCT/US2021/043968, mailed Nov. 19, 2021, 15 pages.
Office Letter for Taiwanese Patent Application No. 108140788, mailed Jan. 5, 2022, 16 pages.
Preliminary Examination Report for Taiwanese Patent Application No. 109102894, mailed Apr. 7, 2023, 20 pages.
Notice of Allowance for U.S. Appl. No. 16/426,527, mailed Jan. 22, 2024, 10 pages.
Non-Final Office Action for U.S. Appl. No. 18/306,599, mailed Jan. 22, 2024, 11 pages.
Notice of Allowance for U.S. Appl. No. 17/389,977, mailed Jan. 18, 2024, 17 pages.
Board Opinion for Chinese Patent Application No. 201780058052.6, mailed Jan. 15, 2024, 28 pages.
Reasons for Rejection for Taiwanese Patent Application No. 109102896, mailed Dec. 13, 2023, 17 pages.
Notice of Allowance for U.S. Appl. No. 16/204,214, mailed Oct. 28, 2022, 11 pages.
Final Office Action for U.S. Appl. No. 16/204,214, mailed Mar. 6, 2020, 14 pages.
Notice of Allowance for U.S. Appl. No. 16/390,496, mailed Oct. 27, 2022, 21 pages.
Notice of Allowance for U.S. Appl. No. 16/426,527, mailed Aug. 17, 2022, 7 pages.
Quayle Action for U.S. Appl. No. 16/426,527, mailed May 26, 2022, 5 pages.
Advisory Action for U.S. Appl. No. 16/427,019, mailed Jun. 2, 2022, 3 pages.
Non-Final Office Action for U.S. Appl. No. 16/427,019, mailed Aug. 15, 2022, 17 pages.
Final Office Action for U.S. Appl. No. 16/427,019, mailed Apr. 12, 2022, 15 pages.
Final Office Action for U.S. Appl. No. 16/427,019, mailed Dec. 12, 2022, 19 pages.

(56) References Cited

OTHER PUBLICATIONS

Corrected Notice of Allowability for U.S. Appl. No. 16/678,551, mailed Nov. 2, 2022, 3 pages.
Corrected Notice of Allowability for U.S. Appl. No. 16/678,551, mailed Mar. 9, 2022, 3 pages.
Corrected Notice of Allowability for U.S. Appl. No. 16/678,551, mailed Apr. 11, 2022, 3 pages.
Corrected Notice of Allowability for U.S. Appl. No. 16/678,551, mailed May 13, 2022, 3 pages.
Corrected Notice of Allowability for U.S. Appl. No. 16/678,551, mailed Jun. 15, 2022, 3 pages.
Corrected Notice of Allowability for U.S. Appl. No. 16/678,551, mailed Jul. 14, 2022, 3 pages.
Corrected Notice of Allowability for U.S. Appl. No. 16/678,551, mailed Sep. 2, 2022, 3 pages.
Corrected Notice of Allowability for U.S. Appl. No. 16/678,551, mailed Oct. 4, 2022, 3 pages.
Corrected Notice of Allowability for U.S. Appl. No. 16/678,602, mailed Apr. 8, 2022, 4 pages.
Corrected Notice of Allowability for U.S. Appl. No. 16/678,551, mailed Dec. 7, 2022, 3 pages.
Corrected Notice of Allowability for U.S. Appl. No. 16/678,573, mailed Jan. 27, 2022, 3 pages.
Corrected Notice of Allowability for U.S. Appl. No. 16/678,573, mailed Mar. 31, 2022, 3 pages.
Corrected Notice of Allowability for U.S. Appl. No. 16/678,573, mailed May 6, 2022, 3 pages.
Corrected Notice of Allowability for U.S. Appl. No. 16/678,573, mailed Jun. 10, 2022, 3 pages.
Advisory Action for U.S. Appl. No. 16/678,586, mailed Jan. 26, 2022, 3 pages.
Notice of Allowance and Examiner-Initiated Interview Summary for U.S. Appl. No. 16/678,586, mailed Sep. 13, 2022, 11 pages.
Non-Final Office Action for U.S. Appl. No. 16/678,586, mailed Mar. 3, 2022, 14 pages.
Final Office Action for U.S. Appl. No. 16/678,586, mailed Sep. 1, 2022, 7 pages.
Final Office Action for U.S. Appl. No. 16/678,586, mailed Nov. 22, 2021, 15 pages.
Corrected Notice of Allowability for U.S. Appl. No. 16/678,602, mailed Feb. 2, 2022, 4 pages.
Corrected Notice of Allowability for U.S. Appl. No. 16/678,602, mailed Mar. 9, 2022, 4 pages.
Corrected Notice of Allowability for U.S. Appl. No. 16/678,602, mailed May 13, 2022, 4 pages.
Corrected Notice of Allowability for U.S. Appl. No. 16/678,602, mailed Jun. 10, 2022, 4 pages.
Corrected Notice of Allowability for U.S. Appl. No. 16/678,602, mailed Jul. 14, 2022, 4 pages.
Corrected Notice of Allowability for U.S. Appl. No. 16/678,602, mailed Sep. 2, 2022, 4 pages.
Corrected Notice of Allowability for U.S. Appl. No. 16/678,602, mailed Oct. 5, 2022, 4 pages.
Corrected Notice of Allowability for U.S. Appl. No. 16/678,602, mailed Nov. 14, 2022, 4 pages.
Corrected Notice of Allowability for U.S. Appl. No. 16/678,602, mailed Nov. 24, 2021, 4 pages.
Corrected Notice of Allowability for U.S. Appl. No. 16/678,602, mailed Dec. 9, 2022, 4 pages.
Corrected Notice of Allowability for U.S. Appl. No. 16/678,602, mailed Dec. 30, 2021, 4 pages.
Non-Final Office Action for U.S. Appl. No. 16/844,406, mailed Mar. 14, 2022, 16 pages.
Non-Final Office Action for U.S. Appl. No. 17/102,957, mailed Feb. 17, 2022, 9 pages.
Notice of Allowance for U.S. Appl. No. 17/330,787, mailed Dec. 15, 2022, 7 pages.
Non-Final Office Action for U.S. Appl. No. 17/330,787, mailed Oct. 17, 2022, 10 pages.
Non-Final Office Action for U.S. Appl. No. 17/554,477, mailed Nov. 25, 2022, 6 pages.
Non-Final Office Action for U.S. Appl. No. 17/573,112, mailed Dec. 9, 2022, 6 pages.
Decision of Rejection for Chinese Patent Application No. 201680058198.6, mailed Nov. 12, 2021, 6 pages.
Summons to Attend for European Patent Application No. 16751791.1, mailed Feb. 28, 2022, 10 pages.
Examination Report for European Patent Application No. 17755402.9, mailed Dec. 20, 2021, 12 pages.
Examination Report for European Patent Application No. 17755403.7, mailed Dec. 20, 2021, 13 pages.
Notice of Allowance for U.S. Appl. No. 16/426,527, mailed Aug. 7, 2024, 9 pages.
Examination Report for Taiwanese Patent Application No. 109102896, mailed Jun. 27, 2024, 18 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "Sapphire Substrate," from CRC Handbook of Chemistry and Physics, Date Unknown, 1 page.

(56) References Cited

OTHER PUBLICATIONS

Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: Akhan's Approach and Solution: The Miraj Diamond™ Platform," 2015, accessed Oct. 9, 2016, http://www.akhansemi.com/technology.html#the-miraj-diamond-platform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.
Costa, J. et al., "Silicon RFCMOS SOI Technology with Above—IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of the Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SIRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, Ye.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C et al., "Advanced SOI Substrate Manufacturing," 2004 IEEE International Conference on Integrated Circuit Design and Technology, 2004, IEEE, pp. 105-111.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Non-Final Office Action for U.S. Appl. No. 15/676,693, mailed May 3, 2018, 14 pages.
Notice of Allowance for U.S. Appl. No. 15/789,107, mailed May 18, 2018, 8 pages.
Final Office Action for U.S. Appl. No. 15/616,109, mailed Apr. 19, 2018, 18 pages.
Notice of Allowance for U.S. Appl. No. 15/676,693, mailed Jul. 20, 2018, 8 pages.
Notice of Allowance for U.S. Appl. No. 15/695,629, mailed Jul. 11, 2018, 12 pages.
Notice of Allowance for U.S. Appl. No. 15/387,855, mailed Aug. 10, 2018, 7 pages.
Notice of Allowance for U.S. Appl. No. 15/914,538, mailed Aug. 1, 2018, 9 pages.
Notice of Allowance and Applicant-Initiated Interview Summary for U.S. Appl. No. 15/262,457, mailed Sep. 28, 2018, 16 pages.
Corrected Notice of Allowance for U.S. Appl. No. 15/676,693, mailed Aug. 29, 2018, 5 pages.
Final Office Action for U.S. Appl. No. 15/601,858, mailed Nov. 26, 2018, 16 pages.
Non-Final Office Action for U.S. Appl. No. 15/945,418, mailed Nov. 1, 2018, 13 pages.
First Office Action for Chinese Patent Application No. 201510746323.X, mailed Nov. 2, 2018, 12 pages.
Advisory Action for U.S. Appl. No. 15/601,858, mailed Jan. 22, 2019, 3 pages.
Notice of Allowance for U.S. Appl. No. 16/038,879, mailed Jan. 9, 2019, 8 pages.
Notice of Allowance for U.S. Appl. No. 16/004,961, mailed Jan. 11, 2019, 8 pages.
International Preliminary Report on Patentability for PCT/US2017/046744, mailed Feb. 21, 2019, 11 pages.
International Preliminary Report on Patentability for PCT/US2017/046758, mailed Feb. 21, 2019, 11 pages.
International Preliminary Report on Patentability for PCT/US2017/046779, mailed Feb. 21, 2019, 11 pages.
Non-Final Office Action for U.S. Appl. No. 15/992,613, mailed Feb. 27, 2019, 15 pages.
Non-Final Office Action for U.S. Appl. No. 15/695,579, mailed Jan. 28, 2019, 8 pages.

(56) References Cited

OTHER PUBLICATIONS

Notice of Allowance for U.S. Appl. No. 15/992,639, mailed May 9, 2019, 7 pages.
Notice of Allowance for U.S. Appl. No. 15/695,579, mailed Mar. 20, 2019, 8 pages.
Notice of Allowance for U.S. Appl. No. 16/004,961, mailed May 13, 2019, 8 pages.
Non-Final Office Action for U.S. Appl. No. 15/601,858, mailed Apr. 17, 2019, 9 pages.
Tsai, Chun-Lin, et al., "Smart GaN platform; Performance & Challenges," IEEE International Electron Devices Meeting, 2017, 4 pages.
Tsai, Szu-Ping., et al., "Performance Enhancement of Flip-Chip Packaged AlGAaN/GaN HEMTs by Strain Engineering Design," IEEE Transcations on Electron Devices, vol. 63, Issue 10, Oct. 2016, pp. 3876-3881.
Final Office Action for U.S. Appl. No. 15/992,613, mailed May 24, 2019, 11 pages.
Non-Final Office Action for U.S. Appl. No. 15/873,152, mailed May 24, 2019, 11 pages.
Notice of Allowance for U.S. Appl. No. 16/168,327, mailed Jun. 28, 2019, 7 pages.
Lin, Yueh, Chin, et al., "Enhancement-Mode GaN MIS-HEMTs With LaHfOx Gate Insulator for Power Application," IEEE Electronic Device Letters, vol. 38, Issue 8, 2017, 4 pages.
Shukla, Shishir, et al., "GaN-on-Si Switched Mode RF Power Amplifiers for Non-Constant Envelope Signals," IEEE Topical Conference on RF/Microwave Power Amplifiers for Radio and Wireless Applications, 2017, pp. 88-91.
International Search Report and Written Opinion for International Patent Application No. PCT/US19/25591, mailed Jun. 21, 2019, 7 pages.
Notice of Reasons for Refusal for Japanese Patent Application No. 2015-180657, mailed Jul. 9, 2019, 4 pages.
Notice of Allowance for U.S. Appl. No. 15/601,858, mailed Aug. 16, 2019, 8 pages.
Advisory Action for U.S. Appl. No. 15/992,613, mailed Jul. 29, 2019, 3 pages.
Final Office Action for U.S. Appl. No. 15/873,152, mailed Aug. 8, 2019, 13 pages.
Notice of Allowance for U.S. Appl. No. 15/975,230, mailed Jul. 22, 2019, 7 pages.
Notice of Allowance for U.S. Appl. No. 16/004,961, mailed Aug. 28, 2019, 8 pages.
Fiorenza, et al., "Detailed Simulation Study of a Reverse Embedded-SiGE Strained-Silicon MOSFET," IEEE Transactions on Electron Devices, vol. 55, Issue 2, Feb. 2008, pp. 640-648.
Fiorenza, et al., "Systematic study of thick strained silicon NMOSFETs for digital applications," International SiGE Technology and Device Meeting, May 2006, IEEE, 2 pages.
Huang, et al., "Carrier Mobility Enhancement in Strained Si-On-Insulator Fabricated by Wafer Bonding," Symposium on VLSI Technology, Digest of Technical Papers, 2001, pp. 57-58.
Nan, et al., "Effect of Germanium content on mobility enhancement for strained silicon FET," Student Conference on Research and Development, Dec. 2017, IEEE, pp. 154-157.
Sugii, Nobuyuki, et al., "Performance Enhancement of Strained-Si MOSFETs Fabricated on a Chemical-Mechanical-Polished SiGE Substrate," IEEE Transactions on Electron Devices, vol. 49, Issue 12, Dec. 2002, pp. 2237-2243.
Yin, Haizhou, et al., "Fully-depleted Strained-Si on Insulator NMOSFETs without Relaxed SiGe Buffers," International Electron Devices Meeting, Dec. 2003, San Francisco, California, IEEE, 4 pages.
Corrected Notice of Allowability for U.S. Appl. No. 15/695,579, mailed Feb. 5, 2020, 5 pages.
Notice of Allowance for U.S. Appl. No. 15/992,613, mailed Sep. 23, 2019, 7 pages.
Non-Final Office Action for U.S. Appl. No. 16/204,214, mailed Oct. 9, 2019, 15 pages.
Non-Final Office Action for U.S. Appl. No. 15/816,637, mailed Oct. 31, 2019, 10 pages.
Advisory Action for U.S. Appl. No. 15/873,152, mailed Oct. 11, 2019, 3 pages.
Notice of Allowance for U.S. Appl. No. 15/873,152, mailed Dec. 10, 2019, 9 pages.
Supplemental Notice of Allowability for U.S. Appl. No. 17/306,194, mailed Apr. 2, 2024, 7 pages.
Notice of Allowance for U.S. Appl. No. 18/306,599, mailed Apr. 10, 2024, 8 pages.
Notice of Allowance and Applicant-Initiated Interview Summary for U.S. Appl. No. 16/678,602, mailed Mar. 7, 2024, 14 pages.
Notice of Allowance for Taiwanese Patent Application No. 108119536, mailed Apr. 30, 2024, 4 pages.
Second Office Action for Chinese Patent Application No. 201980077328. 4, mailed Mar. 29, 2024, 14 pages.
Office Action for Taiwanese Patent Application No. 113110397, mailed May 7, 2024, 10 pages.
Notice of Preliminary Rejection for Korean Patent Application No. 1020217026747, mailed May 1, 2024, 5 pages.
Notice of Allowance for U.S. Appl. No. 16/678,551, mailed Dec. 7, 2023, 9 pages.
Corrected Notice of Allowability for U.S. Appl. No. 17/389,977, mailed Nov. 24, 2023, 5 pages.
Office Action for Taiwanese Patent Application No. 108119536, mailed Nov. 24, 2023, 22 pages.
Preliminary Examination Report for Taiwanese Patent Application No. 108143149, mailed Oct. 18, 2023, 30 pages.
Second Office Action for Chinese Patent Application No. 201980079375. 2, mailed Nov. 21, 2023, 17 pages.
Office Action for Taiwanese Patent Application No. 109102895, mailed Nov. 30, 2023, 16 pages.
Notice of Allowance for U.S. Appl. No. 18/151,235, mailed May 29, 2024, 22 pages.
Notice of Allowance for U.S. Appl. No. 17/102,957, mailed Jun. 25, 2024, 11 pages.
Notice of Preliminary Rejection for Korean Patent Application No. 1020217026777, mailed Apr. 23, 2024, 15 pages.
Notice of Preliminary Rejection for Korean Patent Application No. 1020217026784, mailed May 28, 2024, 13 pages.
Notice of Preliminary Rejection for Korean Patent Application No. 1020217026776, mailed May 20, 2024, 4 pages.
Notice of Preliminary Rejection for Korean Patent Application No. 1020217026748, mailed May 22, 2024, 15 pages.
Notice of Preliminary Rejection for Korean Patent Application No. 1020217026781, mailed May 29, 2024, 13 pages.
Corrected Notice of Allowability for U.S. Appl. No. 17/102,957, mailed Jul. 10, 2024, 7 pages.
Notice of Allowance for U.S. Appl. No. 15/287,273, mailed Jun. 30, 2017, 8 pages.
Corrected Notice of Allowability for U.S. Appl. No. 15/287,273, mailed Jul. 21, 2017, 5 pages.
Supplemental Notice of Allowability for U.S. Appl. No. 15/287,273, mailed Sep. 7, 2017, 5 pages.
Extended European Search Report for European Patent Application No. 15184861.1, mailed Jan. 25, 2016, 6 pages.
Office Action of the Intellectual Property Office for Taiwanese Patent Application No. 104130224, mailed Jun. 15, 2016, 9 pages.
Non-Final Office Action for U.S. Appl. No. 14/885,202, mailed Apr. 14, 2016, 5 pages.
Final Office Action for U.S. Appl. No. 14/885,202, mailed Sep. 27, 2016, 7 pages.
Advisory Action for U.S. Appl. No. 14/885,202, mailed Nov. 29, 2016, 3 pages.
Notice of Allowance for U.S. Appl. No. 14/885,202, mailed Jan. 27, 2017, 7 pages.
Notice of Allowance for U.S. Appl. No. 14/885,202, mailed Jul. 24, 2017, 8 pages.
Notice of Allowance for U.S. Appl. No. 14/885,243, mailed Aug. 31, 2016, 8 pages.
Non-Final Office Action for U.S. Appl. No. 12/906,689, mailed May 27, 2011, 13 pages.

(56) References Cited

OTHER PUBLICATIONS

Non-Final Office Action for U.S. Appl. No. 12/906,689, mailed Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
International Search Report and Written Opinion for PCT/US2016/045809, mailed Oct. 7, 2016, 11 pages.
Non-Final Office Action for U.S. Appl. No. 15/652,867, mailed Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, mailed Nov. 27, 2017, 17 pages.
International Search Report and Written Opinion for PCT/US2017/046758, mailed Nov. 16, 2017, 19 pages.
International Search Report and Written Opinion for PCT/US2017/046779, mailed Nov. 29, 2017, 17 pages.
Non-Final Office Action for U.S. Appl. No. 15/616,109, mailed Oct. 23, 2017, 16 pages.
Corrected Notice of Allowability for U.S. Appl. No. 14/851,652, mailed Oct. 20, 2017, 5 pages.
Final Office Action for U.S. Appl. No. 15/262,457, mailed Dec. 19, 2017, 12 pages.
Supplemental Notice of Allowability and Applicant-Initiated Interview Summary for U.S. Appl. No. 15/287,273, mailed Oct. 18, 2017, 6 pages.
Supplemental Notice of Allowability for U.S. Appl. No. 15/287,273, mailed Nov. 2, 2017, 5 pages.
Non-Final Office Action for U.S. Appl. No. 15/491,064, mailed Jan. 2, 2018, 9 pages.
Notice of Allowance for U.S. Appl. No. 14/872,910, mailed Nov. 17, 2017, 11 pages.
Notice of Allowance for U.S. Appl. No. 15/648,082, mailed Nov. 29, 2017, 8 pages.
Non-Final Office Action for U.S. Appl. No. 15/652,826, mailed Nov. 3, 2017, 5 pages.
Notice of Allowance for U.S. Appl. No. 15/229,780, mailed Oct. 3, 2017, 7 pages.
Supplemental Notice of Allowability for U.S. Appl. No. 15/287,273, mailed Jan. 17, 2018, 5 pages.
Notice of Allowance for U.S. Appl. No. 15/498,040, mailed Feb. 20, 2018, 8 pages.
Non-Final Office Action for U.S. Appl. No. 15/387,855, mailed Jan. 16, 2018, 7 pages.
Non-Final Office Action for U.S. Appl. No. 15/795,915, mailed Feb. 23, 2018, 6 pages.
International Preliminary Report on Patentability for PCT/US2016/045809, mailed Feb. 22, 2018, 8 pages.
Advisory Action and Applicant-Initiated Interview Summary for U.S. Appl. No. 15/262,457, mailed Feb. 28, 2018, 5 pages.
Supplemental Notice of Allowability for U.S. Appl. No. 15/287,273, mailed Feb. 23, 2018, 5 pages.
Non-Final Office Action for U.S. Appl. No. 15/676,415, mailed Mar. 27, 2018, 14 page.
Non-Final Office Action for U.S. Appl. No. 15/676,621, mailed Mar. 26, 2018, 16 pages.
Notice of Allowance for U.S. Appl. No. 15/795,915, mailed Jun. 15, 2018, 7 pages.
Final Office Action for U.S. Appl. No. 15/387,855, mailed May 24, 2018, 9 pages.
Non-Final Office Action for U.S. Appl. No. 15/262,457, mailed Apr. 19, 2018, 10 pages.
Notice of Allowance for U.S. Appl. No. 15/491,064, mailed Apr. 30, 2018, 9 pages.
Non-Final Office Action for U.S. Appl. No. 15/601,858, mailed Jun. 26, 2018, 12 pages.
Notice of Allowance for U.S. Appl. No. 15/616, 109, mailed Jul. 2, 2018, 7 pages.
Notice of Allowance for U.S. Appl. No. 15/676,621, mailed Jun. 5, 2018, 8 pages.
Non-Final Office Action for U.S. Appl. No. 18/071,053, mailed Oct. 24, 2024, 8 pages.
Written Decision on Registration for Korean Patent Application No. 10-2021-7026777, mailed Dec. 2, 2024, 7 pages.
Office Action for Taiwanese Patent Application No. 112147727, mailed Oct. 21, 2024, 10 pages.
Office Action for Taiwanese Patent Application No. 113125663, mailed Oct. 29, 2024, 11 pages.
Preliminary Examination Report for Taiwanese Patent Application No. 108143149, mailed May 15, 2024, 20 pages.
Non-Final Office Action for U.S. Appl. No. 16/527,702, mailed Jan. 10, 2020, 10 pages.
Office Action for Japanese Patent Application No. 2018-526613, mailed Nov. 5, 2019, 8 pages.
Intention to Grant for European Patent Application No. 17757646.9, mailed Feb. 27, 2020, 55 pages.
International Search Report and Written Opinion for International Patent Application No. PCT/US2019/034645, mailed Sep. 19, 2019, 14 pages.
International Search Report and Written Opinion for International Patent Application No. PCT/US2019/063460, mailed Feb. 25, 2020, 14 pages.
International Search Report and Written Opinion for International Patent Application No. PCT/US2019/055317, mailed Feb. 6, 2020, 17 pages.
International Search Report and Written Opinion for International Patent Application No. PCT/US2019/055321, mailed Jan. 27, 2020, 23 pages.
International Search Report and Written Opinion for International Patent Application No. PCT/US2019/034699, mailed Oct. 29, 2019, 13 pages.
Corrected Notice of Allowability for U.S. Appl. No. 15/695,579, mailed Apr. 1, 2020, 4 pages.
Notice of Allowance for U.S. Appl. No. 15/816,637, mailed Apr. 2, 2020, 8 pages.
Notice of Allowance for U.S. Appl. No. 16/527,702, mailed Apr. 9, 2020, 8 pages.
Decision of Rejection for Japanese Patent Application No. 2015-180657, mailed Mar. 17, 2020, 4 pages.
Dhar, S. et al., "Electron Mobility Model for Strained-Si Devices," IEEE Transactions on Electron Devices, vol. 52, No. 4, Apr. 2005, IEEE, pp. 527-533.
Notice of Allowance for U.S. Appl. No. 16/038,879, mailed Apr. 15, 2020, 9 pages.
Notice of Allowance for U.S. Appl. No. 16/004,961, mailed Apr. 30, 2020, 8 pages.
Advisory Action for U.S. Appl. No. 16/204,214, mailed Apr. 15, 2020, 3 pages.
Examination Report for European Patent Application No. 16751791.1, mailed Apr. 30, 2020, 15 pages.
Notification of Reasons for Refusal for Japanese Patent Application No. 2018-526613, mailed May 11, 2020, 5 pages.
Notice of Allowance for U.S. Appl. No. 15/873,152, mailed May 11, 2020, 8 pages.
Non-Final Office Action for U.S. Appl. No. 16/454,687, mailed May 15, 2020, 14 pages.
Welser, J. et al., "Electron Mobility Enhancement in Strained-Si N-Type Metal-Oxide-Semiconductor Field-Effect Transistors," IEEE Electron Device Letters, vol. 15, No. 3, Mar. 1994, IEEE, pp. 100-102.

(56) References Cited

OTHER PUBLICATIONS

Zeng, X. et al., "A Combination of Boron Nitride Nanotubes and Cellulose Nanofibers for the Preparation of a Nanocomposite with High Thermal Conductivity," ACS Nano, vol. 11, No. 5, 2017, American Chemical Society, pp. 5167-5178.
Quayle Action for U.S. Appl. No. 16/703,251, mailed Jun. 26, 2020, 5 pages.
Corrected Notice of Allowability for U.S. Appl. No. 15/695,579, mailed May 20, 2020, 4 pages.
Notice of Allowability for U.S. Appl. No. 15/695,579, mailed Jun. 25, 2020, 4 pages.
Notice of Allowance for U.S. Appl. No. 16/368,210, mailed Jun. 17, 2020, 10 pages.
Non-Final Office Action for U.S. Appl. No. 16/374,125, mailed Jun. 26, 2020, 12 pages.
Non-Final Office Action for U.S. Appl. No. 16/390,496, mailed Jul. 10, 2020, 17 pages.
Non-Final Office Action for U.S. Appl. No. 16/204,214, mailed May 19, 2020, 15 pages.
Non-Final Office Action for U.S. Appl. No. 16/454,809, mailed May 15, 2020, 12 pages.
Examination Report for Singapore Patent Application No. 11201901193U, mailed May 26, 2020, 6 pages.
International Search Report and Written Opinion for International Patent Application No. PCT/US2020/014662, mailed May 7, 2020, 18 pages.
International Search Report and Written Opinion for International Patent Application No. PCT/US2020/014665, mailed May 13, 2020, 17 pages.
International Search Report and Written Opinion for International Patent Application No. PCT/US2020/014666, mailed Jun. 4, 2020, 18 pages.
International Search Report and Written Opinion for International Patent Application No. PCT/US2020/014667, mailed May 18, 2020, 14 pages.
International Search Report and Written Opinion for International Patent Application No. PCT/US2020/014669, mailed Jun. 4, 2020, 15 pages.
Notice of Allowance for U.S. Appl. No. 16/454,687, mailed Aug. 14, 2020, 7 pages.
Decision to Grant for Japanese Patent Application No. 2018-526613, mailed Aug. 17, 2020, 5 pages.
Final Office Action for U.S. Appl. No. 16/454,809, mailed Aug. 21, 2020, 12 pages.
Von Trapp, F., "Hybrid Bonding: From Concept to Commercialization," Apr. 2, 2018, 3D InCities, https://www.3dincites.com/2018/04/hybrid-bonding-from-concept-to-commercialization/, 10 pages.
Notice of Allowance for U.S. Appl. No. 16/703,251, mailed Aug. 27, 2020, 8 pages.
Notice of Allowance for U.S. Appl. No. 16/527,702, mailed Nov. 13, 2020, 8 pages.
Notice of Allowance for U.S. Appl. No. 16/374,125, mailed Dec. 16, 2020, 9 pages.
Final Office Action for U.S. Appl. No. 16/390,496, mailed Dec. 24, 2020, 21 pages.
Non-Final Office Action for U.S. Appl. No. 16/426,527, mailed Nov. 20, 2020, 7 pages.
Final Office Action for U.S. Appl. No. 16/204,214, mailed Nov. 30, 2020, 15 pages.
Notice of Allowance for U.S. Appl. No. 16/204,214, mailed Feb. 17, 2021, 11 pages.
Advisory Action for U.S. Appl. No. 16/454,809, mailed Oct. 23, 2020, 3 pages.

\* cited by examiner

MULTI-LEVEL 3D STACKED PACKAGE AND METHODS OF FORMING THE SAME

RELATED APPLICATIONS

This application is a 35 USC 371 national phase filing of International Application No. PCT/US2021/063094, filed Dec. 13, 2021, which claims the benefit of provisional patent application Ser. No. 63/124,456, filed Dec. 11, 2020, the disclosures of which are incorporated herein by reference in their entireties.

FIELD OF THE DISCLOSURE

The present disclosure relates to a multi-level three-dimensional (3D) package and a process for making the same, and more particular to a multi-level 3D package with stacked thinned dies on wafer-level-fan-out (WLFO) assemblies, and a wafer-level packaging process to provide the multi-level 3D package with multiple thinned dies that are vertically stacked.

BACKGROUND

With the popularity of portable consumer electronic products, such as smart phones, tablet computers, and so forth, stacked-die assemblies are becoming more and more attractive in microelectronics packages to achieve electronics densification in a small footprint. However, the thickness of each stacked semiconductor die may result in a large thickness of the microelectronics package, which may not meet low-profile requirements for modern portable products. Such low-profile requirements significantly limit the number of semiconductor dies that can be stacked.

In most semiconductor dies, all signal processing is performed in a very thin portion of the die. The rest of the majority of the semiconductor die (height up to 150 um or more) is the semiconductor substrate, which is useless for the signal processing. The thick semiconductor substrate has use only during the die handling and assembly to provide mechanical stability.

On the other hand, for the portable radio frequency (RF) applications, wafer-level fan-out (WLFO) packaging technology is widely applied to provide high density input/output ports (I/O) without increasing the size of a package. This capability of the WLFO packaging technology allows for densely packaging the semiconductor dies within a single wafer.

Accordingly, to accommodate the low-profile requirements for portable products, and to utilize advantages of WLFO packaging technology, it is therefore an object of the present disclosure to provide an improved package design with a reduced package size without sacrificing signal processing performance.

SUMMARY

The present disclosure relates to a multi-level three-dimensional (3D) package with stacked thinned dies on wafer-fan-out (WFO) assemblies and a process for making the same. The disclosed multi-level 3D package includes a lower package level and an upper package level over the lower package level. The lower package level includes a lower redistribution structure and a lower die section over the lower redistribution structure. Herein, the lower die section includes a lower thinned die, a lower mold compound, a lower intermediary mold compound, and lower vertical via structures. The lower thinned die and the lower mold compound are deposed over the lower redistribution structure, the lower mold compound surrounds the lower thinned die and extends vertically beyond a top surface of the lower thinned die to define a lower opening over the lower thinned die and within the lower mold compound, the lower intermediary mold compound resides over the lower thinned die and fills the lower opening within the lower mold compound, and each lower vertical via structure extends through the lower mold compound. The lower thinned die includes substantially no silicon substrate and has a thickness between several micrometers and several tens of micrometers. A top surface of the lower intermediary mold compound and a top surface of the lower mold compound are coplanar. In addition, the upper package level includes an upper redistribution structure over the lower package level and an upper die section over the upper redistribution structure. Herein, the upper die section includes an upper thinned die, an upper mold compound, and an upper intermediary mold compound. The upper thinned die and the upper mold compound are deposed over the upper redistribution structure, the upper mold compound surrounds the upper thinned die and extends vertically beyond a top surface of the upper thinned die to define an upper opening over the upper thinned die and within the upper mold compound, and the upper intermediary mold compound resides over the upper thinned die and fills the upper opening within the upper mold compound. The upper thinned die includes substantially no silicon substrate and has a thickness between several micrometers and several tens of micrometers. A top surface of the upper intermediary mold compound and a top surface of the upper mold compound are coplanar.

In one embodiment of the multi-level 3D package, the lower redistribution structure includes a lower dielectric pattern and lower redistribution interconnections within the lower dielectric pattern, and the upper redistribution structure includes an upper dielectric pattern and upper redistribution interconnections within the upper dielectric pattern. Herein, the lower thinned die is connected to the upper thinned die through the lower redistribution interconnections in the lower redistribution structure, the lower vertical via structures in the lower die section, and the upper redistribution interconnections in the upper redistribution structure.

According to one embodiment, the multi-level 3D package further includes a number of bump structures formed underneath the lower redistribution structure. Herein, each bump structure is connected to the lower redistribution interconnections through the lower dielectric pattern. The bump structures are separate from each other and protrude from the lower dielectric pattern. The bump structures are copper pillars or solder balls.

According to one embodiment, the multi-level 3D package further includes one or more un-thinned components residing underneath the lower redistribution structure of the lower die section. Herein, each un-thinned component has a thickness between 100 micrometers and several hundreds of micrometers. The one or more un-thinned components are configured to be connected to the lower thinned die through the lower redistribution interconnections. Each bump structure has a same height and is taller than one or more un-thinned components.

According to one embodiment, the multi-level 3D package further includes one or more inner package levels vertically stacked between the lower package level and the upper package level. Herein, each inner package levels includes an inner redistribution structure and an inner die section over the inner redistribution structure. Each inner die section includes an inner thinned die, an inner mold compound, an inner intermediary mold compound, and inner vertical via structures. Herein, the inner thinned die and the inner mold compound are deposed over the inner redistribution structure, the inner mold compound surrounds the inner thinned die and extends vertically beyond a top surface of the inner thinned die to define an inner opening over the inner thinned die and within the inner mold compound, the inner intermediary mold compound resides over the inner thinned die and fills the inner opening within the inner mold compound, and each inner vertical via structure extends through the inner mold compound. The inner thinned die includes substantially no silicon substrate and has a thickness between several micrometers and several tens of micrometers. A top surface of the inner intermediary mold compound and a top surface of the inner mold compound are coplanar.

In one embodiment of the multi-level 3D package, each inner redistribution structure includes an inner dielectric pattern and inner redistribution interconnections within the inner dielectric pattern. The lower thinned die, the inner thinned die in each of the one or more package levels, and the upper thinned die are connected through the lower redistribution interconnections in the lower redistribution structure, the lower vertical via structures in the lower die section, the inner redistribution interconnections in each inner redistribution structure, the inner vertical via structures in each inner die section, and the upper redistribution interconnections in the upper redistribution structure.

In one embodiment of the multi-level 3D package, at least one inner die section includes a number of thinned dies including the inner thinned die. The at least one inner die section includes a number of intermediary mold compounds including the inner intermediary mold compound. Each thinned die is deposed over the inner redistribution structure and surrounded by the inner mold compound, where the inner mold compound extends vertically beyond a top surface of each thinned die to define an opening over each thinned die and within the inner mold compound. Each intermediary mold compound resides over a corresponding thinned die and fills a corresponding opening within the inner mold compound. Each thinned die includes substantially no silicon substrate and has a thickness between several micrometers and several tens of micrometers. A top surface of each intermediary mold compound and a top surface of the inner mold compound are coplanar.

According to one embodiment, the multi-level 3D package further includes a top protection structure over the upper die section of the upper package level. Herein, the top protection structure is in contact with the upper mold compound and the upper intermediary mold compound in the upper die section. The top protection structure is configured to provide chemical and gas/air contamination protection.

According to one embodiment, the multi-level 3D package further includes a metal shield over the top protection structure. The metal shield is configured to provide electromagnetic shielding of the multi-level 3D package.

In one embodiment of the multi-level 3D package, the upper intermediary mold compound is formed of one of organic epoxy resin system, a molding material with a thermal conductivity higher than 50 W/mK, a molding material with a magnetic permeability higher than 50, and a molding material with an electric permittivity higher than 10. The lower intermediary mold compound is formed of one of organic epoxy resin system, a molding material with a thermal conductivity higher than 50 W/mK, a molding material with a magnetic permeability higher than 50, and a molding material with an electric permittivity higher than 10.

In one embodiment of the multi-level 3D package, the upper thinned die and the lower thinned die are different types of dies.

In one embodiment of the multi-level 3D package, the upper intermediary mold compound and the lower intermediary mold compound are formed of different materials.

In one embodiment of the multi-level 3D package, at least one of the upper thinned die and the lower thinned die is an active die, which includes an insulating layer, an active layer underneath the insulating layer, and a back-end-of-line (BEOL) portion underneath the active layer. The active layer is configured to provide one or more active devices. The BEOL portion includes dielectric layers and metal structures within the dielectric layers, where the metal structures are configured to connect the active devices in the active layer to each other and/or configured to connect the active devices in the active layer to external components.

In one embodiment of the multi-level 3D package, the active die is formed from a silicon-on-insulator (SOI) structure. The active layer of the active die is formed by integrating the one or more active devices in or on a silicon epitaxy layer of the SOI structure, and the insulating layer of the active die is a buried oxide layer of the SOI structure.

In one embodiment of the multi-level 3D package, at least one of the upper thinned die and the lower thinned die is a passive die, which includes an insulating layer and a BEOL portion underneath the insulating layer. The BEOL portion includes dielectric layers and metal structures within the dielectric layers, where the metal structures are configured to provide one or more passive devices and configured to connect the passive devices to external components.

According to one embodiment, the multi-level 3D package further includes a top redistribution structure over the upper die section of the upper package level. Herein, the upper die section further includes upper vertical via structures, each of which extends through the upper mold compound. The top redistribution structure includes a top dielectric pattern and top redistribution interconnections within the top dielectric pattern. The top redistribution interconnections are configured to be connected to the upper vertical via structures.

According to one embodiment, the multi-level 3D package further includes one or more un-thinned components residing over the top redistribution structure. Herein, each un-thinned component has a thickness between 100 micrometers and several hundreds of micrometers. The upper redistribution structure includes an upper dielectric pattern and upper redistribution interconnections within the upper dielectric pattern. The one or more un-thinned components are configured to be connected to the upper thinned die through the top redistribution interconnections, the upper vertical via structures, and the upper redistribution interconnections.

In one embodiment of the multi-level 3D package, each un-thinned component is one of a gallium arsenide (GaAs) die, a complementary metal-oxide-semiconductor (CMOS) die, and a surface mounted device (SMD).

In one embodiment of the multi-level 3D package, the lower die section includes a number of thinned dies including the lower thinned die. The lower die section includes a number of intermediary mold compounds including the lower intermediary mold compound. Each thinned die is deposed over the lower redistribution structure and surrounded by the lower mold compound, where the lower mold compound extends vertically beyond a top surface of each thinned die to define an opening over each thinned die and within the lower mold compound. Each intermediary mold compound resides over a corresponding thinned die and fills a corresponding opening within the lower mold compound. Each thinned die includes substantially no silicon substrate and has a thickness between several micrometers and several tens of micrometers. A top surface of each intermediary mold compound and a top surface of the lower mold compound are coplanar.

In one embodiment of the multi-level 3D package, the upper die section includes a number of thinned dies including the upper thinned die. The upper die section includes a number of intermediary mold compounds including the upper intermediary mold compound. Each thinned die is deposed over the upper redistribution structure and surrounded by the upper mold compound, where the upper mold compound extends vertically beyond a top surface of each thinned die to define an opening over each thinned die and within the upper mold compound. Each intermediary mold compound resides over a corresponding thinned die and fills a corresponding opening within the upper mold compound. Each thinned die includes substantially no silicon substrate and has a thickness between several micrometers and several tens of micrometers. A top surface of each intermediary mold compound and a top surface of the upper mold compound are coplanar.

In one embodiment of the multi-level 3D package, the thinned dies in the lower die section and the thinned dies in the upper die section have different numbers of dies.

In one embodiment of the multi-level 3D package, the thinned dies in the lower die section and the thinned dies in the upper die section have different layouts.

In one embodiment of the multi-level 3D package, the thinned dies in the lower die section and the thinned dies in the upper die section provide different functionalities.

In one embodiment of the multi-level 3D package, the thinned dies in the lower die section achieves a receiver functionality, while the thinned dies in the upper die section achieves a transmitter functionality. The upper redistribution structure between the lower die section and the upper die section include an isolation metal shield to isolate signals in the lower die section and the upper die section.

According to an exemplary process, a lower die section is firstly provided over a module carrier. The lower die section includes a lower thinned die, a lower mold compound, a lower intermediary mold compound, and lower vertical via structures. Herein, the lower thinned die and the lower mold compound are deposed over the module carrier, the lower mold compound surrounds the lower thinned die and extends vertically beyond a top surface of the lower thinned die to define a lower opening over the lower thinned die and within the lower mold compound, the lower intermediary mold compound resides over the lower thinned die and fills the lower opening within the lower mold compound, and each lower vertical via structure extends through the lower mold compound. The lower thinned die includes substantially no silicon substrate and has a thickness between several micrometers and several tens of micrometers. A top surface of the lower intermediary mold compound and a top surface of the lower mold compound are coplanar. Next, an upper redistribution structure is formed over the lower die section. An upper die section is then provided over the upper redistribution structure. The upper die section includes an upper thinned die, an upper mold compound, and an upper intermediary mold compound. Herein, the upper thinned die and the upper mold compound are deposed over the upper redistribution structure, the upper mold compound surrounds the upper thinned die and extends vertically beyond a top surface of the upper thinned die to define an upper opening over the upper thinned die and within the upper mold compound, and the upper intermediary mold compound resides over the upper thinned die and fills the upper opening within the upper mold compound. The upper thinned die includes substantially no silicon substrate and has a thickness between several micrometers and several tens of micrometers. A top surface of the upper intermediary mold compound and a top surface of the upper mold compound are coplanar.

In one embodiment of the exemplary process, providing the lower die section starts with providing a lower precursor module, which includes the module carrier, a lower intact die deposed over the module carrier, and the lower mold compound that resides over the module carrier and fully encapsulates the lower intact die. Herein, the lower intact die includes a lower device region over the module carrier and a lower die substrate over the lower device region, such that a backside of the lower die substrate is a top surface of the lower intact die. Next, the lower mold compound is thinned down to expose the backside of the lower die substrate. The lower die substrate is then substantially removed to provide the lower thinned die and define the lower opening over the lower thinned die and within the lower mold compound. The lower intermediary mold compound is applied over the lower thinned die to provide a lower molding precursor. A polishing process is followed to polish the lower mold precursor, such that the top surface of the lower intermediary mold compound and the top surface of the lower mold compound are coplanar. A number of lower vertical via holes are formed through the lower mold compound, and the lower vertical via structures are formed in the lower vertical via holes to complete the lower die section.

In one embodiment of the exemplary process, providing the lower die section starts with attaching an upper intact die to the upper redistribution structure, where the upper intact die includes an upper device region over the upper redistribution structure and an upper die substrate over the upper device region, such that a backside of the upper die substrate is a top surface of the upper intact die. Next, the upper mold compound is applied over the upper redistribution structure to fully encapsulate the upper intact die. The upper mold compound is then thinned down to expose the backside of the upper die substrate. The upper die substrate is removed substantially to provide the upper thinned die and define the upper opening over the upper thinned die and within the upper mold compound. The upper intermediary mold compound is applied over the upper thinned die to provide an upper molding precursor. A polishing process is followed to polish the upper molding precursor, such that the top surface of the upper intermediary mold compound and the top surface of the upper mold compound are coplanar.

In one embodiment of the exemplary process, providing the lower die section starts with providing a lower precursor module, which includes the module carrier, a lower intact die deposed over the module carrier, lower vertical via structures deposed over the module carrier, and the lower mold compound that resides over the module carrier, fully encapsulates the lower intact die, and fully encapsulates each lower vertical via structure. Herein, the lower intact die includes a lower device region over the module carrier and a lower die substrate over the lower device region, such that a backside of the lower die substrate is a top surface of the lower intact die. Each lower vertical via structure has a same height, is shorter than the lower intact die, and is taller than the lower device region. Next, the lower mold compound is thinned down to expose the backside of the lower die substrate. The lower die substrate is removed substantially to provide the lower thinned die and define the lower opening over the lower thinned die and within the lower mold compound. The lower intermediary mold compound is applied over the lower thinned die to provide a lower molding precursor. A polishing process is followed to polish the lower mold precursor to provide the lower die section. Herein, the lower intermediary mold compound and the lower mold compound are thinned down by polishing until a top surface of each lower vertical via structure is exposed through the lower mold compound.

In one embodiment of the exemplary process, providing the lower precursor module starts with attaching the lower intact die to the module carrier. Next, seed layers are deposited over the module carrier and around the lower intact die. One or more metal/alloy materials are applied over each seed layer to form the lower vertical via structures. The lower mold compound is then applied over the module carrier to fully encapsulate the lower intact die and each lower vertical via structure.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 2A:
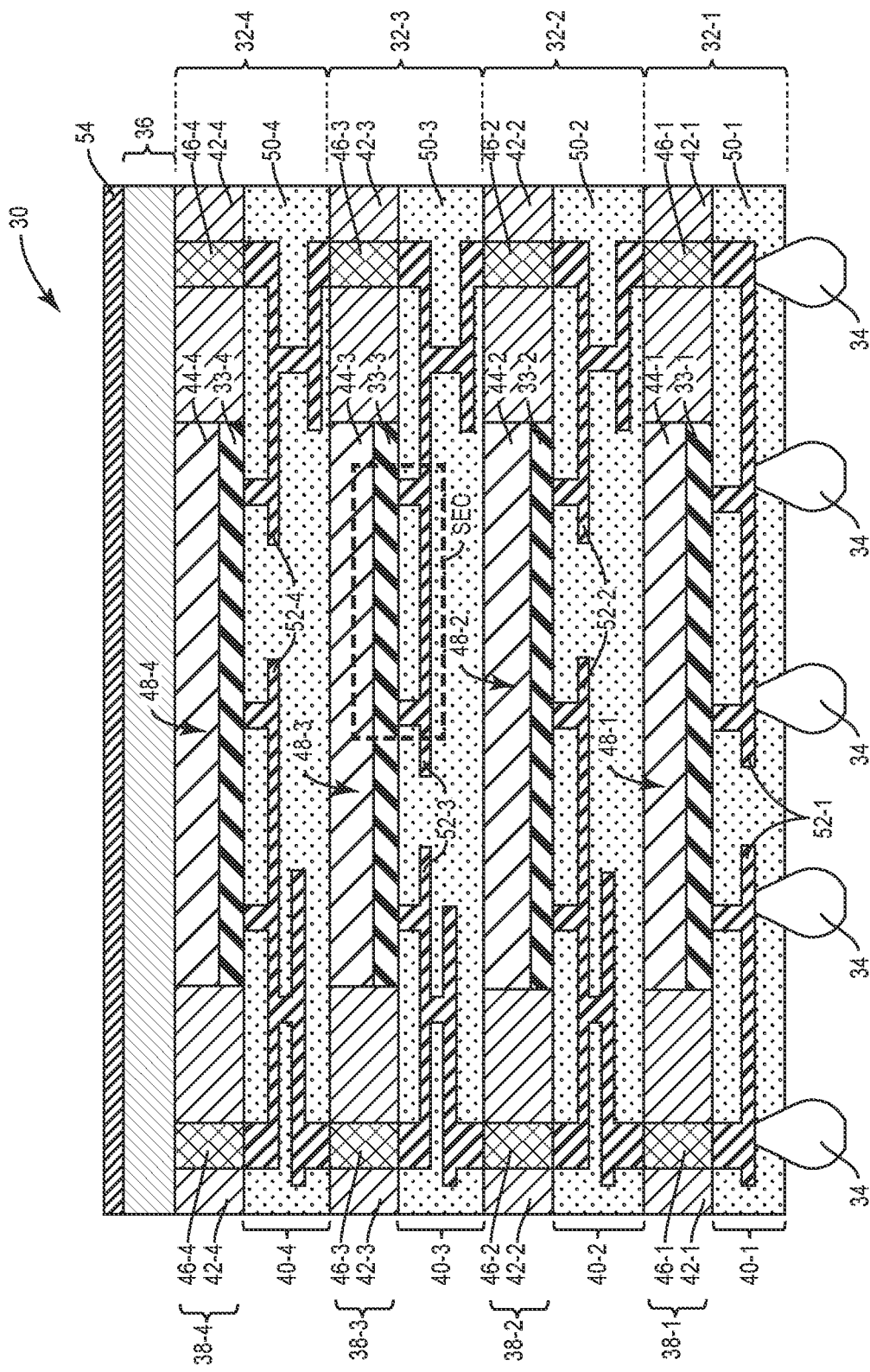
FIGS. 2A-2C illustrate an exemplary multi-level 3D package with multiple thinned dies that are vertically stacked according to one embodiment of the present disclosure.

FIGS. 6A-36 provide exemplary steps that illustrate a process to fabricate the exemplary FEM shown in FIG. 2A.

It will be understood that for clear illustrations, FIGS. 1-36 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Figure 1:
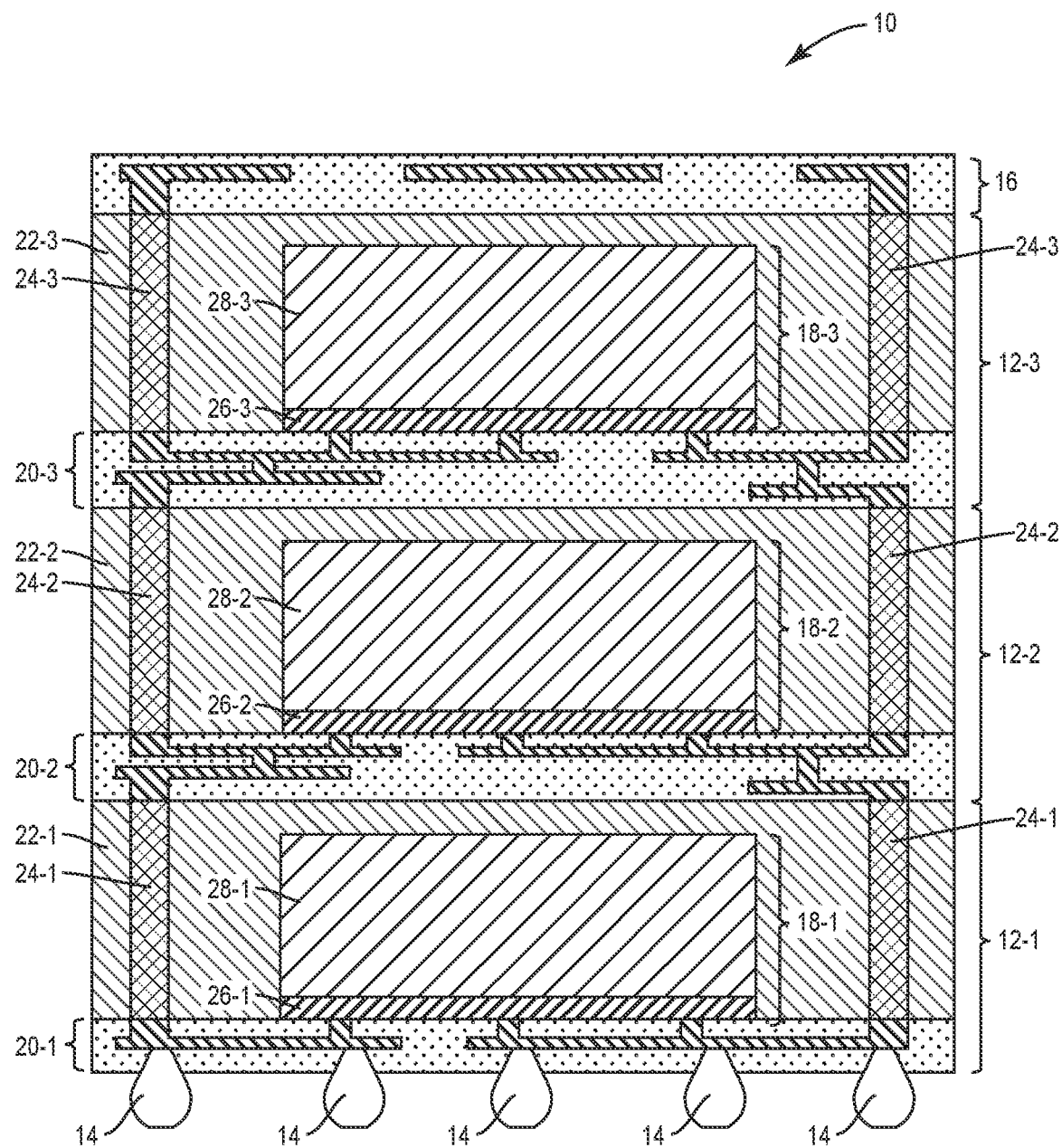
FIG. 1 illustrates a three-dimensional (3D) package with a stacked-die structure.

In many radio frequency (RF) products and applications, package modules, like front-end modules, may include multiple semiconductor dies and components, such as one or more power amplifier active dies, one or more low-noise amplifier active dies, one or more switch active dies, and one or more filter structures (LC filter/BAW filter/SAW filter/FBAR filter). In order to save footprint of the package size, a stacked-die structure may be utilized in packaging. FIG. 1 illustrates a three-dimensional (3D) package 10 with a stacked-die structure. The 3D package 10 includes multiple package levels 12 (e.g., a first package level 12-1, a second package level 12-2, and a third package level 12-3), multiple bump structures 14, and a top redistribution structure 16. Herein, the bump structures 14 are formed underneath the first package level 12-1, the second package level 12-2 resides over the first package level 12-1, the third package level 12-3 resides over the second package level 12-2, and the top redistribution structure 16 resides over the third package level 12-3.

For each package level 12, there includes a semiconductor die 18 (e.g., a first semiconductor die 18-1, a second semiconductor die 18-2, and a third semiconductor die 18-3, respectively), a redistribution structure 20 underneath the semiconductor die 18 (e.g., a first redistribution structure 20-1, a second redistribution structure 20-2, and a third redistribution structure 20-3 underneath the first semiconductor die 18-1, the second semiconductor die 18-2, and the third semiconductor die 18-3, respectively), and a mold compound 22 resides over the redistribution 20 to encapsulate the semiconductor die 18 (e.g., a first mold compound 22-1, a second mold compound 22-2, and a third mold compound 22-3, respectively). As such, these semiconductor dies 18 are vertically stacked. In addition, the 3D package 10 may also include multiple through-molding-vias (TMVs) 24 (e.g., first TMVs 24-1, second TMVs 24-2, and third TMVs 24-3, respectively), each of which extends through a corresponding mold compound 22, and is configured to electrically connect the semiconductor dies 18 in different package levels 12 and/or external components outside the three package levels 12.

A main drawback of the 3D package 10 with such stacked-die structure is that the overall height is relatively large, and in most cases is not compatible with low-profile modern mobile assemblies at 0.8 mm, 0.65 mm or 0.5 mm. To meet the low-profile requirements, the 3D package 10 may only include a very limited number of vertically stacked package levels with a standard height in several hundreds of micrometers (e.g., >300 micrometers). The low-profile module with heights below 0.8 mm or 0.65 mm may allow only two semiconductor dies to be stacked. On the other hand, each semiconductor die 18 includes a device region 26 (i.e., a first device region 26-1, a second device region 26-2, and a third device region 26-3, respectively) over the corresponding redistribution structure 20, and a silicon substrate 28 (e.g., a first silicon substrate 28-1, a second silicon substrate 28-2, and a third silicon substrate 28-3, respectively) over a corresponding device region 26. Typically, each device region 26 may have a thickness with a few tens of micrometers or less, while each silicon substrate 28 may have a thickness of a few hundreds of micrometers. These thick silicon substrates 28 take a majority portion of the height of the 3D package 10. However, the thick silicon substrates 28 do not have an active role in signal processing for the semiconductor dies 18, but merely provide mechanical stability when the redistribution structures 20 are formed underneath the corresponding semiconductor dies 18, respectively, and when the mold compounds 22 are applied to encapsulate corresponding semiconductor dies 18, respectively.

Figure 2B:
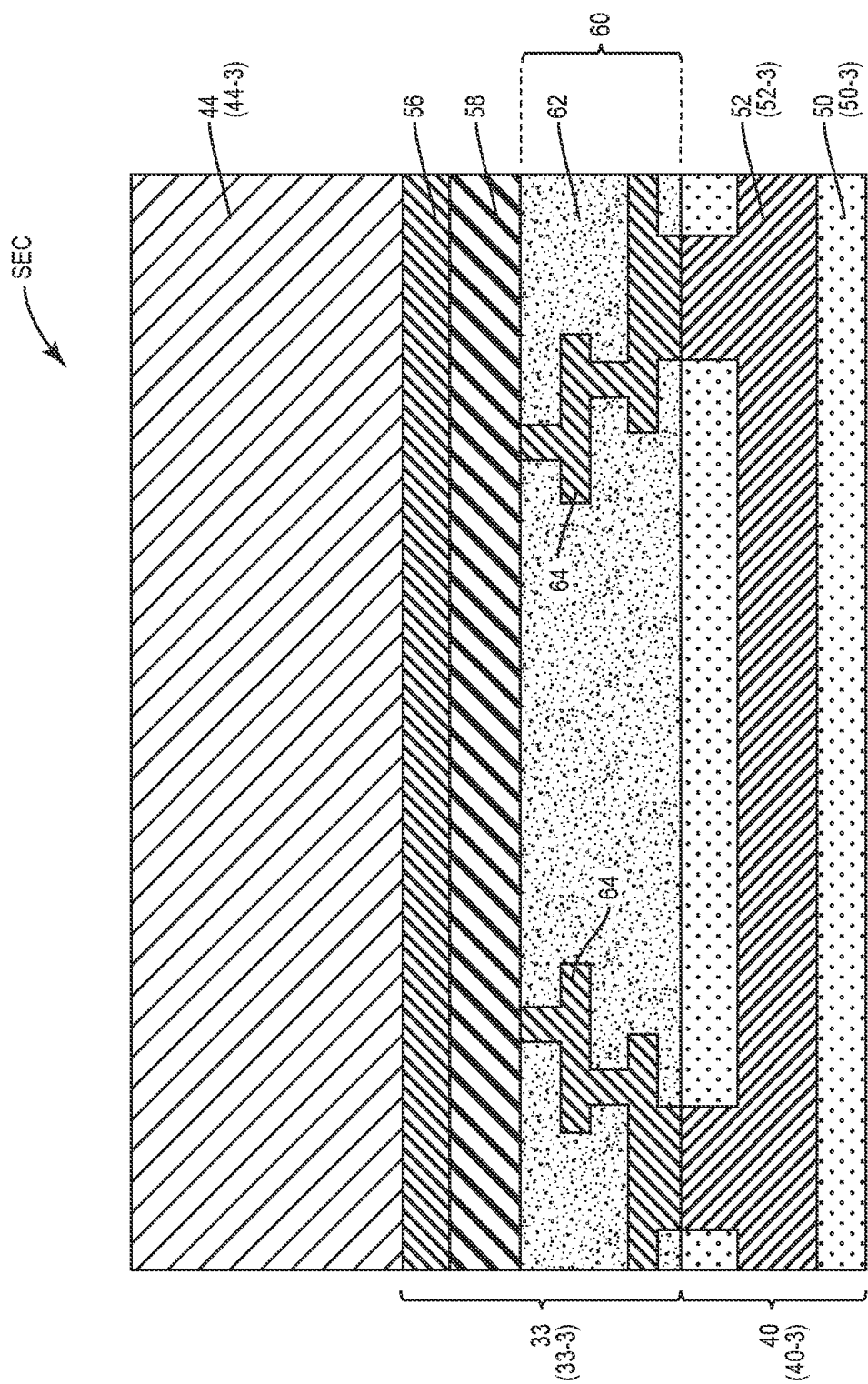
Figure 2C:
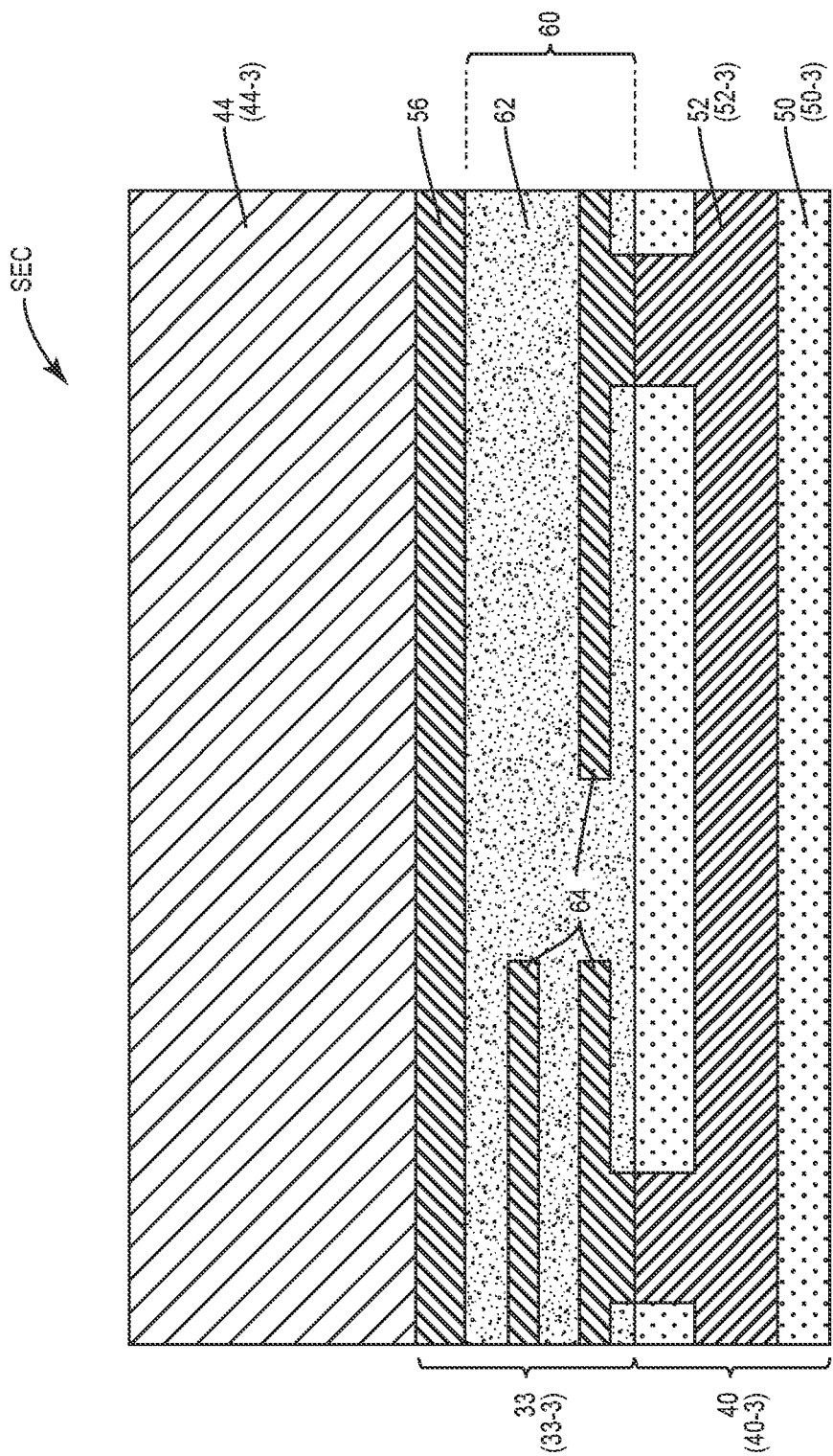

In order to accommodate more semiconductor dies vertically stacked in one 3D package, the height of each package level needs to be reduced. It is also required that the signal processing performance of the semiconductor dies is not sacrificed. FIGS. 2A-2C illustrate an exemplary multi-level 3D package 30 with multiple thinned dies that are vertically stacked according to one embodiment of the present disclosure. For the purpose of this illustration, the exemplary multi-level 3D package 30 includes four package levels 32 (e.g., a first package level 32-1, a second package level 32-2, a third package level 32-3, and a fourth package level 32-4), each of which includes a thinned die 33 (e.g., a first thinned die 33-1, a second thinned die 33-2, a third thinned die 33-3, and a fourth thinned die 33-4, respectively, in the four package levels 32-1~32-4), multiple bump structures 34, and a top protection structure 36. Herein, the bump structures 34 are formed underneath the first package level 32-1, the second package level 32-2 resides over the first package level 32-1, the third package level 32-3 resides over the second package level 32-2, the fourth package level 32-4 resides over the third package level 32-3, and the top protection structure 36 resides over the fourth package level 32-4. As such, the first, second, third, and fourth thinned dies 33-1~33-4 are vertically stacked. In different applications, the multi-level 3D package 30 may include fewer or more package levels 32, and each package level 32 may have different numbers of thinned dies 33 (see FIG. 5 below).

In detail, each package level 32 includes a die section 38 (e.g., a first die section 38-1, a second die section 38-2, a third die section 38-3, and a fourth die section 38-4, respectively, in the four package levels 32-1~32-4), and a redistribution structure 40 underneath the die section 38 (e.g., a first redistribution structure 40-1, a second redistribution structure 40-2, a third redistribution structure 40-3, and a fourth redistribution structure 40-4 underneath the first die section 38-1, the second die section 38-2, the third die section 38-3, and the fourth die section 38-4, respectively). Each die section 38 includes one thinned die 33 (the first thinned die 33-1, the second thinned die 33-2, the third thinned die 33-3, and the fourth thinned die 33-4, respectively, in the four die sections 38-1~38-4), a mold compound 42 (e.g., a first mold compound 42-1, a second mold compound 42-2, a third mold compound 42-3, and a fourth mold compound 42-4, respectively, in the four die sections 38-1~38-4), an intermediary mold compound 44 (e.g., a first intermediary mold compound 44-1, a second intermediary mold compound 44-2, a third intermediary mold compound 44-3, and a fourth intermediary mold compound 44-4, respectively, in the four die sections 38-1~38-4), and multiple vertical via structures 46 (e.g., first vertical via structures 46-1, second vertical via structures 46-2, third vertical via structures 46-3, and fourth vertical via structures 46-4, respectively, in the four die sections 38-1~38-4). Herein, each thinned die 33 and each mold compound 42 are deposed over a corresponding redistribution structure 40. The mold compound 42 surrounds the thinned die 33 and extends vertically beyond a top surface of the thinned die 33 to define one opening 48 (e.g., a first opening 48-1, a second opening 48-2, a third opening 48-3, and a fourth opening 48-4, respectively, in the four die sections 38-1~38-4) over the thinned die 33 and within the mold compound 42. Each intermediary mold compound 44 resides over a corresponding thinned die 33 and fills a corresponding opening 48 within the corresponding mold compound 42, where a top surface of one intermediary mold compound 44 and a top surface of a corresponding mold compound 42 are coplanar.

In addition, each redistribution structure 40, which is formed underneath the corresponding die section 38, includes a dielectric pattern 50 (e.g., a first dielectric pattern 50-1, a second dielectric pattern 50-2, a third dielectric pattern 50-3, and a fourth dielectric pattern 50-4, respectively, in the four redistribution structures 40-1~40-4) and a number of redistribution interconnections 52 (e.g., redistribution interconnections 52-1, second redistribution interconnections 52-2, third redistribution interconnections 52-3, and fourth redistribution interconnections 52-4, respectively, in the four redistribution structures 40-1~40-4) within the dielectric pattern 50. Herein, the redistribution interconnections 52 are configured to connect the thinned dies 33 on a same package level (see FIG. 5 below) or connect the thinned dies 33 on adjacent package levels. For the first package level 32-1, the first redistribution interconnections 52-1 are further configured to be coupled to the bump structures 34 through the first dielectric pattern 50-1. The bump structures 34, which might be copper pillars or solder balls, are separate from each other and protrude from the first dielectric pattern 50-1.

Furthermore, each vertical via structure 46 extends through the corresponding mold compound 42 and is configured to transmit heat and/or signals among different package levels. For the first, second, and third package levels 32-1~32-3, the vertical via structures 46-1~46-3 are configured to electrically and/or thermally connect the thinned dies 33 in different die sections 38 through the redistribution interconnections 52 in different redistribution structures 40. Consequently, the bump structures 34 are electrically/thermally connected to each thinned die 33 through the redistribution interconnections 52 and the vertical via structures 46. For the fourth package level 32-4, the fourth vertical via structures 46-4 are configured to transmit heat and/or signals between the fourth package level 32-4 and external components. In some applications, the fourth vertical via structures 46-4 might be omitted if no electrical components are deposed over the fourth die section 38-1. In this embodiment, the top protection structure 36 is deposed over the fourth package level 32-4 (i.e., over the fourth mold compound 42-4 and the fourth intermediary mold compound 44-4) and coupled to the fourth vertical via structures 46-4, and an additional metal shield 54 is deposed over the top protection structure 36. The top protection structure 36 is configured to provide chemical and gas/air contamination protection, so as to provide isolation of the multi-level 3D package 30. The top protection structure 36 may have a thickness from few tens of micrometers to about 100 micrometers or about 200 micrometers. The metal shield 54 is configured to provide electromagnetic shielding of the multi-level 3D package 30 and may have a thickness from fractions of a micrometer to several micrometers. In some applications, the metal shield 54 may be omitted.

Herein, each mold compound 42 may be formed of multi-particle materials and always has a same thickness as a combination of the corresponding thinned die 33 and the corresponding intermediary mold compound 44. Planarization steps may be used to ensure that each package level 32 is ready for the next step of stacking. Each vertical via structure 46 may be a TMV or a Via-Bar insert. The Via-Bar inserts may be printed circuit board (PCB) based, metal post based or any other metal and insulator pre-fabricated structure. The top protection structure 36 may be formed of molding materials and optionally one or more glass-type materials sealing at a top of the top protection structure 36. The metal shield 54 may be formed of copper, aluminum or other metals or alloys.

In different applications, each package level 32 may include single or multiple thinned dies 33. In different package levels, a number of the thinned dies 33 might be different, and/or the thinned dies 33 might be different types of dies. For instance, the first thinned die 33-1 and the second thinned die 33-2 might be active dies, such as a power amplifier active die, a low-noise amplifier active die, or a switch active die, while the third thinned die 33-3 and the fourth thinned die 33-4 might be passive dies, such as a passive filter die (LC filter/BAW filter/SAW filter/FBAR filter), or a transformer die. FIGS. 2B and 2C show structure details of one thinned die 33 in a dashed box SEC in FIG. 2A.

As illustrated in FIG. 2B, the thinned die 33 is an active die, which includes an insulating layer 56, an active layer 58 underneath the insulating layer 56, and a back-end-of-line (BEOL) portion 60 underneath the active layer 58. The active layer 58 is configured to provide one or more active devices (e.g., devices with one or more transistors, such as a power amplifier, a low-noise amplifier, and a switch). The BEOL portion 60 includes dielectric layers 62 and metal structures 64 within the dielectric layers 62, where the metal structures 64 are configured to connect the active devices in the active layer 58 to each other (not shown) and/or configured to connect the active devices in the active layer 58 to corresponding redistribution interconnections 52 in the redistribution structure 40. In some applications, the BEOL portion 60 may also be configured to provide passive devices (e.g., utilizing the dielectric layers 62 and the metal structures 64 to form the passive devices, not shown).

When the thinned die 33 is an active die, the thinned die 33 may be formed from a silicon-on-insulator (SOI) structure. The active layer 58 of the thinned die 33 is formed by integrating active devices (not shown) in or on a silicon epitaxy layer of the SOI structure. The insulating layer 56 of the thinned die 33 is a buried oxide (i.e., silicon oxide, BOX) layer of the SOI structure. In addition, a silicon substrate of the SOI structure is removed substantially from the thinned die 33 (details described below). In some applications, a top surface of the thinned die 33 is a top surface of the insulating layer 56. The BEOL portion 60 is formed underneath the active layer 58 after the active layer 58 is completed.

In FIG. 2C, the thinned die 33 is a passive die, which includes the insulating layer 56 and the BEOL portion 60 underneath the insulating layer 56 without any active layer. In the BEOL portion 60, the dielectric layers 62 and the metal structures 64 are configured to provide one or more passive devices (e.g., resistors, capacitors, inductors, transmission lines, and any combination of them, etc . . . ,). Some of the metal structures 64 are electrically connected to the corresponding redistribution interconnections 52 in the redistribution structure 40. In this embodiment, the thinned die 33 may be formed by an integrated passive device process, where the insulating layer 56 may be formed of one or more polymer materials (such as emulsion polymers, interlayer polymers or synthetic rubber) or one or more dielectric materials (such as silicon-dioxide, silicon-nitride, etc.).

Notice that, due to different types of the thinned dies 33, the corresponding intermediary mold compounds 44 might be formed of different materials with different characteristics. Each intermediary mold compound 44 may be formed of a same material as the mold compounds 42 (e.g., a standard molding material), formed of a high electric permittivity molding material (e.g., the electric permittivity >10, such as a molding material containing alumina and/or barium titanate), a high thermal conductivity molding material (e.g., the thermal conductivity >50 W/mK, such as a molding material having graphene added or a molding material having graphene alumina filler added), or a high magnetic permeability material (e.g., the magnetic permeability >50, such as a molding material with added powder containing iron, nickel, cobalt or a molding material with added powder containing ferri/ferro-magnetic materials, like magnetite, Ytrium-Iron-G, etc.). A standard molding compound with silica fillers has a low thermal conductivity around 1 W/mK. Using added graphene to alumina compounds, the thermal conductivity can be increased above 5 W/mK or even above 10 W/mK.

In addition, regardless of the types of the thinned dies 33, each thinned die 33 has substantially no substrate (e.g. no silicon substrate) and may have a thickness between few micrometers and several tens of micrometers. Each intermediary mold compound 44 may have a thickness between few micrometers and several tens of micrometers. A combination of one thinned die 33 and its corresponding intermediary mold compound 44 (i.e., one die section 38) may have a thickness between few micrometers and several tens of micrometers, or up to 100 micrometers, or up to 150 micrometers. Each redistribution structure 40 may have a thickness between 5 micrometers and few tens of micrometers. Each package level 32 may have a thickness between few micrometers and several tens of micrometers, or up to 100 micrometers, or up to 150 micrometers (depending on thicknesses of the redistribution interconnections 52 and the dielectric pattern 50 in the redistribution structure 40). If high current capability is needed, thicker redistribution interconnections 52 need to be used. The bump structures 34 may have a height between several micrometers and few hundreds of micrometers (today's micro-bumps can get as low as 10 micrometers and may go below 10 micrometers). The top protection structure 36 may have a thickness between several tens of micrometers and about 200 micrometers, and the metal shield 54 may have a thickness between fractions of a micrometer and few micrometers. As such, the multi-level 3D package 30 with the vertically stacked thinned dies 33 can easily meet the low-profile requirements for the modern mobile assemblies at 0.8 mm, 0.65 mm or 0.5 mm. The multi-level 3D package 30 may accommodate a relatively large number of package levels 32/thinned dies 33 (e.g. four or more) stacked vertically.

Figure 3:
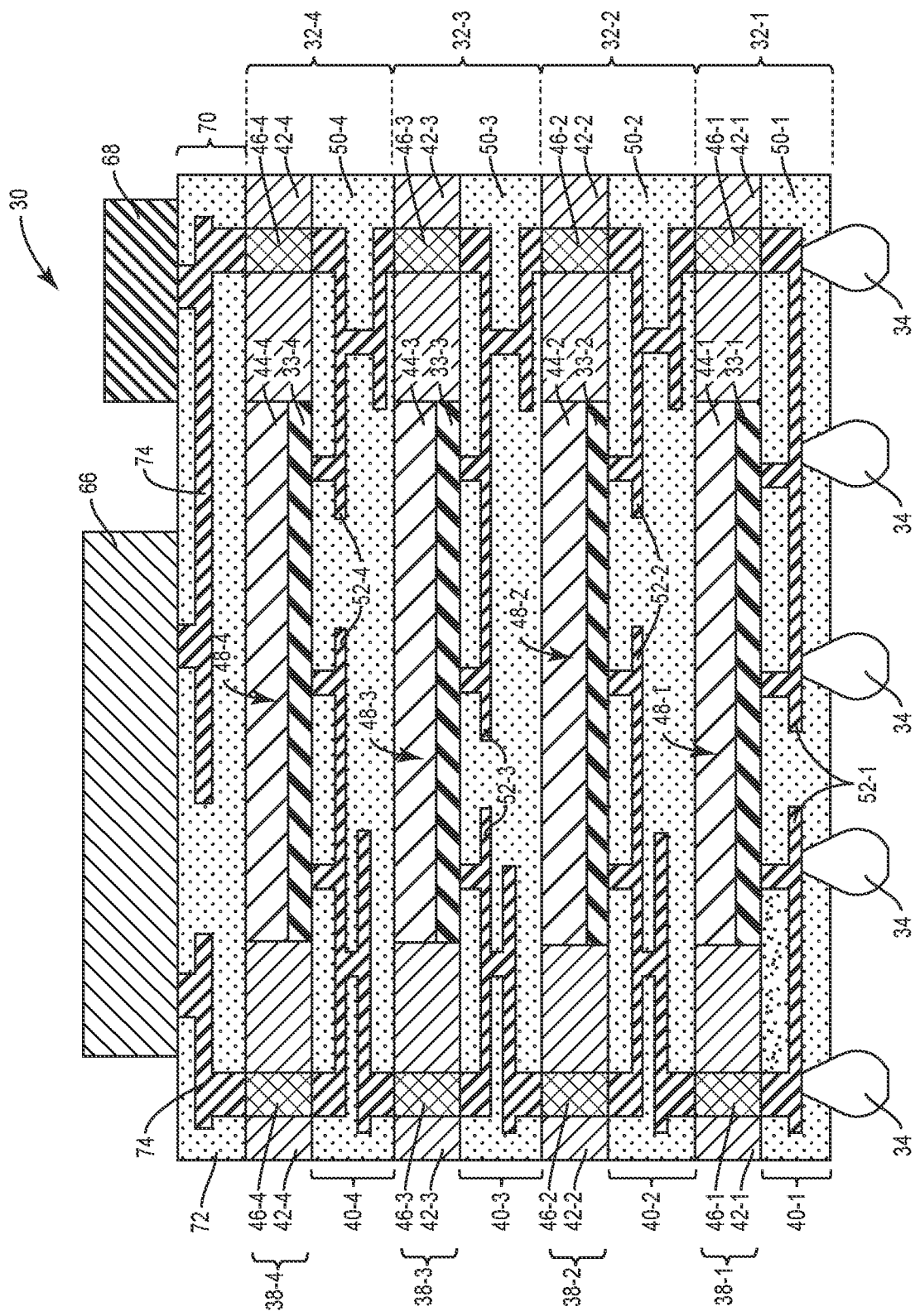
FIGS. 3-5E illustrate an alternative multi-level 3D package according to one embodiment of the present disclosure.

In some applications, the multi-level 3D package 30 may further include one or more components, which, unlike the thinned dies 33, cannot be reduced in height (details of die height reduction are described below), such as gallium arsenide (GaAs) dies, complementary metal-oxide-semiconductor (CMOS) dies, and surface mounted devices (SMDs). As illustrated in FIG. 3, the multi-level 3D package 30 further includes a first un-thinned component 66 and a second un-thinned component 68 at a top of the multi-level 3D package 30. To accommodate the first and second un-thinned dies 66 and 68, and to electrically connect the first and second un-thinned dies 66 and 68 to the thinned die(s) 33, the multi-level 3D package 30 includes a top redistribution structure 70 instead of the top protection structure 36 over the fourth package level 32-4. Herein, the top redistribution structure 70 includes a top dielectric pattern 72 and a number of top redistribution interconnections 74 within the top dielectric pattern 72. The top redistribution interconnections 74 are configured to connect the first un-thinned die 66 with the second un-thinned die 68 and/or connect the first/second un-thinned die 66/68 with the thinned die(s) 33 (e.g., the fourth thinned die 33-4) through one or more vertical via structures 46 (e.g., the fourth via structures 46-4).

Figure 4:
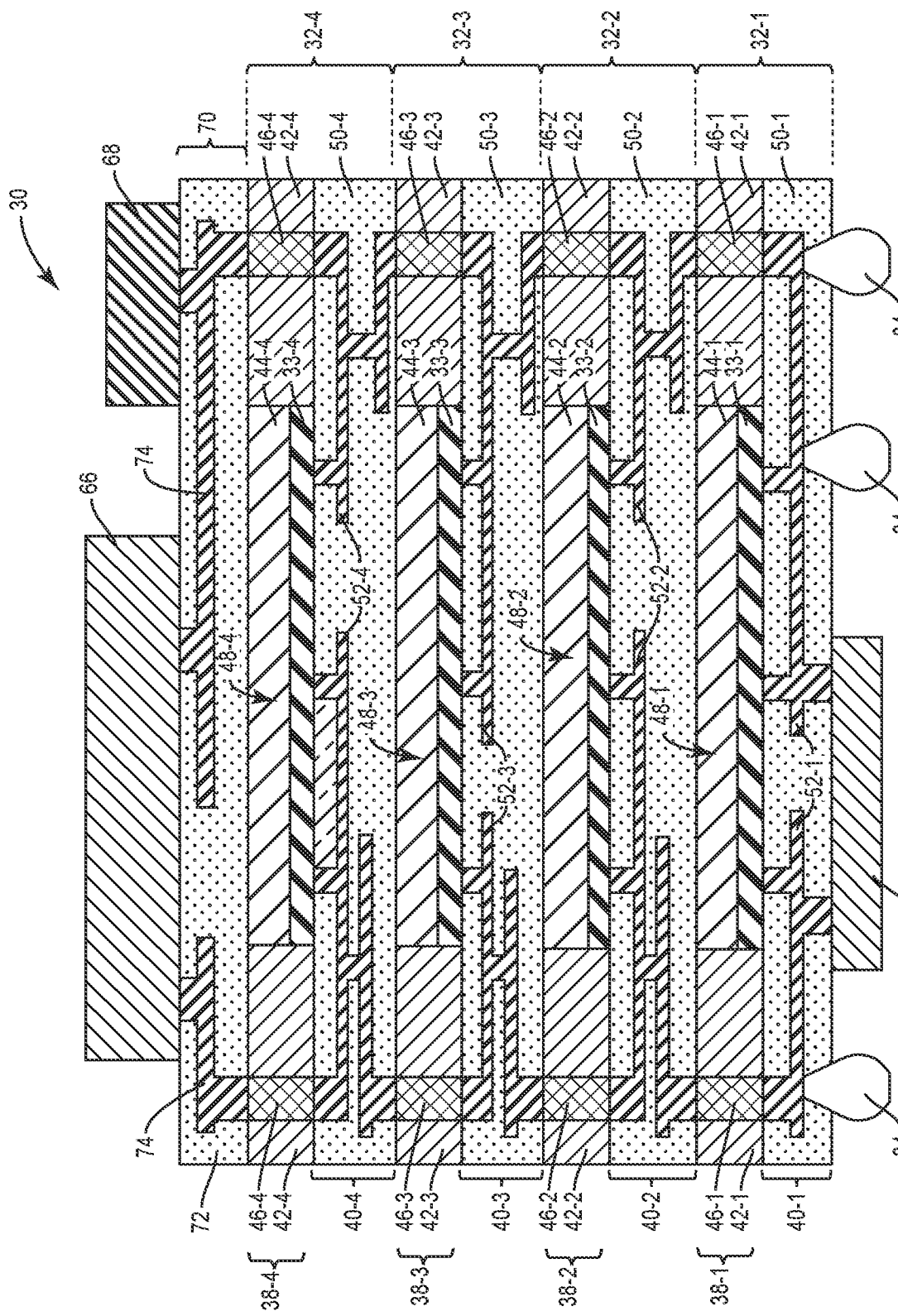

In some applications, the multi-level 3D package 30 may further include one or more un-thinned components at a bottom of the multi-level 3D package 30. As illustrated in FIG. 4, a third un-thinned component 76 is deposed underneath the first redistribution structure 40-1 and separate from the bump structures 34. In different applications, there might be multiple un-thinned components deposed underneath the first redistribution structure 40-1. The first redistribution interconnections 52-1 of the first redistribution structure 40-1 are further configured to connect the third un-thinned component 76 to the first thinned die 33-1, configured to connect the third un-thinned component 76 to some of the bump structures 34, and/or configured to connect the third un-thinned component 76 to one or more of the first vertical via structures 46-1. The third un-thinned component 76 might be a GaAs die, a CMOS die, or an SMD. For electrical and mechanical requirements of the multi-level 3D package 30, the third un-thinned component 76 needs to be shorter than the bump structures 34. As such, the third un-thinned component 76 will not further increase the height of the multi-level 3D package 30.

Figure 5A:
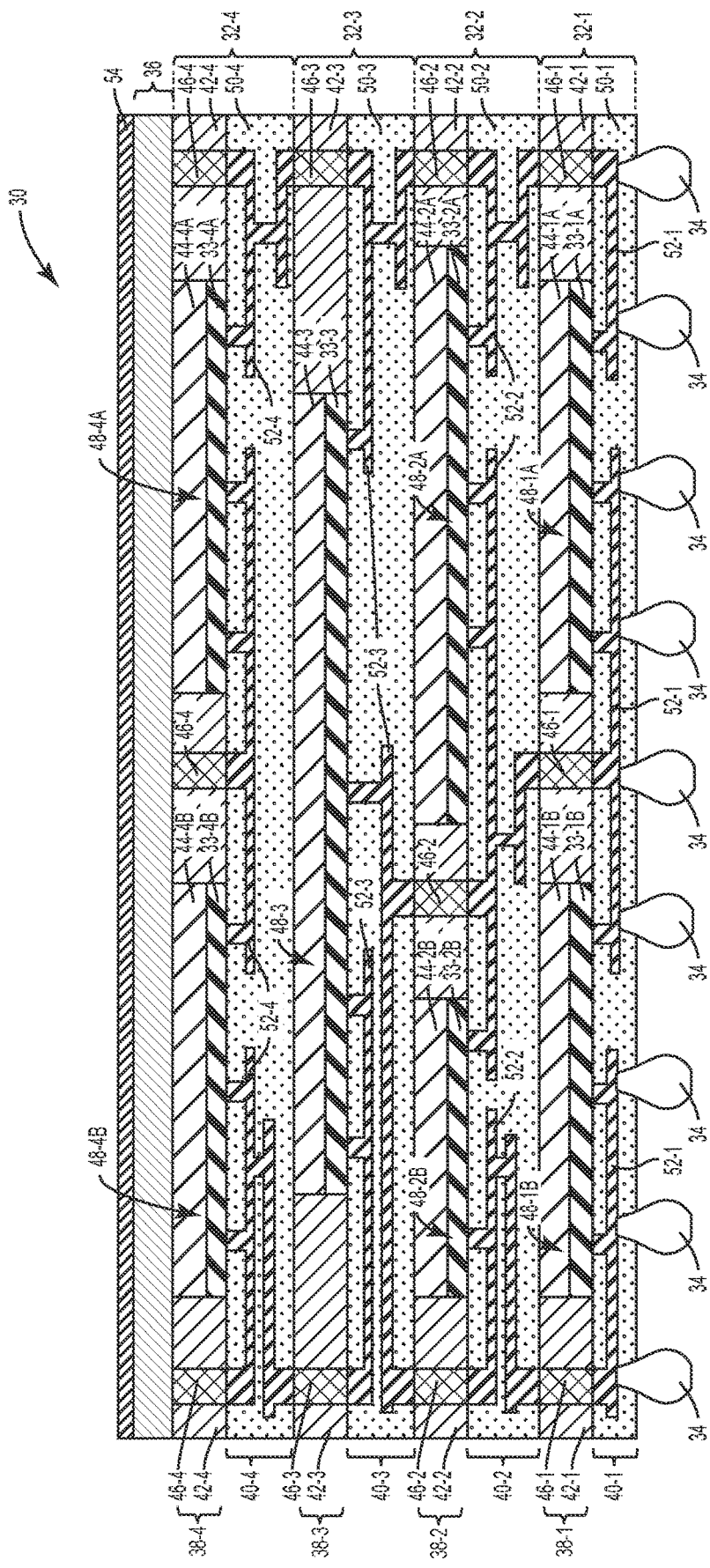
Figure 5C:
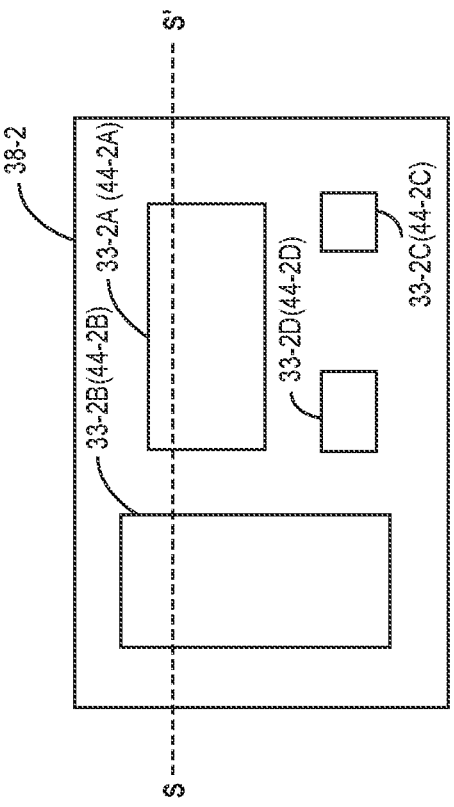
Figure 5E:
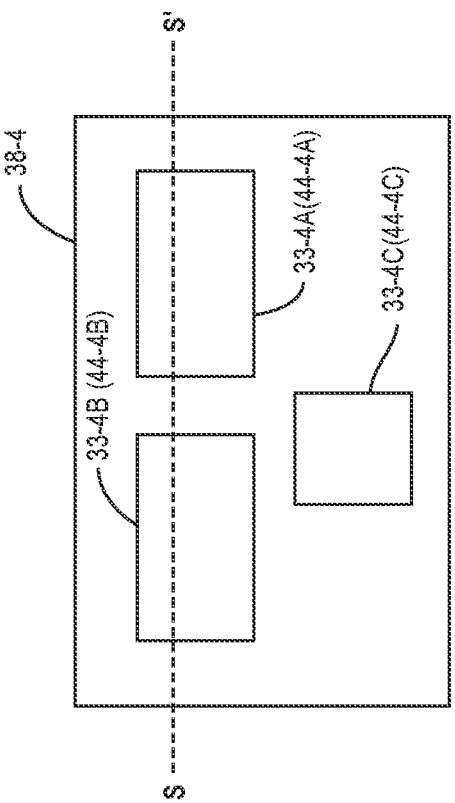
Figure 5B:
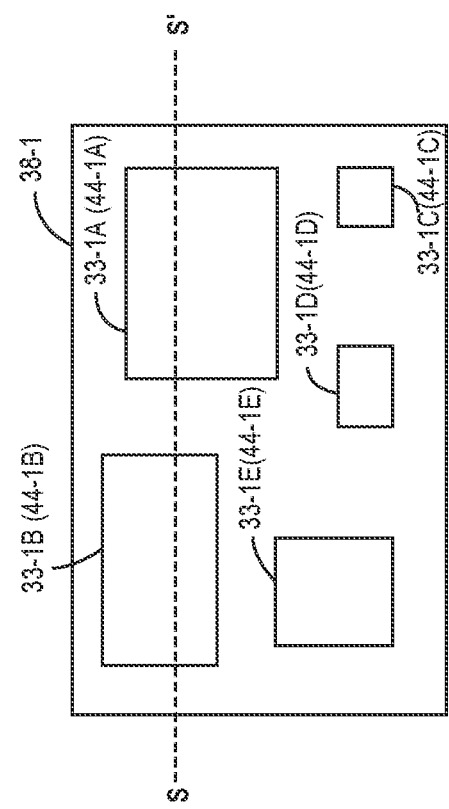
Figure 5D:
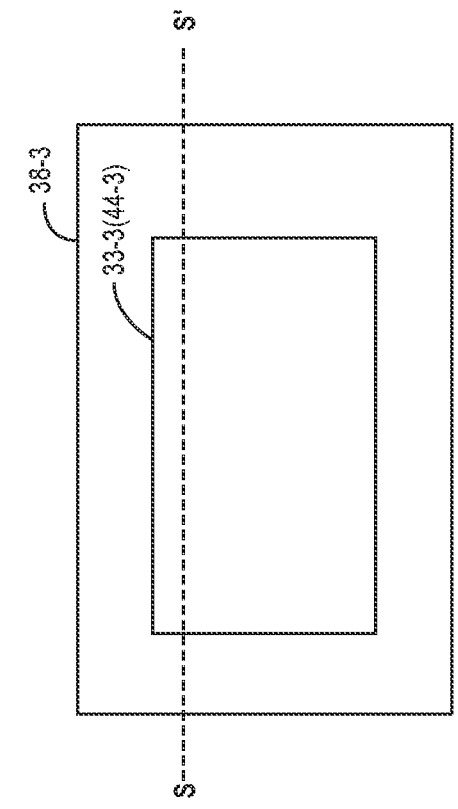

In some applications, the multi-level 3D package 30 may include a different number of thinned dies 33 in different die sections 38, as illustrated in FIGS. 5A-5E. FIG. 5A illustrates a cross-section view of the entire multi-level 3D package 30 along a dashed-line S-S' at each die section 38, and Figures illustrate a layout view of the thinned die(s) 33 at each die section 38. For the purpose of this illustration, the first die section 38-1 includes five first thinned dies 33-1 (i.e., a first thinned die A 33-1A, a first thinned die B 33-1B, a first thinned die C 33-1C, a first thinned die D 33-1D and a first thinned die E 33-1E); the second die section 38-2 includes four second thinned dies 33-2 (i.e., a second thinned die A 33-2A, a second thinned die B 33-2B, a second thinned die C 33-2C, and a second thinned die D 33-2D); the third die section 38-3 includes only one third thinned die 33-3; and the fourth die section 38-4 includes three fourth thinned dies 33-4 (i.e., a fourth thinned die A 33-4A, a fourth thinned die B 33-4B, and a fourth thinned die C 33-4C). Accordingly, the first die section 38-1 includes five first intermediary mold compounds 44-1 (i.e., a first intermediary mold compound A 44-1A, a first intermediary mold compound B 44-1B, a first intermediary mold compound C 44-1C, a first intermediary mold compound D 44-1D and a first intermediary mold compound E 44-1E); the second die section 38-2 includes four second intermediary mold compounds 44-2 (i.e., a second intermediary mold compound A 44-2A, a second intermediary mold compound B 44-2B, a second intermediary mold compound C 44-2C, and a second intermediary mold compound D 44-2D); the third die section 38-3 includes only one third intermediary mold compound 44-3; and the fourth die section 38-4 includes three fourth intermediary mold compounds 44-4 (i.e., a fourth intermediary mold compound A 44-4A, a fourth intermediary mold compound B 44-4B, and a fourth intermediary mold compound C 44-4C). In different applications, each die section 38 may include fewer or more thinned dies 33/intermediary mold compounds 44 with different layouts.

In one embodiment, each die section 38 may achieve different functionalities. For instance, the first die section 38-1 may achieve a receiver functionality, while the second die section 38-2 may achieve a transmitter functionality. In such case, the second redistribution structure 40-2 (between the first die section 38-1 and the second die section 38-2) may include an isolation metal shield (not shown), which is implemented by the second redistribution interconnections 52-2, to isolate signals in the first and second die sections 38-1 and 38-2. In one embodiment, each die section 38 may only include one or more specific types of dies. For instance, in the first die section 38-1, the first thinned dies 33-1 are all switch dies and/or LNA dies, while in the second die section 38-2, the second thinned dies 33-2 are all filter dies.

For electrical and mechanical requirements of the multi-level 3D package 30, each die section 38 must have a planarized top surface and a planarized bottom surface. In other words, in one die section 38, the thinned dies 33 may have different thicknesses, but a combination of each thinned die 33 and its corresponding intermediary mold compound 44 will have a same thickness. Also, in each die section 38, the mold compound 42 has a same thickness as the combination of each thinned die 33 and its corresponding intermediary mold compound 44.

FIGS. 6A-36 provide exemplary steps to fabricate the exemplary multi-level 3D package 30 shown in FIG. 2A. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 6A-36.

Figure 6A:
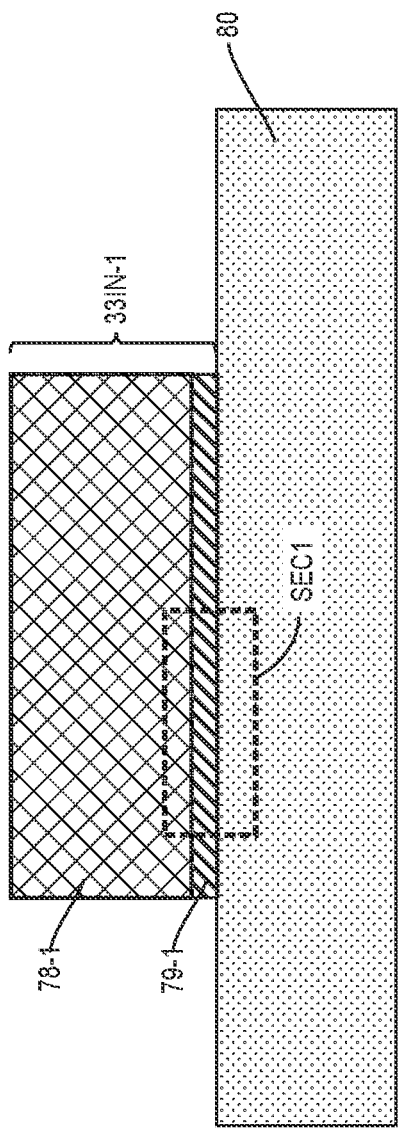

With reference to FIGS. 6A through 13, the first die section 38-1 is formed according to one embodiment of the present disclosure. Initially, a first intact die 33IN-1, which includes a first die substrate 78-1 and a first device region 79-1, is attached to a module carrier 80, as illustrated in FIG. 6A. The first device region 79-1 is underneath the first die substrate 78-1 and resides over the module carrier 80, such that a backside of the first die substrate 78-1 is a top surface of the first intact die 33IN-1. The first die substrate 78-1 may be formed of low cost silicon materials with a thickness between 150 micrometers and 700 micrometers, while the first device region 79-1 is configured to provide active and/or passive devices with a thickness between several micrometers and several tens of micrometers. It will be clear to those skilled in the art that modifications to these thicknesses may also be considered within the scope of the concepts disclosed herein.

Figure 6C:
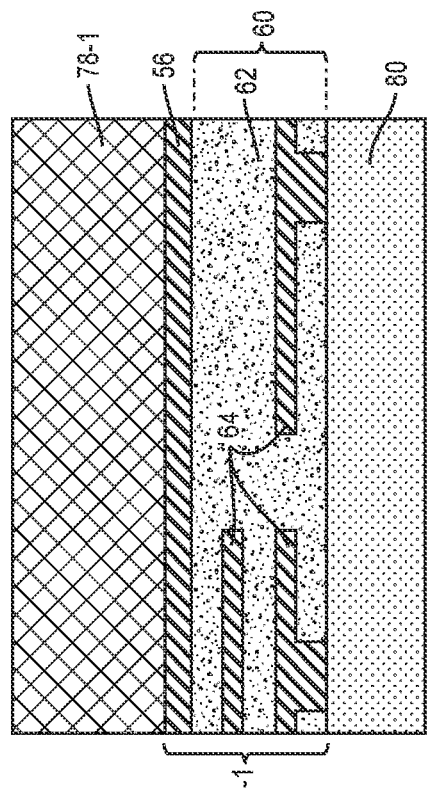
Figure 6B:
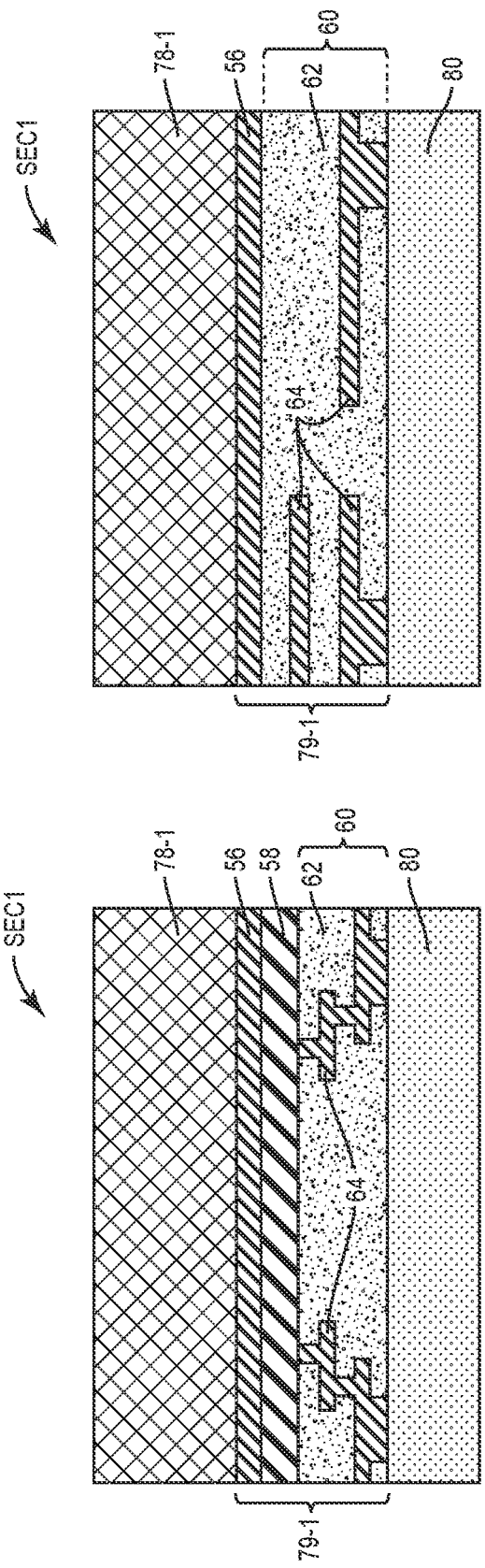

In one embodiment, the first intact die 33IN-1 is an active die, where the first device region 79-1 includes the insulating layer 56, the active layer 58 underneath the insulating layer 56, and the BEOL portion 60 underneath the active layer 58, as illustrated in FIG. 6B (dashed box SEC1 in FIG. 6A). The active layer 58 is configured to provide one or more active devices (e.g., devices with one or more transistors, such as a power amplifier, a low-noise amplifier, and a switch), while the BEOL portion 60 is configured to connect the active devices in the active layer 58 to each other and/or configured to connect the active devices in the active layer 58 to external components (e.g., corresponding redistribution interconnections 52 in the redistribution structure 40, see FIG. 2B). Typically, the BEOL portion 60 includes the dielectric layers 62 and the metal structures 64 that realize the connection function of the BEOL 60. In some applications, the BEOL portion 60 may also be configured to provide passive devices (e.g., utilizing the dielectric layers 62 and the metal structures 64 to form resistors, capacitors, inductors, transmission lines, and any combination of them, etc., not shown).

When the first intact die 33IN-1 is an active die, the first intact die 33IN-1 may be formed from a SOI structure. The active layer 58 of the first intact die 33IN-1 is formed by integrating active devices (not shown) in or on a silicon epitaxy layer of the SOI structure. The insulating layer 56 of the first intact die 33IN-1 is a buried oxide (i.e., silicon oxide, BOX) layer of the SOI structure. In addition, the first die substrate 78-1 of the first intact die 33IN-1 is a silicon substrate of the SOI structure. The BEOL portion 60 is formed underneath the active layer 58 after the active layer 58 is completed.

In one embodiment, the first intact die 33IN-1 is a passive die, where the first device region 79-1 does not include any active layer but only includes the insulating layer 56 and the BEOL portion 60 underneath the insulating layer 56, as illustrated in FIG. 6C (dashed box SEC1 in FIG. 6A). In the BEOL portion the dielectric layers 62 and the multi-layer metal structure 64 may be configured to provide one or more passive devices (e.g., resistors, capacitors, inductors, transmission lines, and any combination of them, etc.). When the first intact die 33IN-1 is a passive die, the first intact die 33IN-1 may be formed by an integrated passive device process, where the insulating layer 56 of the first intact die 33IN-1 may be formed of one or more polymer materials (such as emulsion polymers, interlayer polymers and synthetic rubbers) or one or more dielectric materials (such as silicon oxide, silicon nitride, etc.) and the first die substrate 78-1 of the first intact die 33IN-1 is a silicon substrate.

Figure 7:
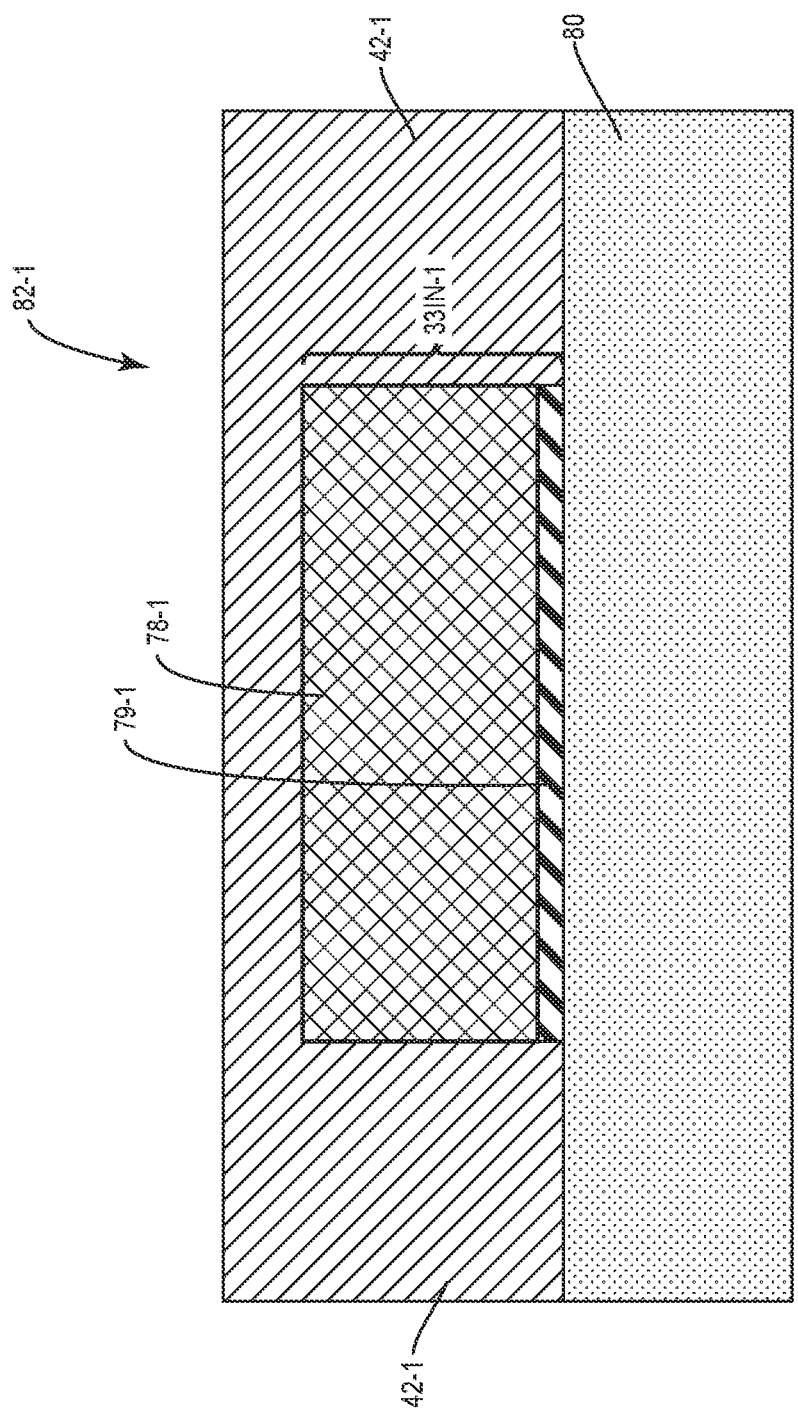

Next, the first mold compound 42-1 is applied over the module carrier 80 and fully encapsulates the first intact die 33IN-1 to provide a first precursor 82-1, as illustrated in FIG. 7. The first mold compound 42-1 may be applied by various procedures, such as sheet molding, overmolding, compression molding, transfer molding, dam fill encapsulation, or screen print encapsulation. The first mold compound 42-1 may be formed of a standard molding material (e.g., an organic epoxy resin system or the like), which can be used as an etchant barrier to the first device region 79-1 of the first intact die 33IN-1 against etching chemistries such as Tetramethylammonium hydroxide (TMAH), potassium hydroxide (KOH), sodium hydroxide (NaOH), and acetylcholine (ACH). A curing process (not shown) is then used to harden the first mold compound 42-1. The curing temperature is between 100° C. and 320° C. depending on which material is used as the first mold compound 42-1.

Figure 8:
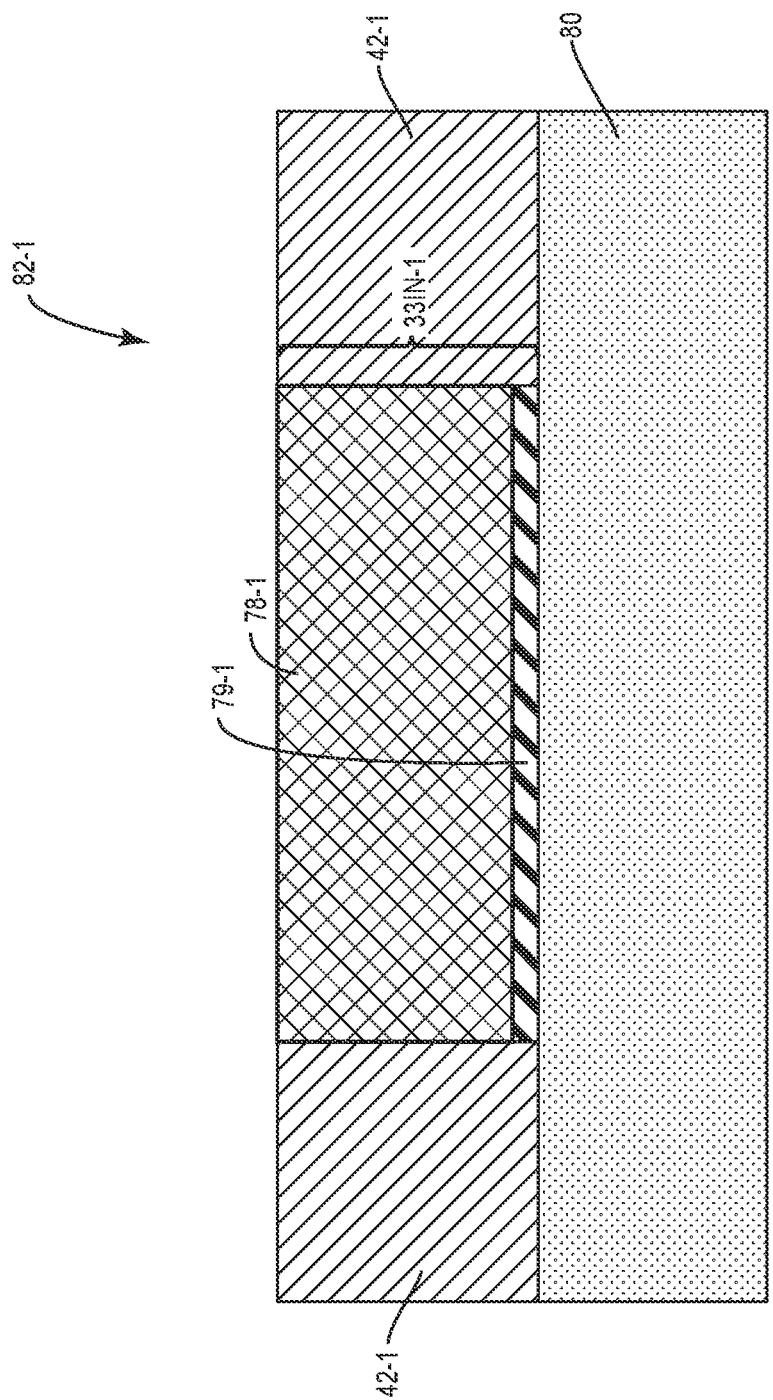
Figure 9:
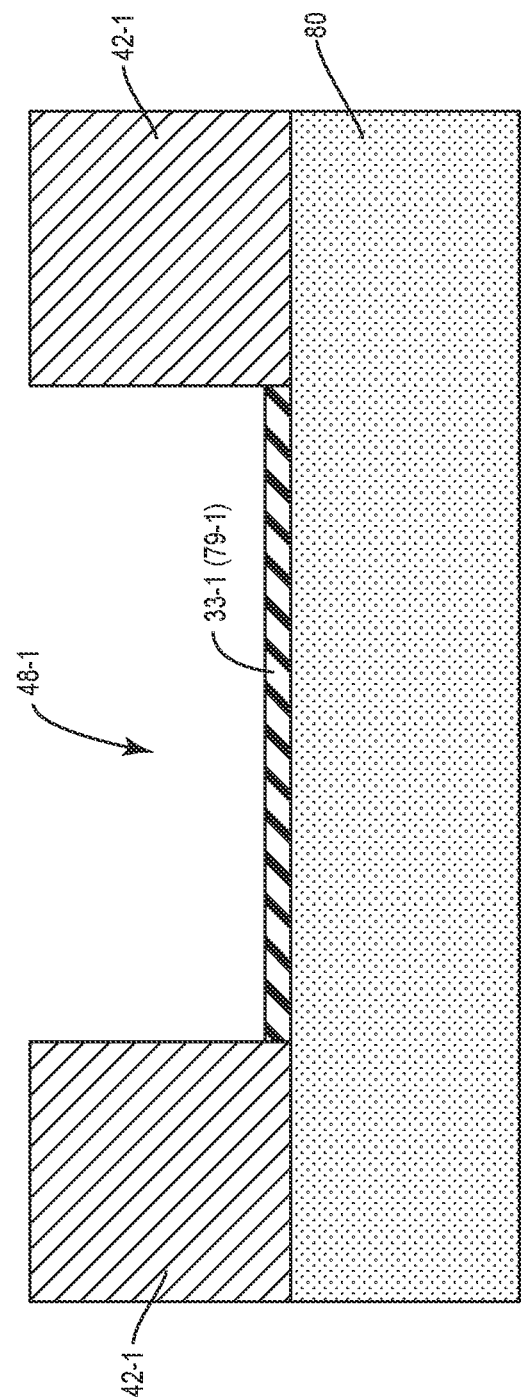

The first mold compound 42-1 is then thinned down to expose the backside of the first die substrate 78-1 of the first intact die 33IN-1, as shown in FIG. 8. The thinning procedure may be done with a mechanical grinding process. The following step is to remove substantially the first die substrate 78-1 of the first intact die 33IN-1 to provide the first thinned die 33-1 that includes the first device region 79-1 and define the first opening 48-1 over the first thinned die 33-1, as illustrated in FIG. 9. Herein, removing substantially the first die substrate 78-1 refers to removing at least 95% of the entire first die substrate 78-1, and leaving at most 2 micrometers die substrate or perhaps further removing a portion of the insulating layer 56. In desired cases, the first die substrate 78-1 is fully removed, such that the first thinned die 33-1 is the first device region 79-1, where the top surface of the insulating layer 56 is the top surface of the first thinned die 33-1 and is exposed at the bottom of the first opening 48-1. Removing substantially the first die substrate 78-1 may be provided by an etching process with a wet/dry etchant chemistry, which may be TMAH, KOH, NaOH, ACH, or the like. During the etching process, the insulating layer 56 functions as an etching stop layer, which has a much slower rate of being etched than the first die substrate 78-1 (i.e. silicon substrate) by using the wet/dry etchant chemistries. The first mold compound 42-1 may be used as an etchant barrier to protect at least sides of the first device region 79-1 against the etchant chemistries. Thus, the first opening 48-1, where the first die substrate 78-1 was removed, is defined within the first mold compound 42-1, and the vertical walls of the first opening 48-1 are inner sides of the first mold compound 42-1 that are aligned with the edges of the first thinned die 33-1.

Figure 10:
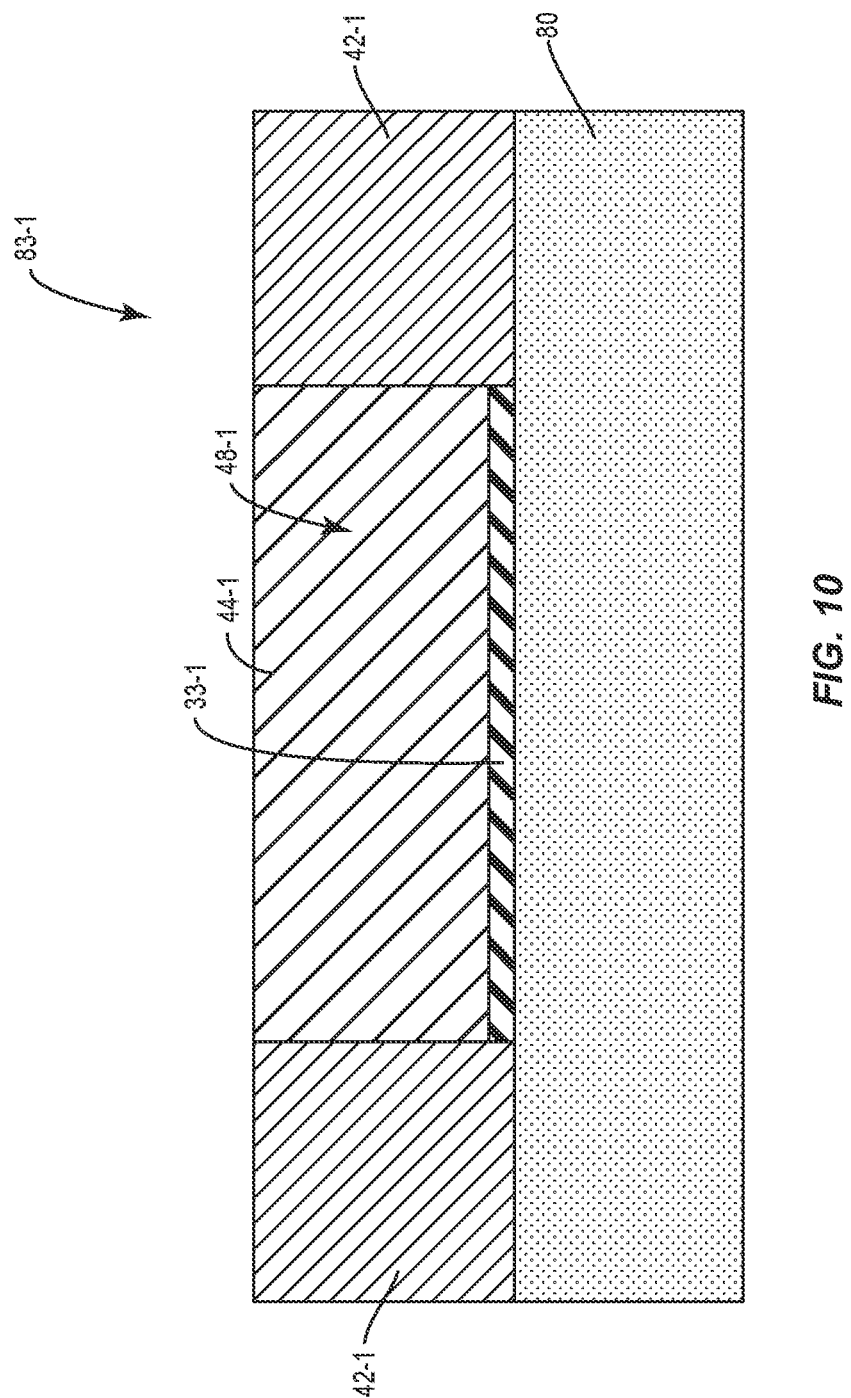

The first intermediary mold compound 44-1 is applied over the first thinned die 33-1 to provide a first molding precursor 83-1 as illustrated in FIG. 10. The first intermediary mold compound 44-1 substantially fills the first opening 48-1. The first intermediary mold compound 44-1 may be applied by various procedures, such as sheet molding, overmolding, compression molding, transfer molding, dam fill encapsulation, and screen print encapsulation. The first intermediary mold compound 44-1 directly resides over the top surface of the first thinned die 33-1. If there is no first die substrate 78-1 left in the first thinned die 33-1, the first intermediary mold compound 44-1 directly resides over the insulating layer 56. Due to a different type of the first thinned die 33-1, the first intermediary mold compound 44-1 might be formed of a different material with different characteristics. The first intermediary mold compound 44-1 may be formed of a same material as the first mold compound 42-1 (e.g., a standard molding material), formed of a high electric permittivity molding material (e.g., the electric permittivity >10, such as a molding material containing alumina and/or barium titanate), a high thermal conductivity molding material (e.g., the thermal conductivity >50 W/mK, such as a molding material having graphene added or a molding material having graphene and alumina filler added), or a high magnetic permeability material (e.g., the magnetic permeability >50, such as a molding material with added powder containing iron, nickel, cobalt or a molding material with added powder containing ferri/ferro-magnetic materials, like magnetite, Ytrium-Iron-G, etc.). A curing process (not shown) is followed to harden the first intermediary mold compound 44-1. The curing temperature is between 100° C. and 320° C. depending on which material is used as the first intermediary mold compound 44-1.

Figure 11:
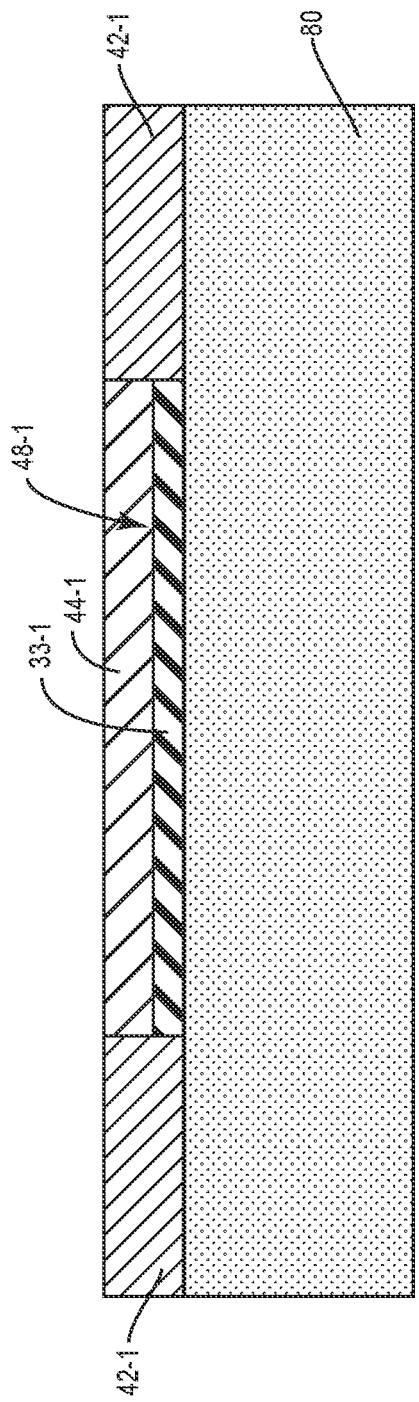

A polishing step is then applied to the first molding precursor 83-1 to determine a final thickness of the first mold compound 42-1 and a final thickness of the combination of the first thinned die 33-1 and the first intermediary mold compound 44-1 (i.e., a final thickness of the first die section 38-1). As illustrated in FIG. 11, the thickness of the first mold compound 42-1 and the thickness of the first intermediary mold compound 44-1 are reduced and the first opening 48-1 becomes shallower. The polishing step may be implemented by a mechanical grinding process. After the polishing step, the top surface of the first mold compound 42-1 is coplanar with the top surface of the first intermediary mold compound 44-1. The final thickness of the first mold compound 42-1 and the final thickness of the combination of the first thinned die 33-1 and the first intermediary mold compound 44-1 have a same value, between several micrometers and several tens of micrometers, or up to 100 micrometers, or up to 150 micrometers.

Figure 12:
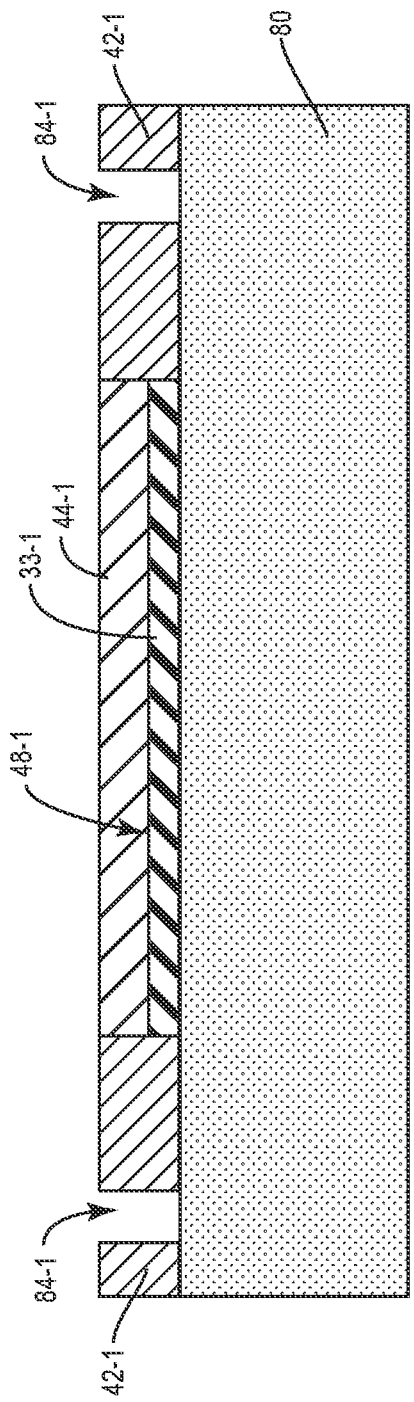
Figure 13:
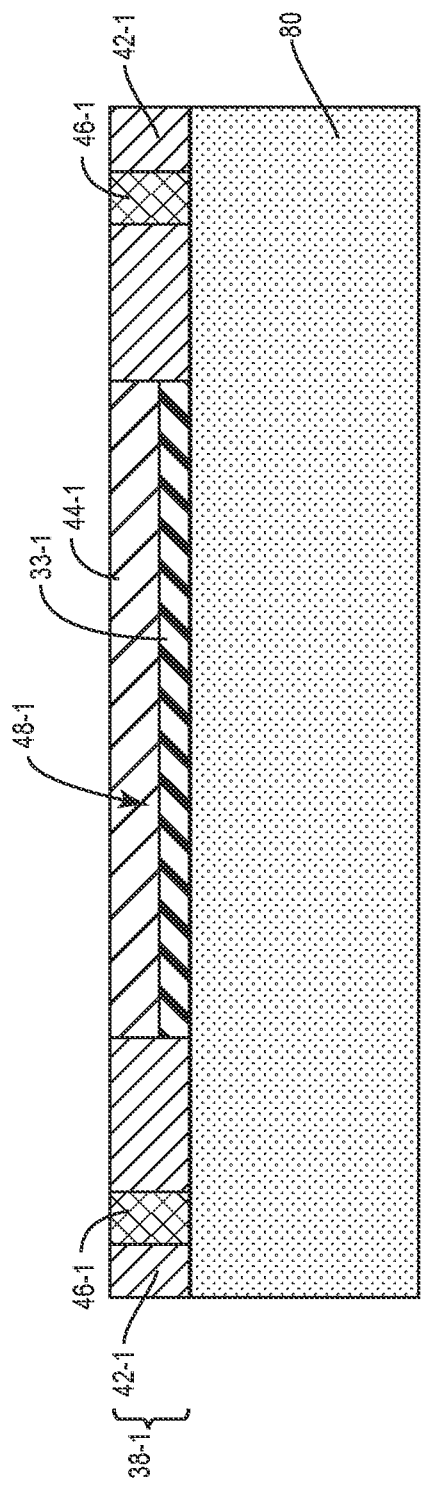

Next, first vertical via holes 84-1 are formed through the first mold compound 42-1, as illustrated in FIG. 12. The first vertical via holes 84-1 do not extend through or into the first thinned die 33-1 or the first intermediary mold compound 44-1. Each first vertical via hole 84-1 may have a shape of a cuboid, a polygon, a cylinder, or a cone and has a depth the same as the thickness of the first mold compound 42-1. The first vertical via holes 84-1 may be formed by a drilling process. The first vertical via structures 46-1 are then formed in the first vertical via holes 84-1 to complete the first die section 38-1, as illustrated in FIG. 13. The first vertical via structures 46-1 may be formed by filling the first vertical via holes 84-1 with one or more appropriate materials. The appropriate material is required to be electrically and/or thermally conductive, such as platinum, gold, silver, copper, aluminum, tungsten, titanium, electrically conductive epoxy, or other suitable materials. The top surface of the first mold compound 42-1, the top surface of the first intermediary mold compound 44-1, and a top surface of each first vertical via structure 46-1 are coplanar. The thickness of the first die section 38-1 is between several micrometers and several tens of micrometers. In some cases, the first die section 38-1 may have a larger thickness, for instance, or up to 100 micrometers or even up to 150 micrometers.

Figure 14:
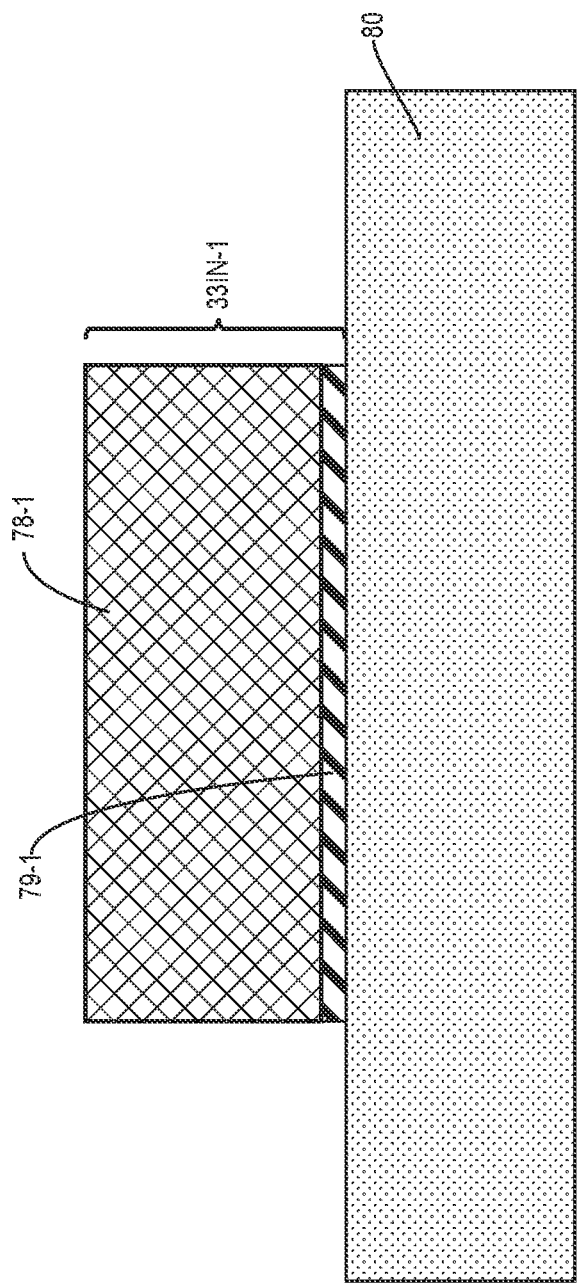
Figure 15:
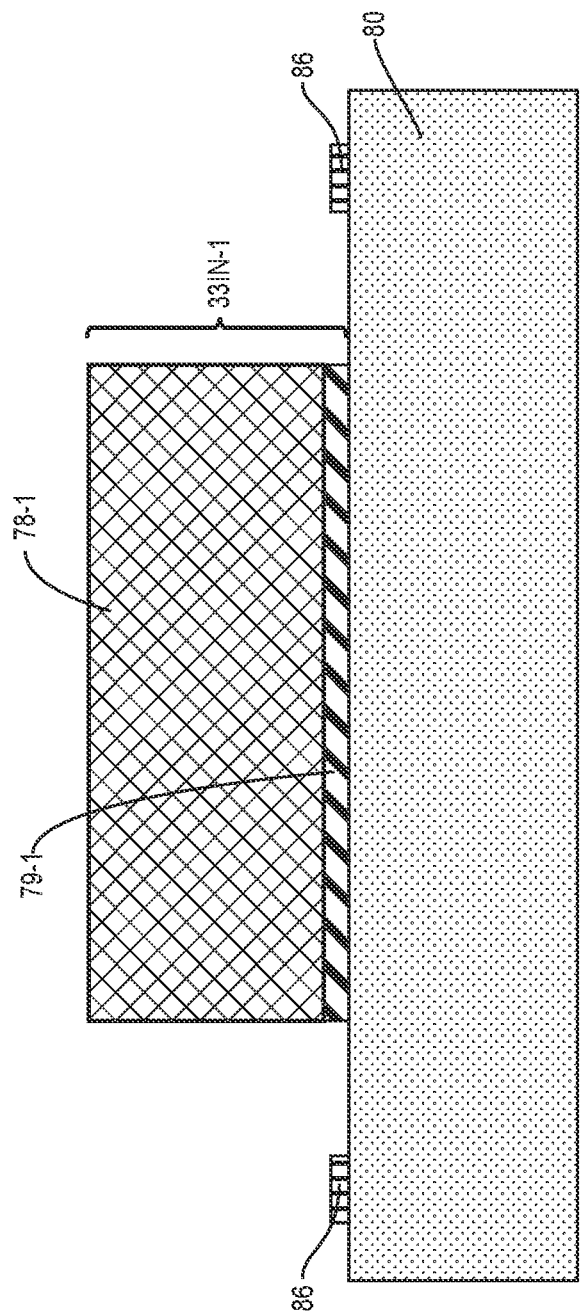

FIGS. 14-21 illustrate an alternative process to form the first die section 38-1 according to one embodiment of the present disclosure. Similarly, the first intact die 33IN-1, which includes the first die substrate 78-1 and the first device region 79-1 underneath the first die substrate 78-1, is firstly attached to the module carrier 80, as illustrated in FIG. 14. Seed layers 86 are then deposited over the module carrier 80 and around the first intact die 33IN-1, as illustrated in FIG. 15. For Electro-Chemical-Plating (ECP), the seed layers 86 need to have a low conformality. For example, a tantalum barrier layer can be used as the seed layer 86 for electroplating/electro-chemical-plating (EP or ECP) of copper in a forward pulsed mode. The conformal seed layers 86 provides a base for the first plated vertical via structures 46-1. The seed layers 86 may be formed by many types of processes, including metal organic chemical vapor deposition (MOCVD), Physical Vapor Deposition PVD and long throw sputtering (LTS).

Figure 16:
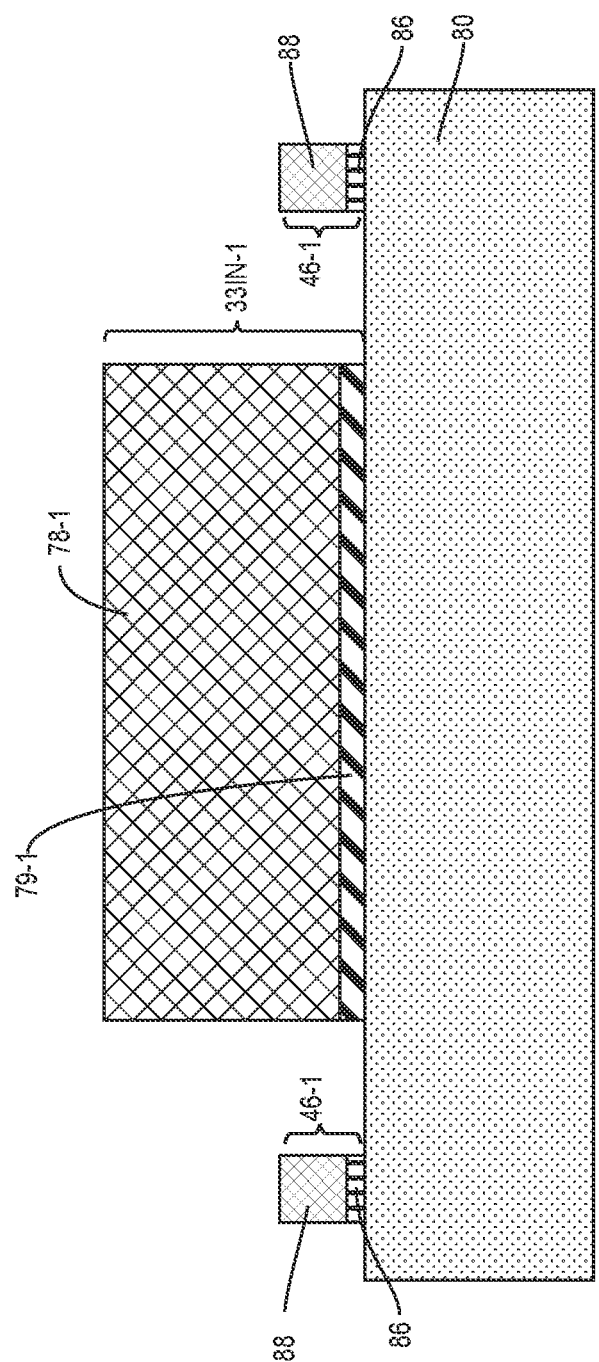

Next, one or more metal/alloy materials 88 (such as copper, aluminum silver, and gold) are plated over each seed layer 86 to form one first vertical via structure 46-1, as illustrated in FIG. 16. Notice that the height of each first vertical via structures 46-1 must be carefully selected as the final thickness of the first die section 38-1/the final thickness of the first mold compound 42-1, such that each first vertical via structures 46-1 can be exposed through the first mold compound 42-1 once the first die section 38-1 is completed. Each first vertical via structure 46-1 has a same height between several micrometers and several tens of micrometers, or up to 100 micrometers, or up to 150 micrometers. Each first vertical via structure 46-1 is always shorter than the first intact die 33IN-1, and is always taller than the first device region 79-1 of the first intact die 33IN-1.

Figure 17:
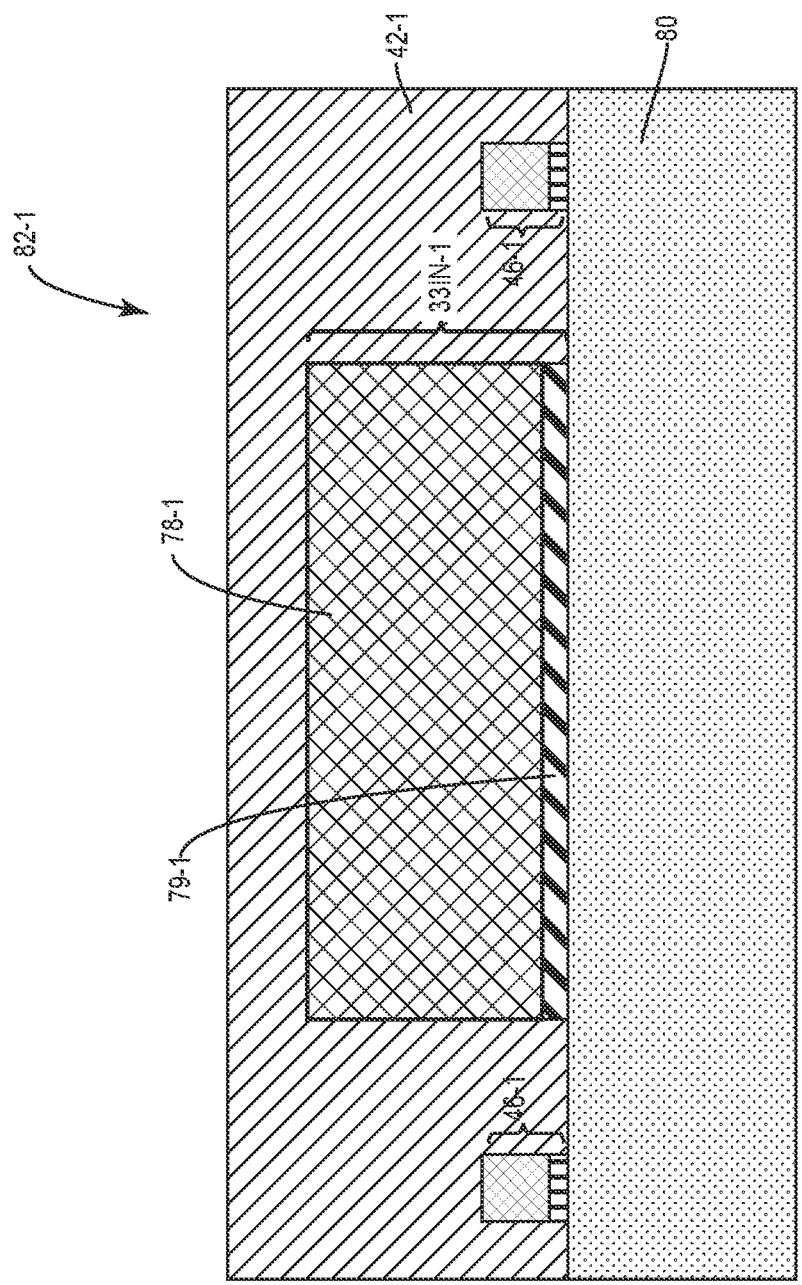

The first mold compound 42-1 is then applied over the module carrier 80 and fully encapsulate the first intact die 33IN-1 and fully encapsulates each first vertical via structure 46-1 to provide the first precursor 82-1, as illustrated in FIG. 17. The first mold compound 42-1 may be applied by various procedures, such as sheet molding, overmolding, compression molding, transfer molding, dam fill encapsulation, or screen print encapsulation. The first mold compound 42-1 may be formed of a standard molding material (e.g., an organic epoxy resin system or the like), which can be used as an etchant barrier to the first device region 79-1 of the first intact die 33IN-1 against etching chemistries such as TMAH, KOH, NaOH, and ACH. A curing process (not shown) is then used to harden the first mold compound 42-1. The curing temperature is between 100° C. and 320° C. depending on which material is used as the first mold compound 42-1.

Figure 18:
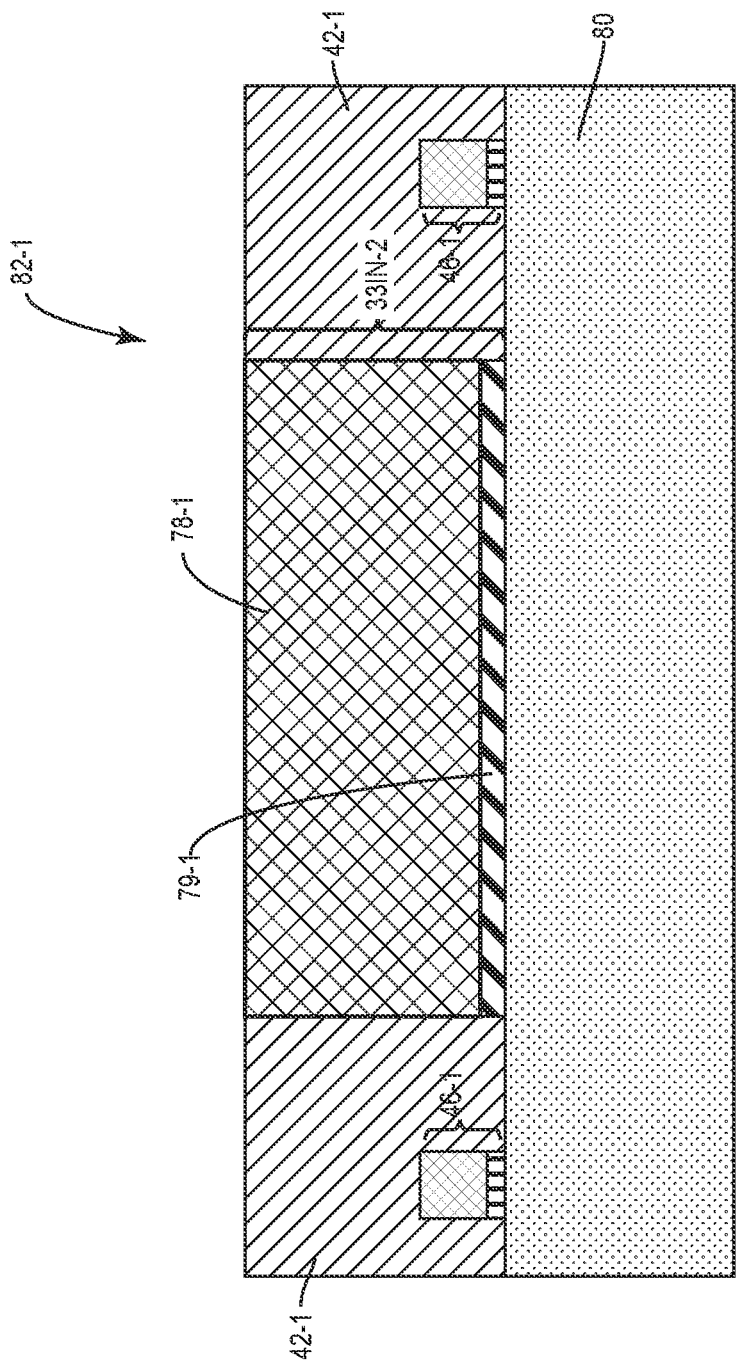
Figure 19:
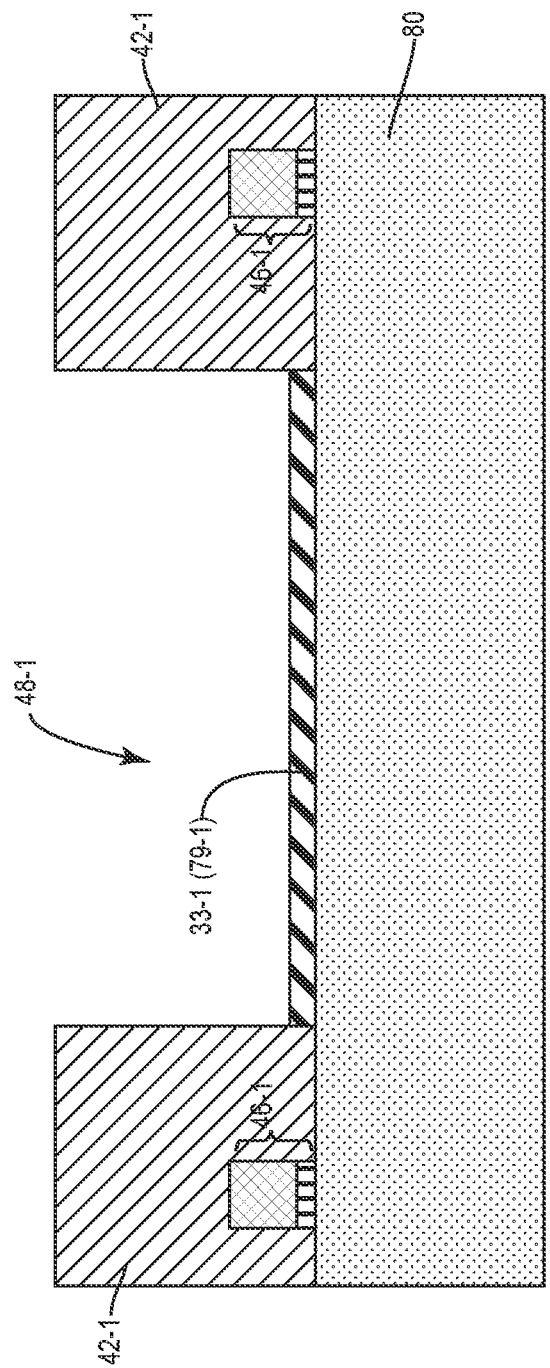

After the first mold compound 42-1 is applied, the first mold compound 42-1 is thinned down to expose the backside of the first die substrate 78-1 of the first intact die 33IN-1, as shown in FIG. 18. Since each first vertical via structure 46-1 is shorter than the first intact die 33IN-1, each first vertical via structure 46-1 is still fully encapsulated by the first mold compound 42-1. The thinning procedure may be done with a mechanical grinding process. Since each first vertical via structure 46-1 is shorter than the first intact die 33IN-1, each first vertical via structure 46-1 is still fully encapsulated by the first mold compound 42-1. The following step is to remove substantially the first die substrate 78-1 of the first intact die 33IN-1 to provide the first thinned die 33-1 that includes the first device region 79-1 and define the first opening 48-1 over the first thinned die 33-1, as illustrated in FIG. 19. Herein, removing substantially the first die substrate 78-1 refers to removing at least 95% of the entire first die substrate 78-1, and leaving at most 2 micrometers die substrate or perhaps further removing a portion of the insulating layer 56. In desired cases, the first die substrate 78-1 is fully removed, such that the first thinned die 33-1 is the first device region 79-1, where the top surface of the insulating layer 56 is the top surface of the first thinned die 33-1 and is exposed at the bottom of the first opening 48-1 (see FIGS. 6B and 6C). Removing substantially the first die substrate 78-1 may be provided by an etching process with a wet/dry etchant chemistry, which may be TMAH, KOH, NaOH, ACH, or the like. During the etching process, the insulating layer 56 functions as an etching stop layer, which has a much slower rate of being etched than the first die substrate 78-1 (i.e. silicon substrate) by using the wet/dry etchant chemistries. The first mold compound 42-1 may be used as an etchant barrier to protect at least sides of the first device region 79-1 against the etchant chemistries. Thus, the first opening 48-1, where the first die substrate 78-1 was removed, is defined within the first mold compound 42-1, and the vertical walls of the first opening 48-1 are inner sides of the first mold compound 42-1 that are aligned with the edges of the first thinned die 33-1.

Figure 20:
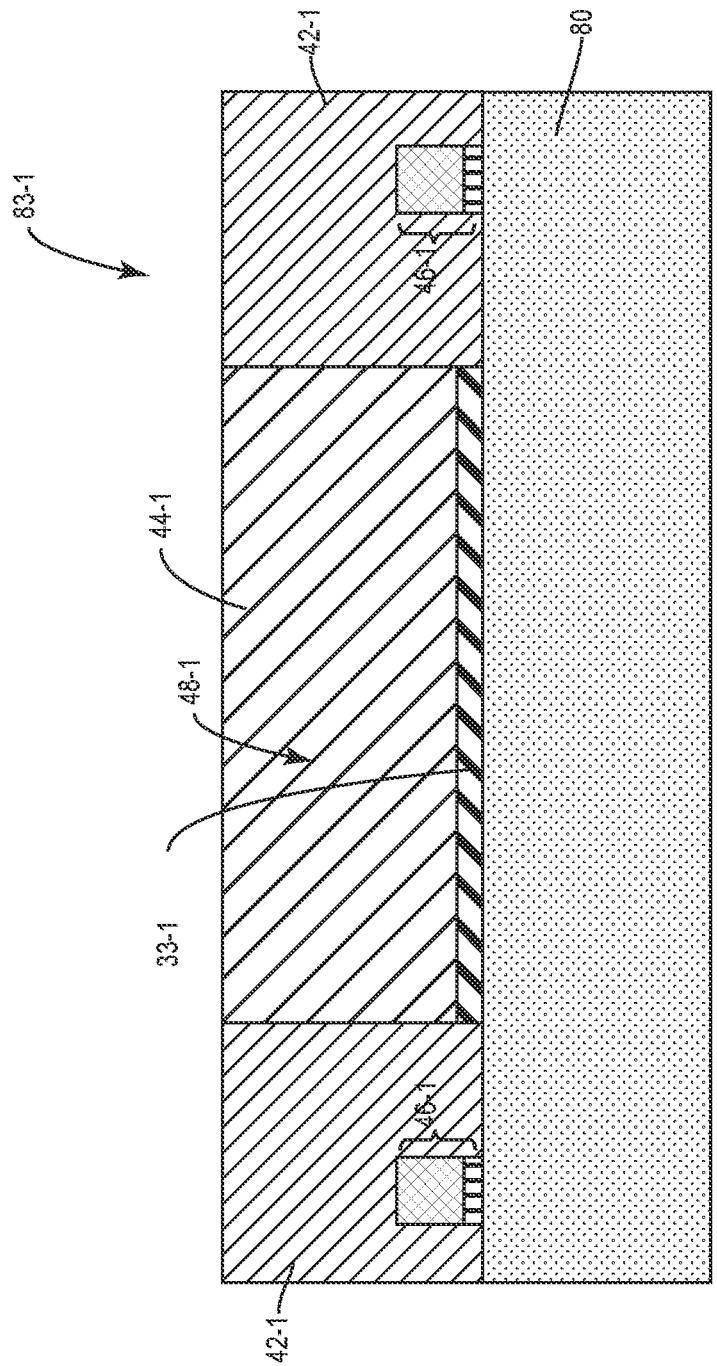

Next, the first intermediary mold compound 44-1 is applied over the first thinned die 33-1 to provide the first molding precursor 83-1 as illustrated in FIG. 20. The first intermediary mold compound 44-1 substantially fills the first opening 48-1. The first intermediary mold compound 44-1 may be applied by various procedures, such as sheet molding, overmolding, compression molding, transfer molding, dam fill encapsulation, and screen print encapsulation. The first intermediary mold compound 44-1 directly resides over the top surface of the first thinned die 33-1. If there is no first die substrate 78-1 left in the first thinned die 33-1, the first intermediary mold compound 44-1 directly resides over the insulating layer 56. A curing process (not shown) is followed to harden the first intermediary mold compound 44-1. The curing temperature is between 100° C. and 320° C. depending on which material is used as the first intermediary mold compound 44-1.

Figure 21:
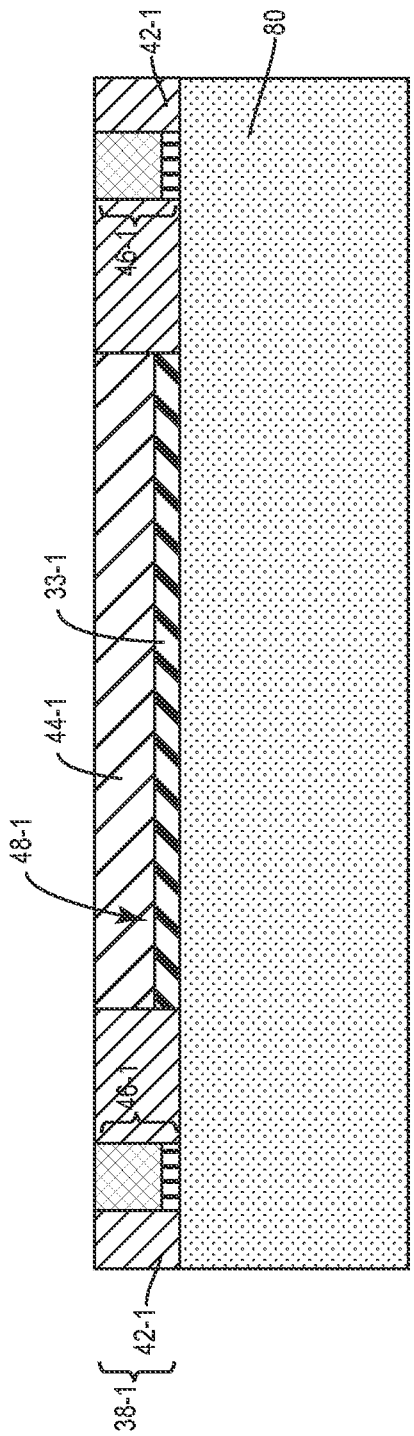

A polishing step is then applied to the first molding precursor 83-1 to provide the first die section 38-1. As illustrated in FIG. 21, the thickness of the first intermediary mold compound 44-1 and the thickness of the first mold compound 42-1 are reduced until each first vertical via structure 46-1 is exposed through the first mold compound 42-1. The polishing step may be implemented by a mechanical grinding process. After the polishing step, the top surface of the first mold compound 42-1, the top surface of the first intermediary mold compound 44-1, and a top surface of each first vertical via structure 46-1 are coplanar.

Figure 22:
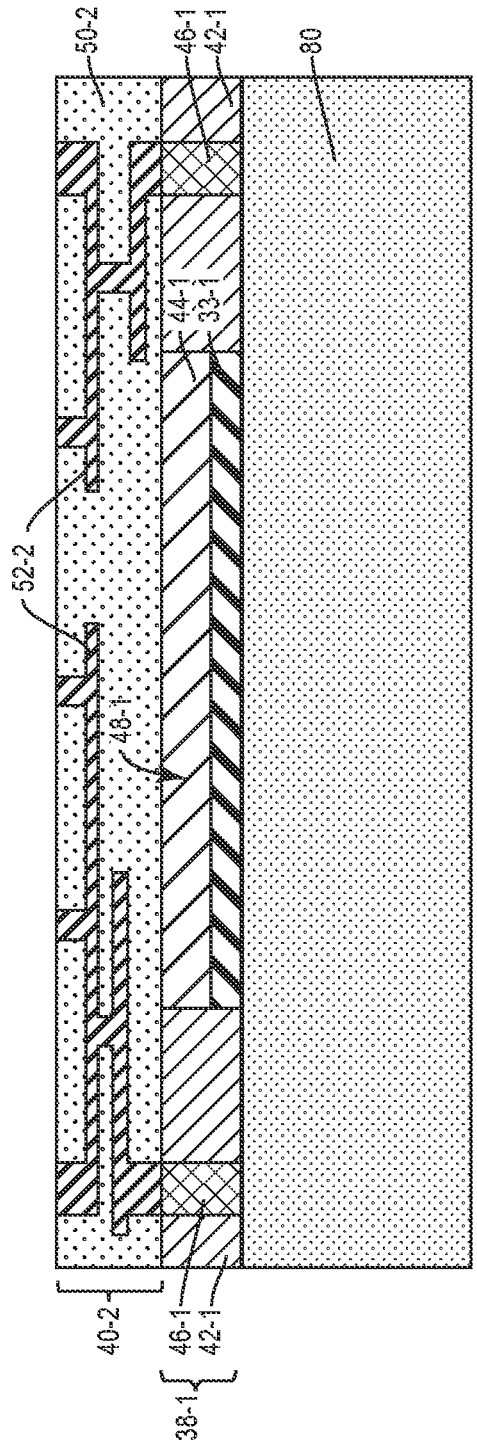

After the first die section 38-1 is formed, the second redistribution structure 40-2 is formed over the first die section 38-1, as illustrated in FIG. 22. The second redistribution structure 40-2 includes the second dielectric pattern and the second redistribution interconnections 52-2 within the second dielectric pattern 50-2. Herein, some portions of the second redistribution interconnections 52-2 are exposed through the second dielectric pattern 50-2 at the bottom of the second redistribution structure 40-2, and are connected to the first vertical via structures 46-1 in the first die section 38-1. In addition, some other portions of the second redistribution interconnections 52-2 are exposed through the second dielectric pattern 50-2 at the top of the second redistribution structure 40-2.

Figure 23:
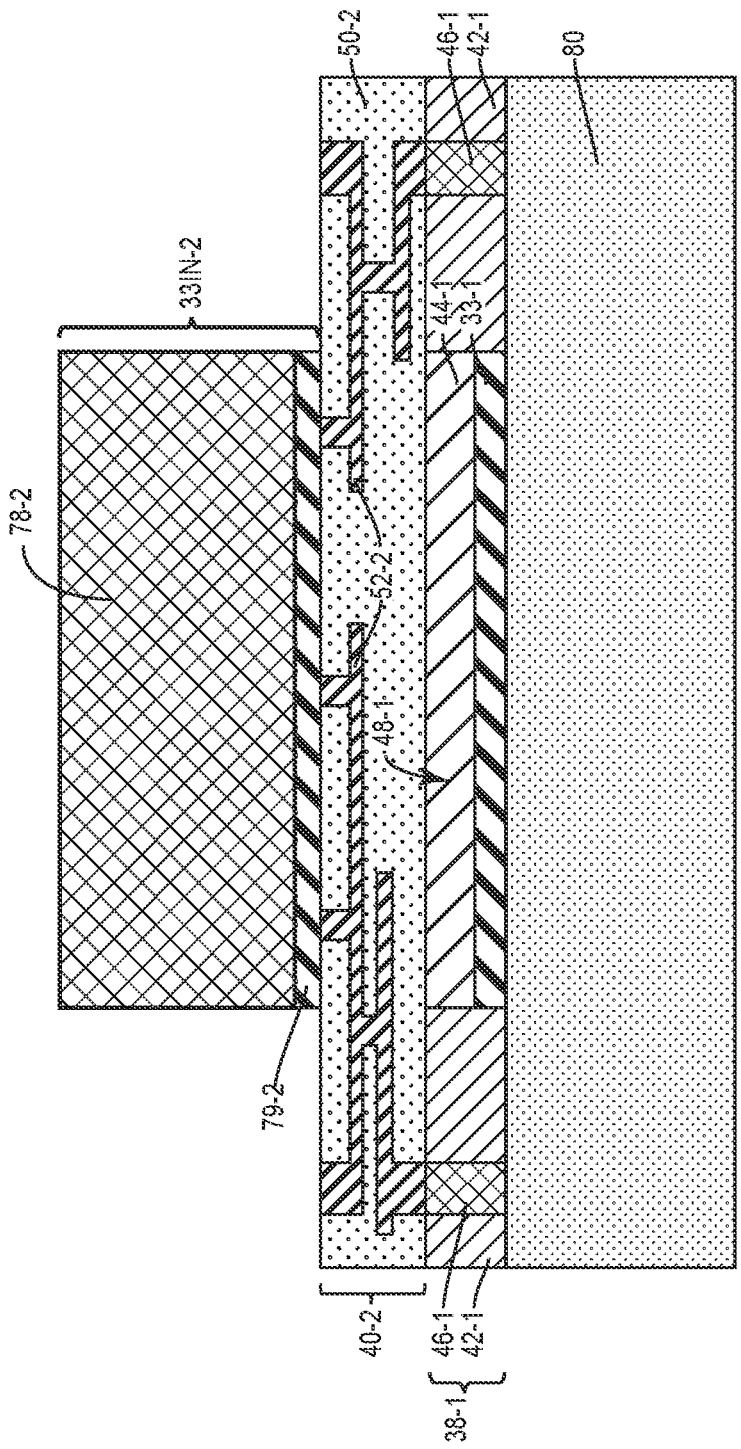

A second intact die 33IN-2, which includes a second die substrate 78-2 and a second device region 79-2, is attached to the second redistribution structure 40-2, as illustrated in FIG. 23. The second device region 79-2 is underneath the second die substrate 78-2 and resides over the second redistribution structure 40-2. As such, the second device region 79-2 is connected to some of the exposed portions of the second redistribution interconnections 52-2 at the top of the second redistribution structure 40-2, and a backside of the second die substrate 78-2 is a top surface of the second intact die 33IN-2. Similar to the first intact die 33IN-1, the second die substrate 78-2 in the second intact die 33IN-2 may be formed of low cost silicon materials with a thickness between 150 micrometers and 700 micrometers, while the second device region 79-2 in the second intact die 33IN-2 is configured to provide active and/or passive devices with a thickness between several micrometers to several tens of micrometers. The second device region 79-2 may have a similar structure as the first device region 79-1 as shown in FIG. 6B (e.g., including the insulating layer 56, the active layer 58 underneath the insulating layer 56, and the BEOL portion 60, which has the dielectric layers 62 and the metal structures 64 within the dielectric layers 62, underneath the active layer 58) or FIG. 6C (e.g., including the insulating layer 56, and the BEOL portion 60, which has the dielectric layers 62 and the metal structures 64 within the dielectric layers 62, underneath the insulating layer 56). It will be clear to those skilled in the art that modifications to these thicknesses may also be considered within the scope of the concepts disclosed herein.

Figure 24:
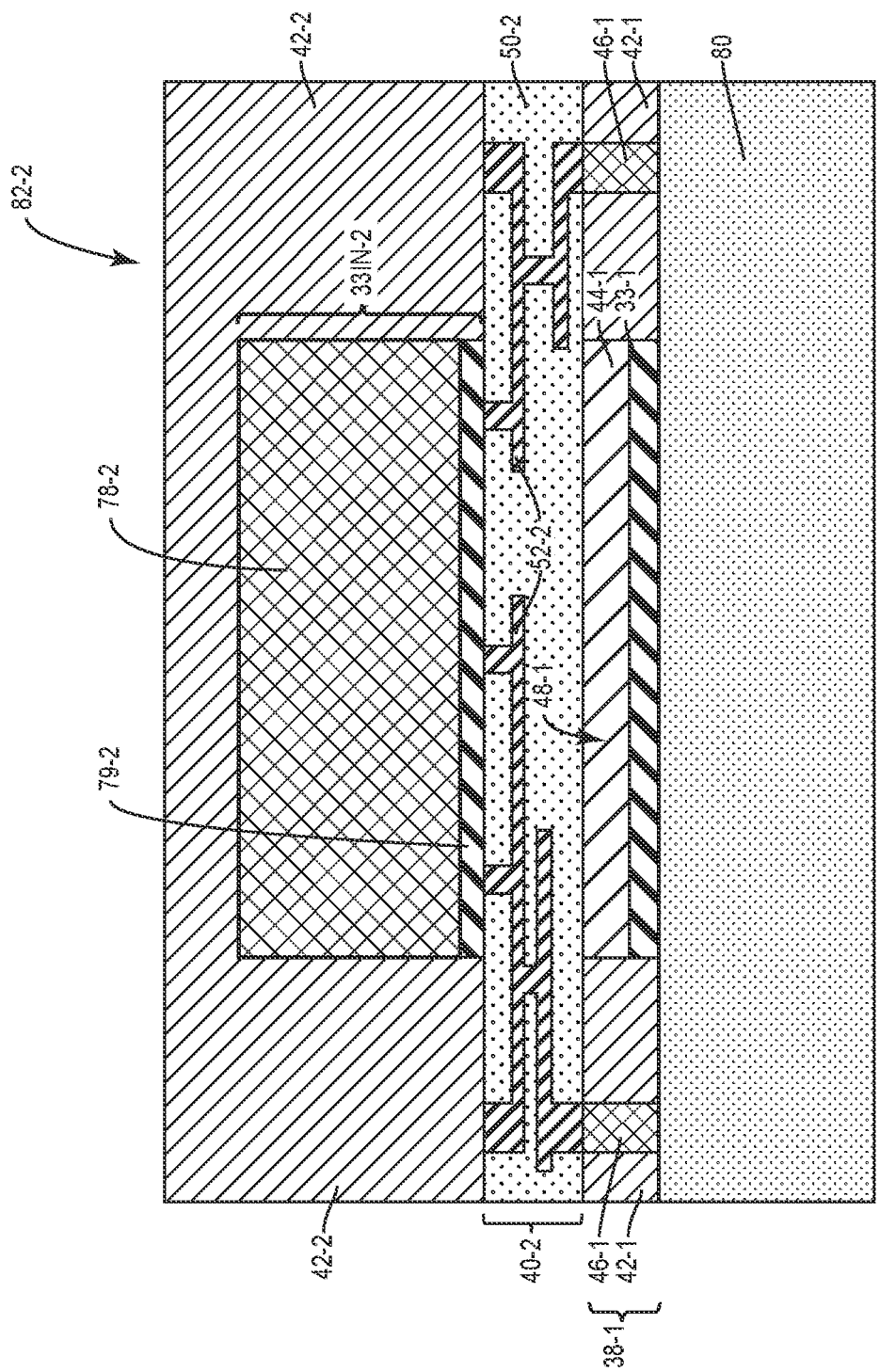

Next, the second mold compound 42-2 is applied over a top surface of the second redistribution structure 40-2 and fully encapsulates the second intact die 33IN-2 to provide a second precursor 82-2, as illustrated in FIG. 24. The second mold compound 42-2 may be applied by various procedures, such as sheet molding, overmolding, compression molding, transfer molding, dam fill encapsulation, or screen print encapsulation. The second mold compound 42-2 may be formed of a standard molding material (e.g., an organic epoxy resin system or the like), which can be used as an etchant barrier to the second device region 79-2 of the second intact die 33IN-2 against etching chemistries such as TMAH, KOH, NaOH, and ACH. A curing process (not shown) is then used to harden the second mold compound 42-2. The curing temperature is between 100° C. and 320° C. depending on which material is used as the second mold compound 42-2.

Figure 25:
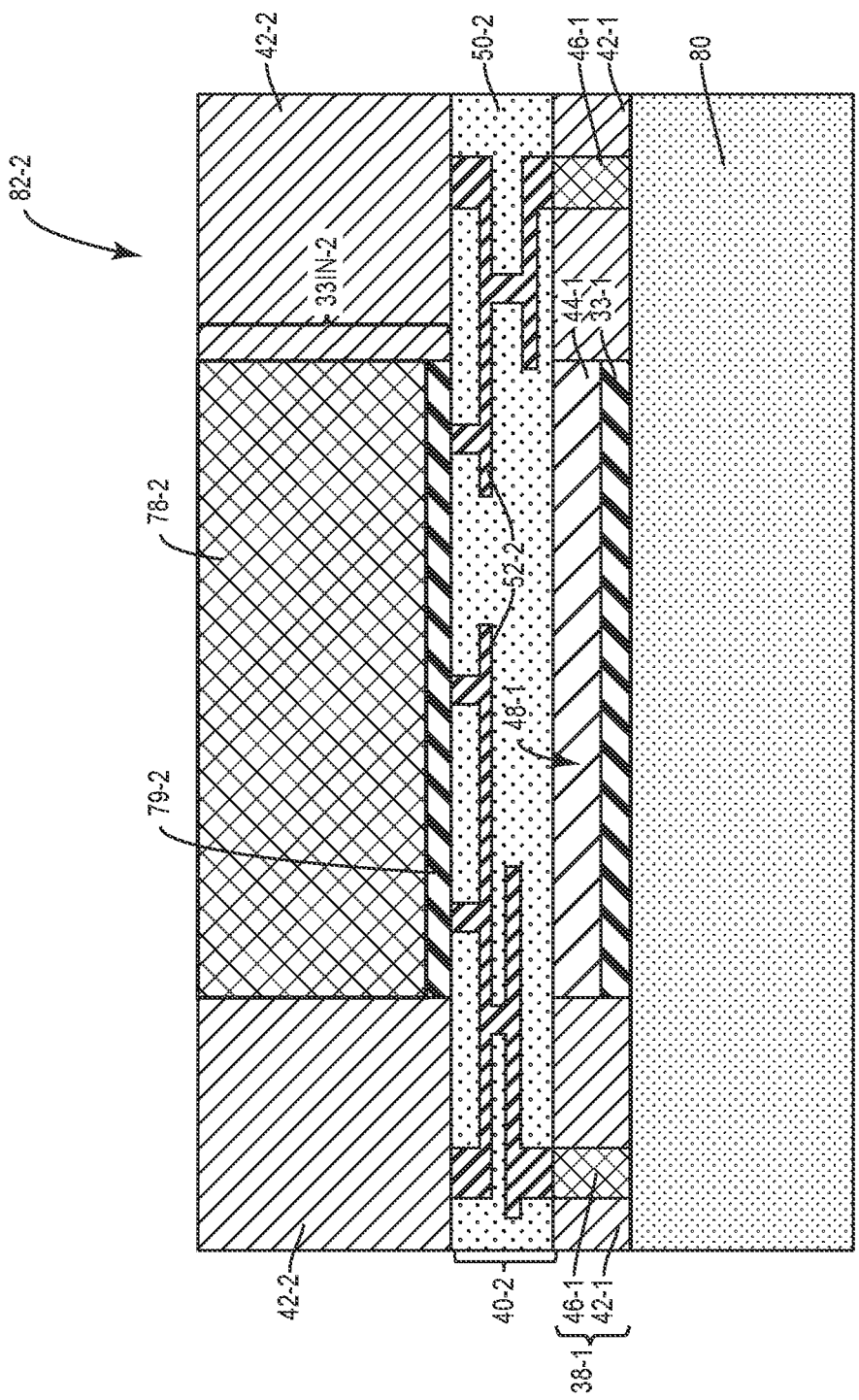
Figure 26:
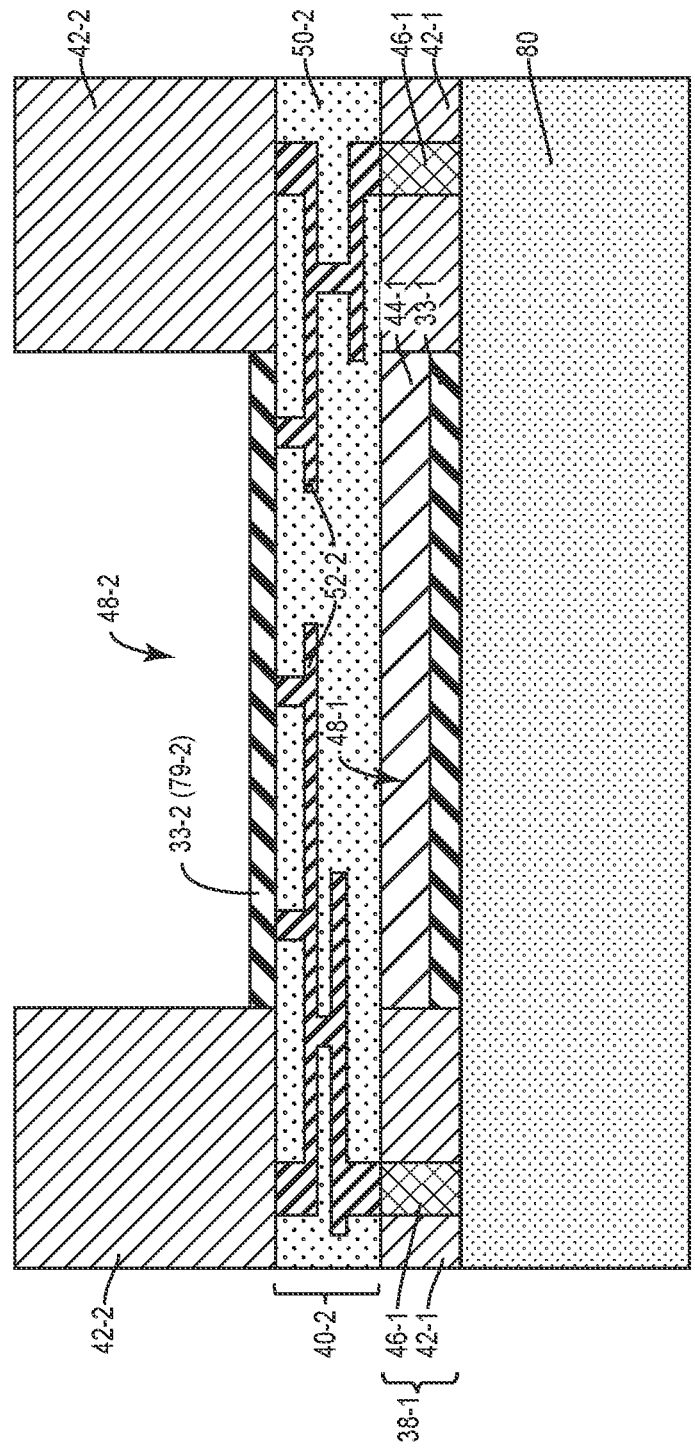

The second mold compound 42-2 is then thinned down to expose the backside of the second die substrate 78-2 of the second intact die 33IN-2, as shown in FIG. 25. The thinning procedure may be done with a mechanical grinding process. The following step is to remove substantially the second die substrate 78-2 of the second intact die 33IN-2 to provide the second thinned die 33-2 that includes the second device region 79-2 and define the second opening 48-2 over the second thinned die 33-2, as illustrated in FIG. 26. Herein, removing substantially the second die substrate 78-2 refers to removing at least 95% of the entire second die substrate 78-2, and leaving at most 2 micrometers die substrate or perhaps further removing a portion of the insulating layer 56 (see FIGS. 6B and 6C). In desired cases, the second die substrate 78-2 is fully removed, such that the second thinned die 33-2 is the second device region 79-2, where the top surface of the insulating layer 56 is the top surface of the second thinned die 33-2 and is exposed at the bottom of the second opening 48-2. Removing substantially the second die substrate 78-2 may be provided by an etching process with a wet/dry etchant chemistry, which may be TMAH, KOH, NaOH, ACH, or the like. During the etching process, the insulating layer 56 is functioned as an etching stop layer, which has a much slower rate of being etched than the second die substrate 78-2 (i.e., silicon substrate) by using the wet/dry etchant chemistries. The second mold compound 42-2 may be used as an etchant barrier to protect at least sides of the second device region 79-2 against the etchant chemistries. Thus, the second opening 48-2, where the second die substrate 78-2 was removed, is defined within the second mold compound 42-2, and the vertical walls of the second opening 48-2 are inner sides of the second mold compound 42-2 that are aligned with the edges of the second thinned die 33-2.

Figure 27:
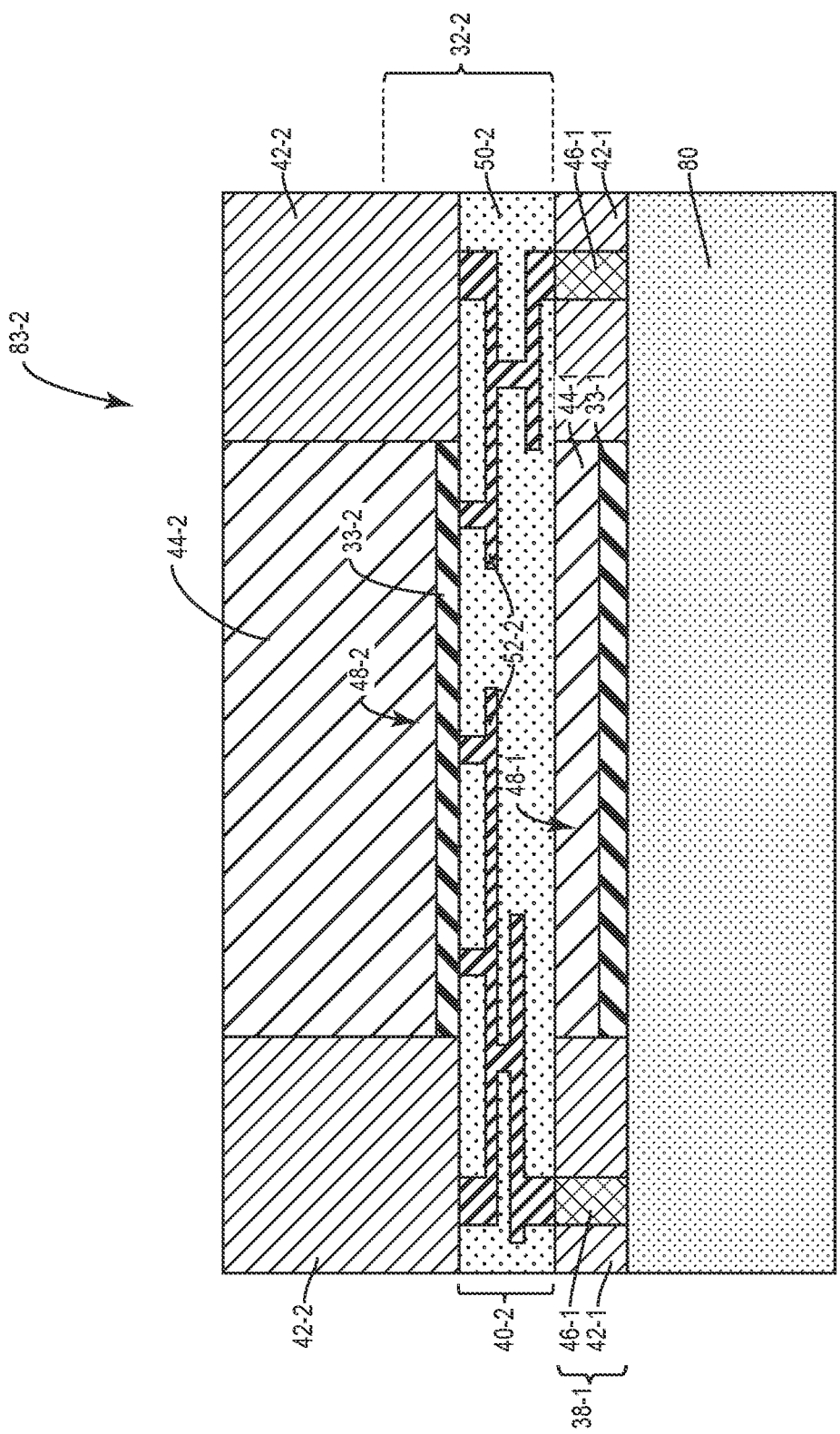

The second intermediary mold compound 44-2 is applied over the second thinned die 33-2 to provide a second molding precursor 83-2, as illustrated in FIG. 27. The second intermediary mold compound 44-2 substantially fills the second opening 48-2. The second intermediary mold compound 44-2 may be applied by various procedures, such as sheet molding, overmolding, compression molding, transfer molding, dam fill encapsulation, and screen print encapsulation. The second intermediary mold compound 44-2 directly resides over the top surface of the second thinned die 33-2. If there is no second die substrate 78-2 left in the second thinned die 33-2, the second intermediary mold compound 44-2 directly resides over the insulating layer 56. Due to a different type of the second thinned die 33-2, the second intermediary mold compound 44-2 might be formed of a different material with different characteristics. The second intermediary mold compound 44-2 may be formed of a same material as the second mold compound 42-2 (e.g., a standard molding material), formed of a high electric permittivity molding material (e.g., the electric permittivity >10, such as a molding material containing alumina and/or barium titanate), a high thermal conductivity molding material (e.g., the thermal conductivity >50 W/mK, such as a molding material having graphene added or a molding material having graphene and alumina filler added), or a high magnetic permeability material (e.g., the magnetic permeability >50, such as a molding material with added powder containing iron, nickel, cobalt or a molding material with added powder containing ferri/ferro-magnetic materials, like magnetite, Ytrium-Iron-G, etc.). Notice that the second thinned die 33-2 and the first thinned die 33-1 may be a same type or different types, and the second intermediary mold compound 44-2 and the first intermediary mold compound 44-1 may be formed of a same material or different materials. A curing process (not shown) is followed to harden the second intermediary mold compound 44-2. The curing temperature is between 100° C. and 320° C. depending on which material is used as the second intermediary mold compound 44-2.

Figure 28:
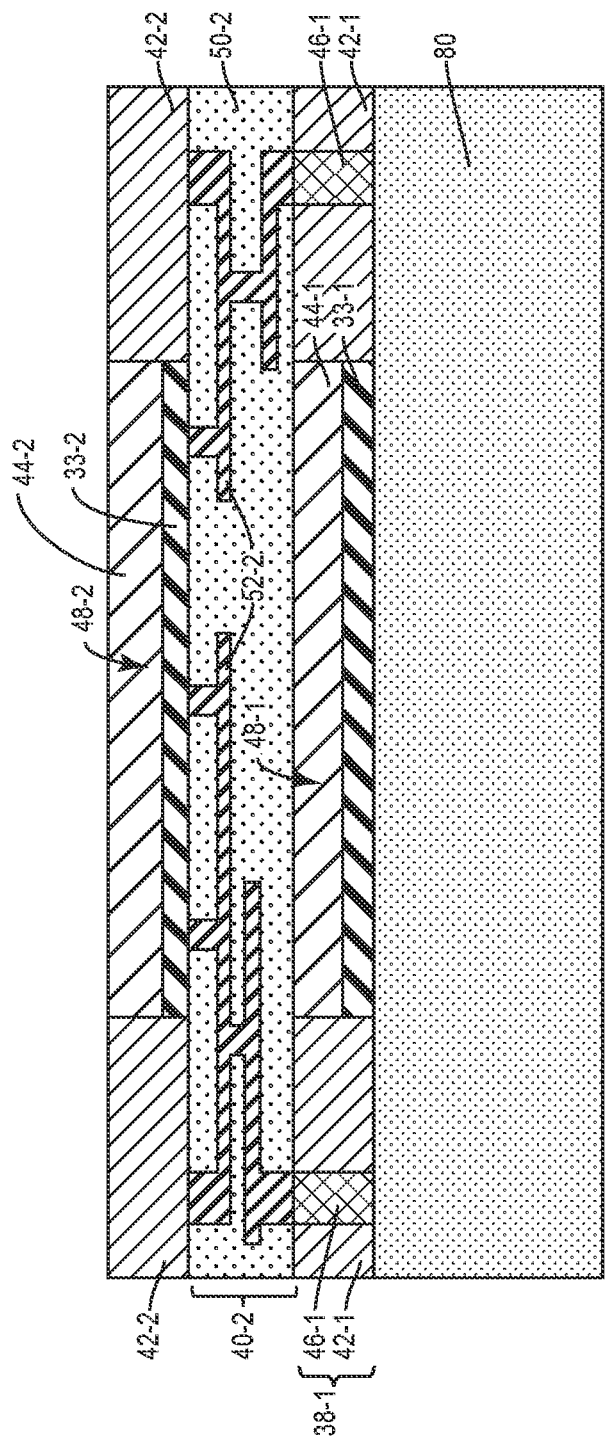

A polishing step is followed to determine a final thickness of the second mold compound 42-2 and a final thickness of the combination of the second thinned die 33-2 and the second intermediary mold compound 44-2 (i.e., a final thickness of the second die section 38-2). As illustrated in FIG. 28, the thickness of the second mold compound 42-2 and the thickness of the second intermediary mold compound 44-2 are reduced and the second opening 48-2 becomes shallower. The polishing step may be implemented by a mechanical grinding process. After the polishing step, the top surface of the second mold compound 42-2 is coplanar with the top surface of the second intermediary mold compound 44-2. The final thickness of the second mold compound 42-2 and the final thickness of the combination of the second thinned die 33-2 and the second intermediary mold compound 44-2 have a same value, between several micrometers and several tens of micrometers, or up to 100 micrometers, or up to 150 micrometers.

Figure 29:
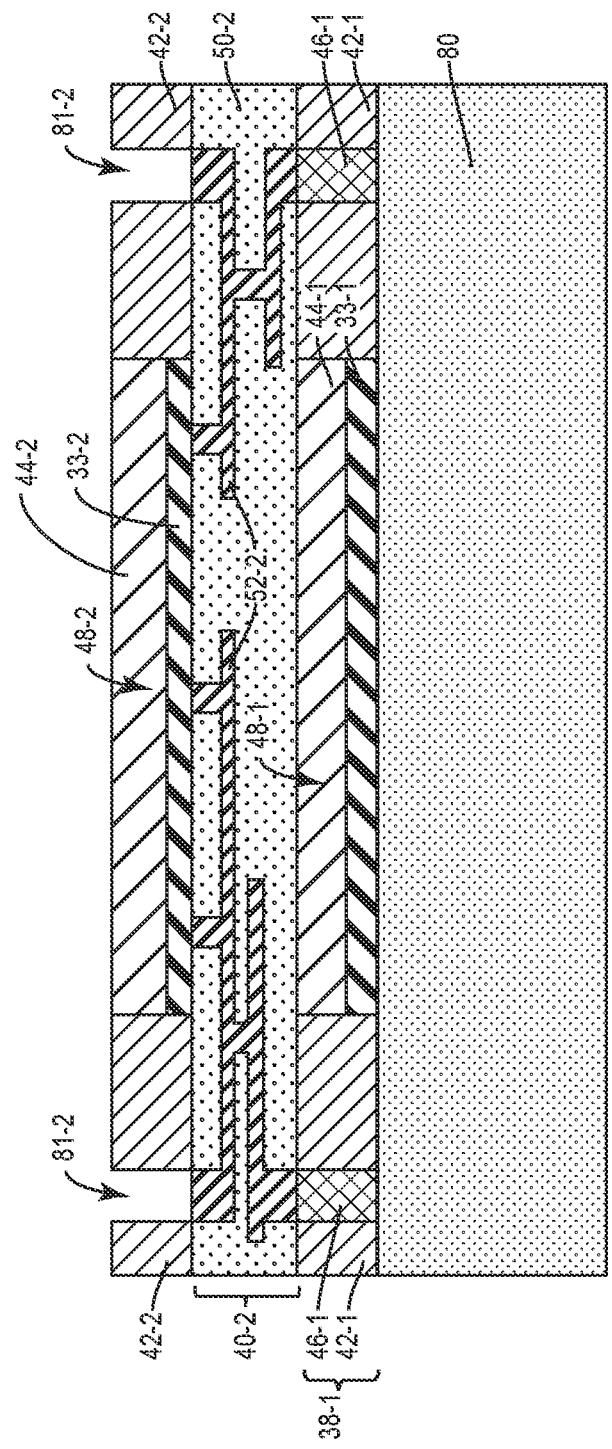
Figure 30:
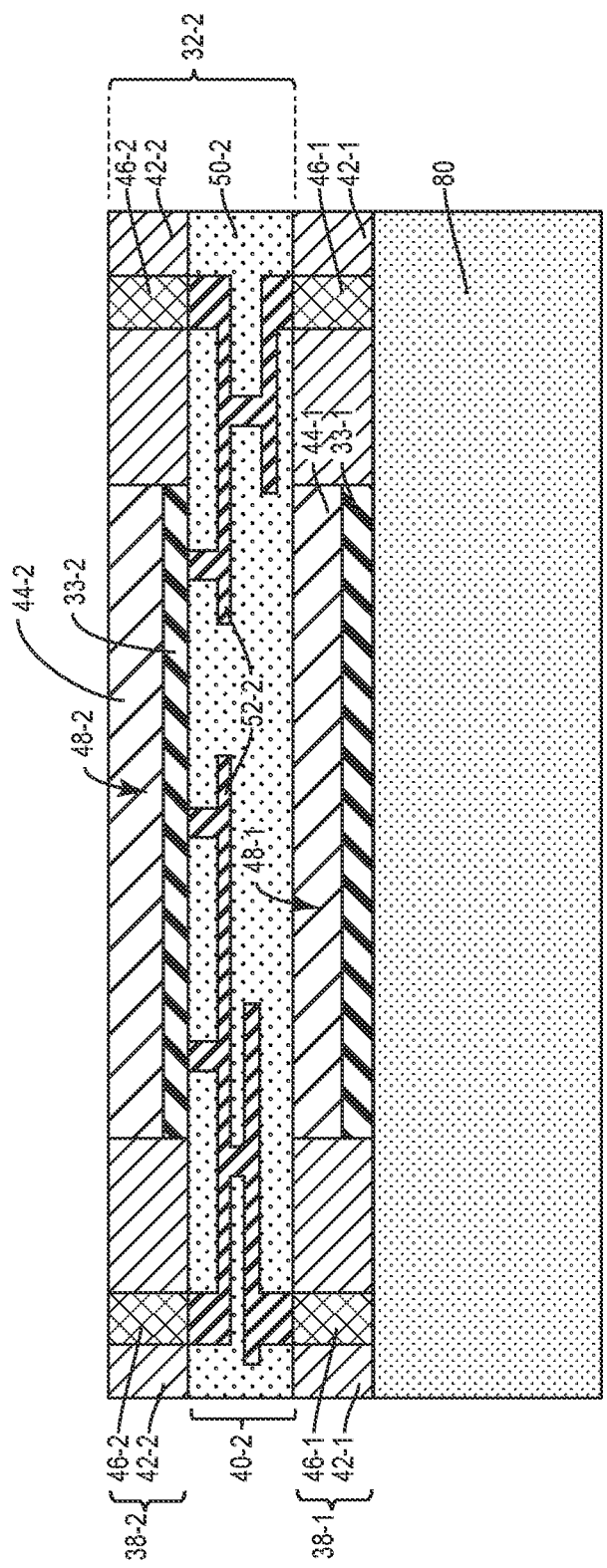

Next, second vertical via holes 84-2 are formed through the second mold compound 42-1 to reveal some portions of the second redistribution interconnections 52-2 exposed at the top of the second redistribution structure as illustrated in FIG. 29. The second vertical via holes 84-2 do not extend through or into the second thinned die 33-2 or the second intermediary mold compound 44-2. Each second vertical via hole 84-2 may have a shape of a cuboid, a polygon, a cylinder, or a cone and has a depth the same as the thickness of the second mold compound 42-2. The second vertical via holes 84-2 may be formed by a drilling process. The second vertical via structures 46-2 are then formed in the second vertical via holes 84-2 to complete the second die section 38-2 as well as the second package level 32-2 (including the second die section 38-1 and the second redistribution structure 40-2), as illustrated in FIG. 30. The second vertical via structures 46-2 may be formed by filling the second vertical via holes 84-2 with one or more appropriate materials. The appropriate material is required to be electrically and/or thermally conductive, such as platinum, gold, silver, copper, aluminum, tungsten, titanium, electrically conductive epoxy, or other suitable materials. The top surface of the second mold compound 42-2, the top surface of the second intermediary mold compound 44-2, and a top surface of each second vertical via structure 46-2 are coplanar.

In some applications, the second die section 38-2 may be formed in a similar process as shown in FIGS. 14-21. The only differences are that the second intact die 33IN-2 is not attached to the module carrier 80 but the top surface of the second redistribution structure 40-2; the seed layers 86 is not deposited on the module carrier 80 but deposited on some portions of the second redistribution interconnections 52-2 exposed at the top of the second redistribution structure 40-2; and the second mold compound 42-2 is not applied over the module carrier 80 but applied over the top surface of the second redistribution structure 40-2 (not shown).

Figure 31:
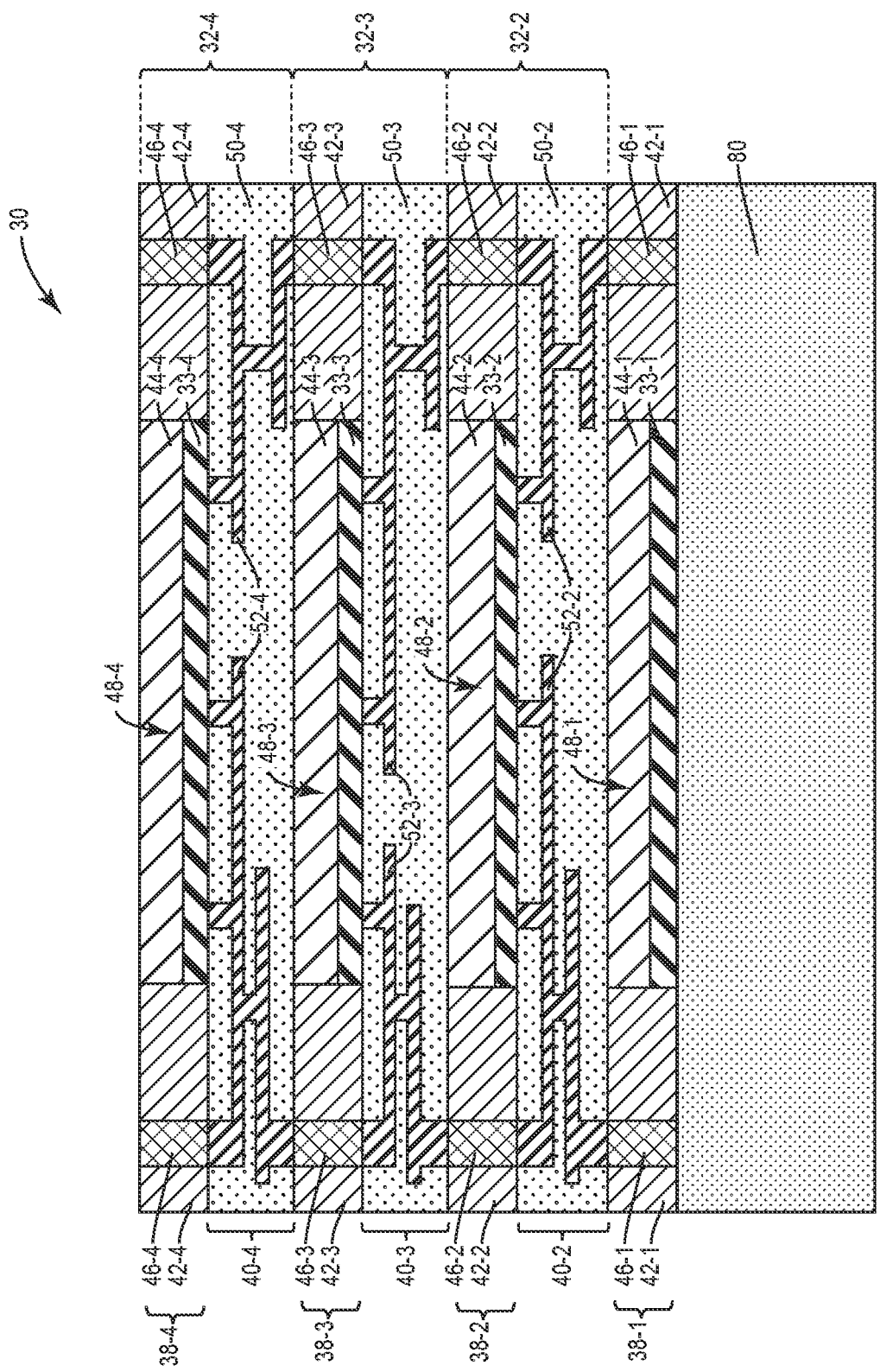

The third and fourth package levels 32-3 and 32-4 are formed using the same processing steps as the second package level 32-2 (e.g. as illustrated in FIGS. 22-30). The third package level 32-3 is formed over the second package level 32-2, and the fourth package level 32-4 is formed over the third package level 32-3, as illustrated in FIG. 31. As such, the first, second, third, and fourth thinned dies 33-1-33-4 are vertically stacked.

Notice that, in different application, there might be more package levels 32 included in the multi-level 3D package 30. Of course, the larger thickness of each package level, the less numbers of package levels can be vertically stacked. In addition, in different applications, there might be multiple thinned dies 33 included in one or more package levels 32. Each thinned die 33 included in any package level 32 may be formed from one intact die 33IN with the silicon substrate 78, which can be substantially removed. Components without silicon substrate, such as GaAs dies, CMOS dies, and/or SMDs, cannot be intact dies because their height cannot be reduced. Furthermore, these components without silicon substrate, which typically has a height between 100 micrometers and several hundreds of micrometers may not be included in any package level 32. In addition, each redistribution structure 40 is formed at a wafer level, and each polishing step to reduce the thickness of the mold compound 42 and the thickness of the intermediary mold compound 44 is performed at a wafer level.

Figure 32:
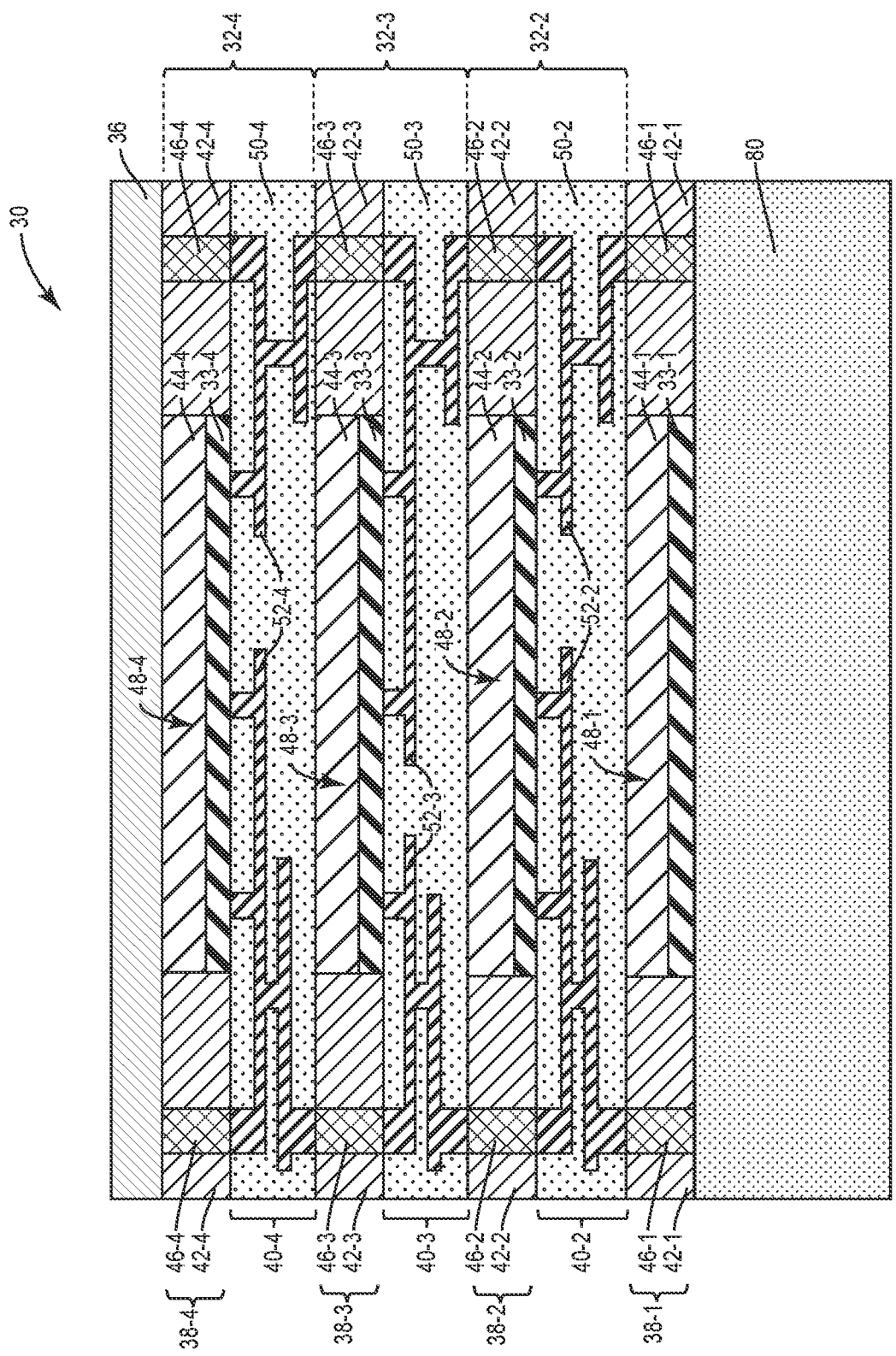
Figure 33:
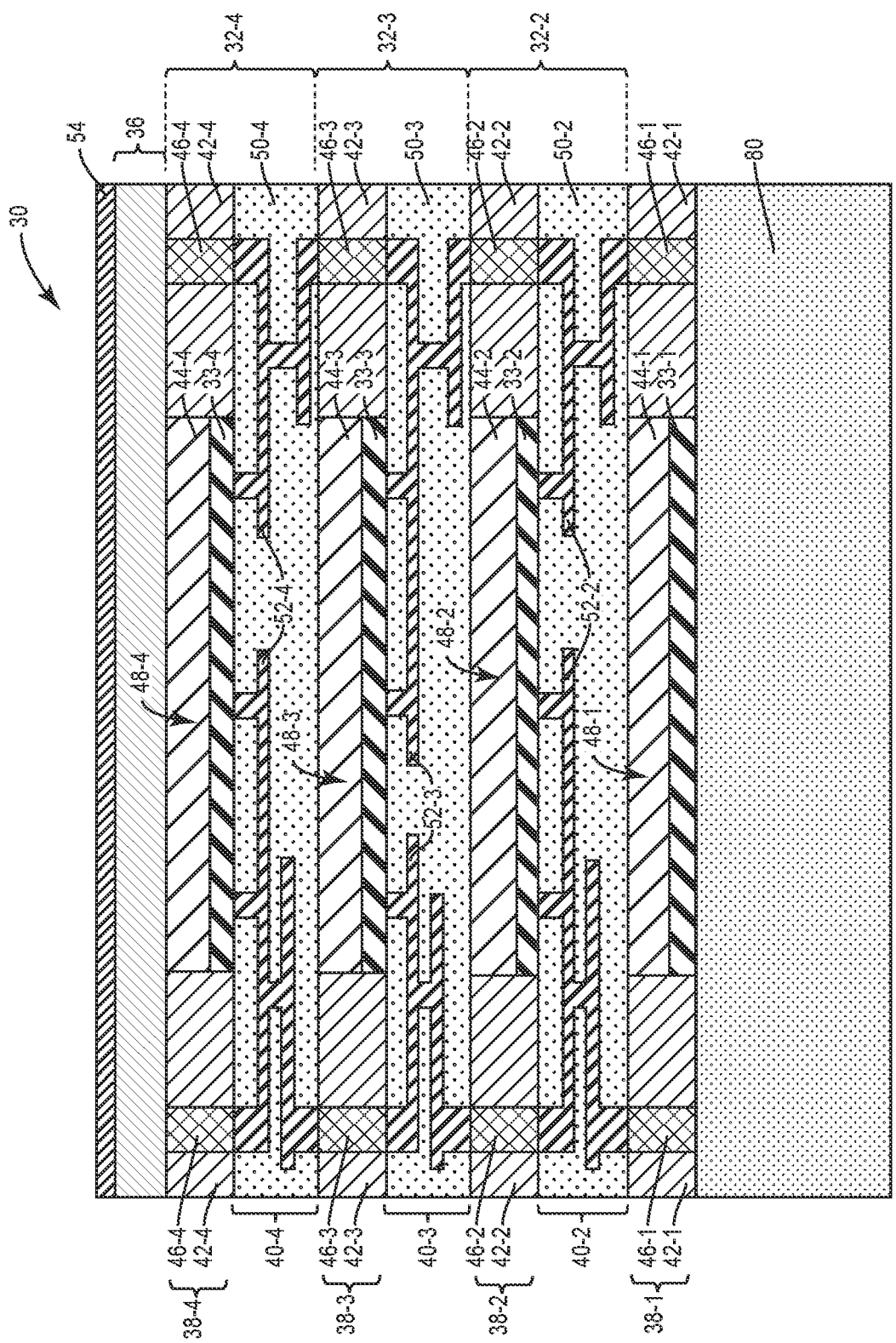

In one embodiment, the top protection structure 36 is then formed over the fourth die section 38-4 of the fourth package level 32-4 (i.e., over the fourth mold compound 42-4 and the fourth intermediary mold compound 44-4) and coupled to the fourth vertical via structures 46-4, as illustrated in FIG. 32. The top protection structure 36 may be formed of molding materials and optionally one or more glass-type materials for final sealing at the top of the top protection structure 36. The top protection structure 36 is configured to provide chemical and gas/air contamination protection. The top protection structure 36 may have a thickness between several tens of micrometers and about 200 micrometers. In addition, the metal shield 54 may be applied over the top protection structure 36, as illustrated in FIG. 33. The metal shield 54 may be formed of copper, aluminum or other metals or alloys by a plating, sputtering or spraying process. The metal shield 54 is configured to provide electro-magnetic shielding. The metal shield 54 may have a thickness between fractions of a micrometers and few micrometers.

Figure 34:
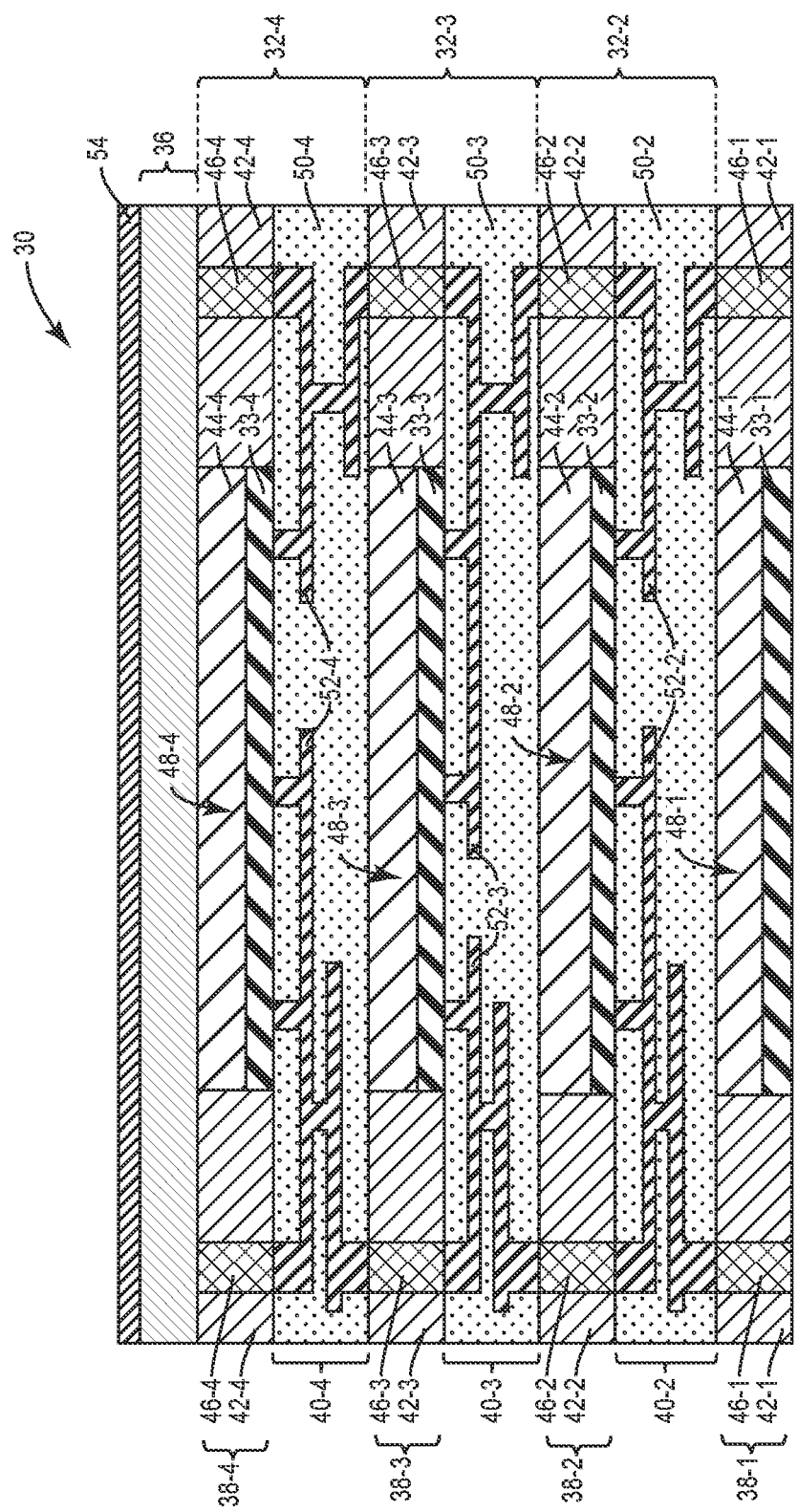
Figure 35:
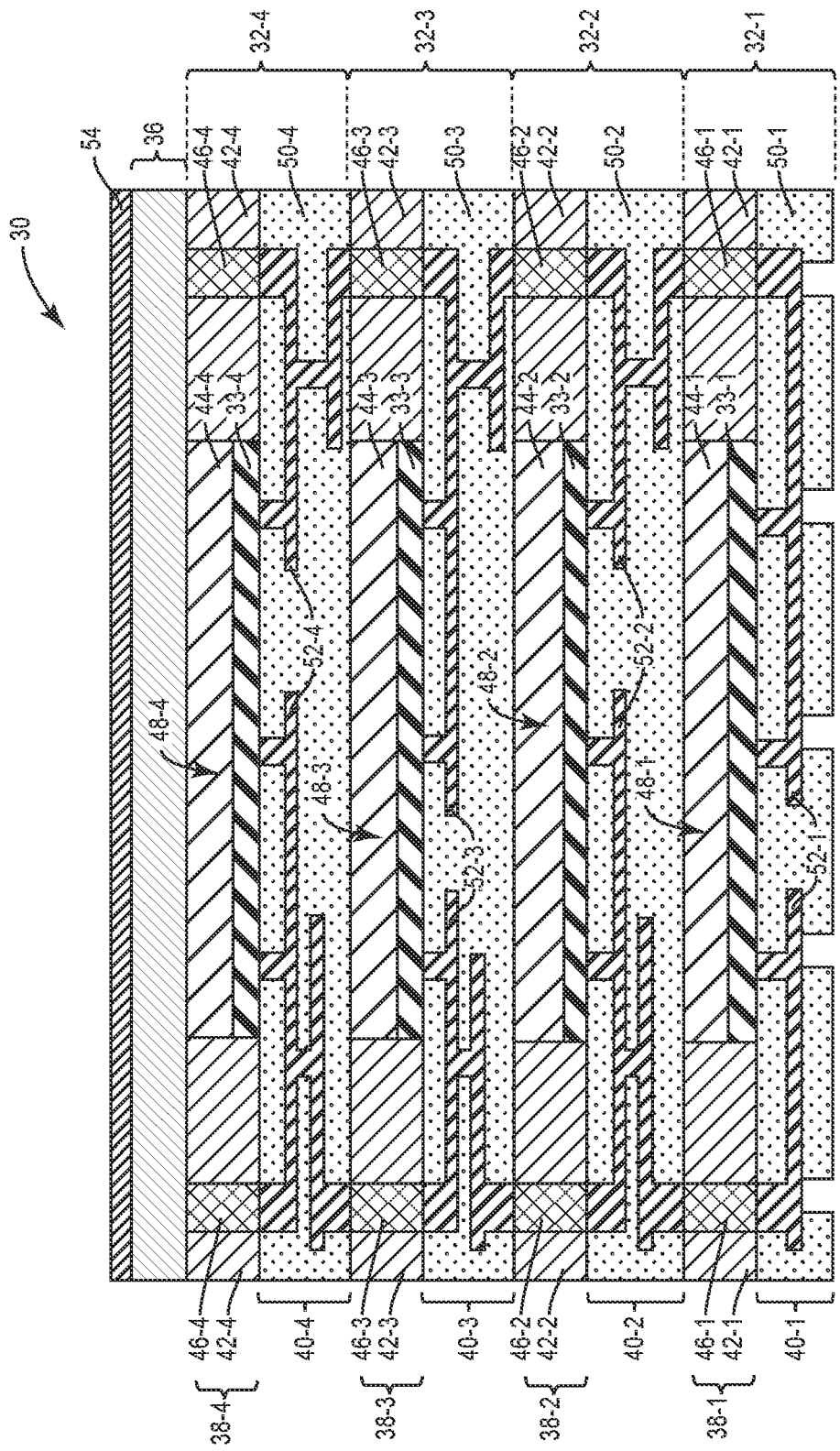

Next, the module carrier 80 is removed from the first die section 38-1, as illustrated in FIG. 34. Herein, the first thinned die 33-1 and the first vertical via structures 46-1 are exposed through the first mold compound 42-1 at the bottom of the first die section 38-1. The first redistribution structure 40-1 is then formed underneath the first die section 38-1, as illustrated in FIG. 35. The first redistribution structure 40-1 includes the first dielectric pattern 50-1 and the first redistribution interconnections 52-1 within the first dielectric pattern 50-1. Herein, the first redistribution interconnections 52-1 include some portions exposed through the first dielectric pattern 50-1 at the top of the first redistribution structure 40-1, such that the first redistribution interconnections 52-1 are configured to be connected to the first thinned die 33-1 and connected to the first vertical via structures 46-1 in the first die section 38-1. In addition, the first redistribution interconnections 52-1 also include some portions exposed through the first dielectric pattern 50-1 at the bottom of the first redistribution structure 40-1.

Figure 36:
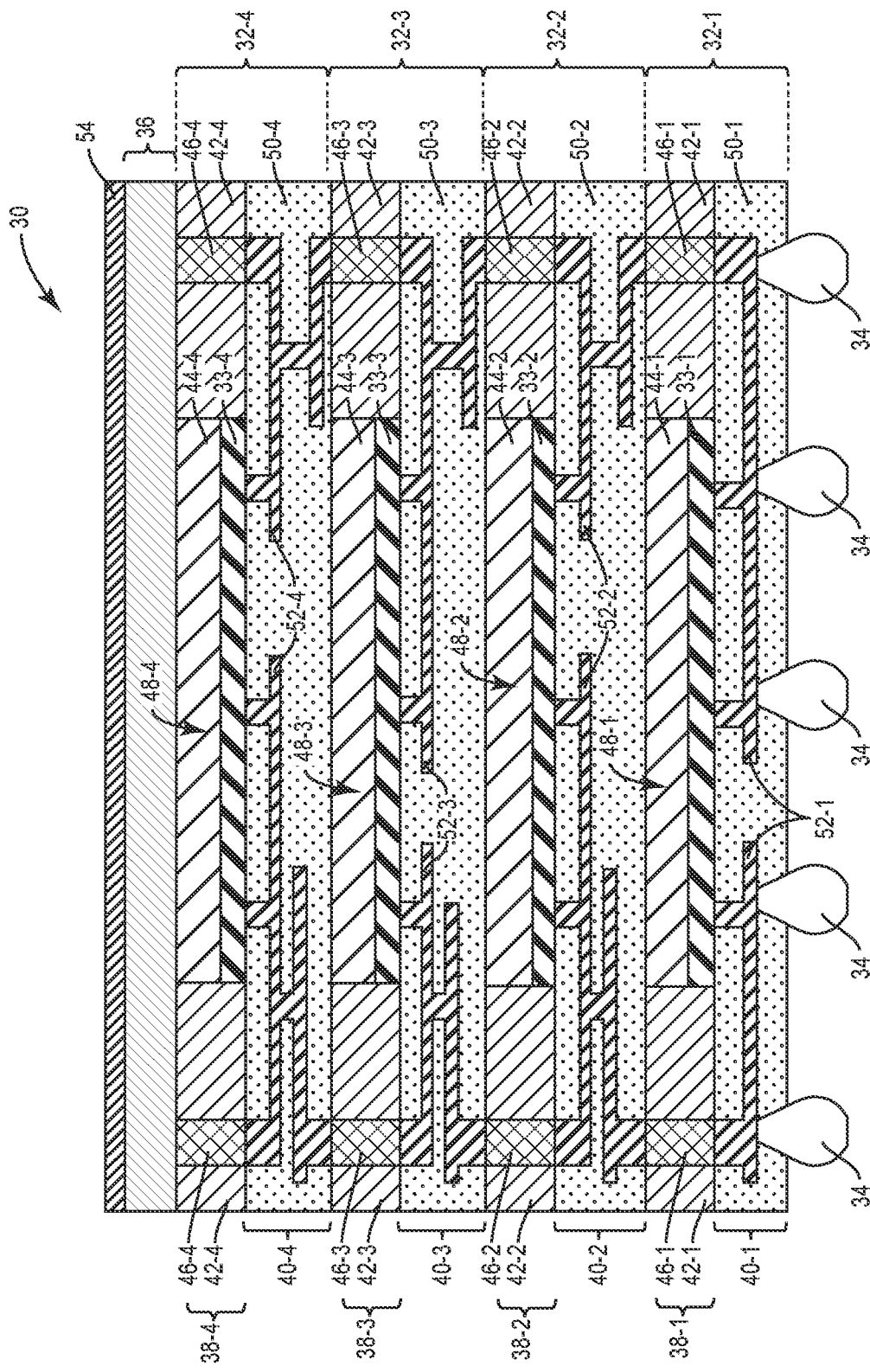

At last, the bump structures 34 are formed underneath the first redistribution structure 40-1 to provide the multi-level 3D package 30, as illustrated in FIG. 36. Each bump structure 34 is coupled to an exposed portion of the first redistribution interconnections 52-1 at the bottom of the first redistribution structure 40-1. Herein, the bump structures 34, which might be copper pillars or solder balls, are separate from each other and protrude from the first dielectric pattern 50-1.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A multi-level three-dimensional (3D) package comprising:
   a lower package level that includes a lower redistribution structure and a lower die section over the lower redistribution structure, wherein:
      the lower die section includes a lower thinned die, a lower mold compound, a lower intermediary mold compound, and lower vertical via structures, wherein the lower thinned die and the lower mold compound are deposed over the lower redistribution structure, the lower mold compound surrounds the lower thinned die and extends vertically beyond a top surface of the lower thinned die to define a lower opening over the lower thinned die and within the lower mold compound, the lower intermediary mold compound resides over the lower thinned die and fills the lower opening within the lower mold compound, and each lower vertical via structure extends through the lower mold compound;
      the lower thinned die includes no silicon substrate and has a thickness less than 100 micrometers; and
      a top surface of the lower intermediary mold compound and a top surface of the lower mold compound are coplanar; and
   an upper package level that includes an upper redistribution structure over the lower package level and an upper die section over the upper redistribution structure, wherein:
      the upper die section includes an upper thinned die, an upper mold compound, and an upper intermediary mold compound, wherein the upper thinned die and the upper mold compound are deposed over the upper redistribution structure, the upper mold compound surrounds the upper thinned die and extends vertically beyond a top surface of the upper thinned die to define an upper opening over the upper thinned die and within the upper mold compound, and the upper intermediary mold compound resides over the upper thinned die and fills the upper opening within the upper mold compound;
      the upper thinned die includes no silicon substrate and has a thickness less than 100 micrometers; and
      a top surface of the upper intermediary mold compound and a top surface of the upper mold compound are coplanar.

2. The multi-level 3D package of claim 1, wherein:
   the lower redistribution structure includes a lower dielectric pattern and lower redistribution interconnections within the lower dielectric pattern;

the upper redistribution structure includes an upper dielectric pattern and upper redistribution interconnections within the upper dielectric pattern; and the lower thinned die is connected to the upper thinned die through the lower redistribution interconnections in the lower redistribution structure, the lower vertical via structures in the lower die section, and the upper redistribution interconnections in the upper redistribution structure.

3. The multi-level 3D package of claim 2 further comprising a plurality of bump structures formed underneath the lower redistribution structure, wherein:

each of the plurality of bump structures is connected to the lower redistribution interconnections through the lower dielectric pattern;

the plurality of bump structures are separate from each other and protrude from the lower dielectric pattern; and the plurality of bump structures are copper pillars or solder balls.

4. The multi-level 3D package of claim 2 further comprising one or more inner package levels vertically stacked between the lower package level and the upper package level, wherein:

each of the one or more inner package levels includes an inner redistribution structure and an inner die section over the inner redistribution structure;

each inner die section includes an inner thinned die, an inner mold compound, an inner intermediary mold compound, and inner vertical via structures, wherein the inner thinned die and the inner mold compound are deposed over the inner redistribution structure, the inner mold compound surrounds the inner thinned die and extends vertically beyond a top surface of the inner thinned die to define an inner opening over the inner thinned die and within the inner mold compound, the inner intermediary mold compound resides over the inner thinned die and fills the inner opening within the inner mold compound, and each inner vertical via structure extends through the inner mold compound;

the inner thinned die includes no silicon substrate and has a thickness less than 100 micrometers; and a top surface of the inner intermediary mold compound and a top surface of the inner mold compound are coplanar.

5. The multi-level 3D package of claim 4, wherein:

each inner redistribution structure includes an inner dielectric pattern and inner redistribution interconnections within the inner dielectric pattern; and the lower thinned die, the inner thinned die in each of the one or more package levels, and the upper thinned die are connected through the lower redistribution interconnections in the lower redistribution structure, the lower vertical via structures in the lower die section, the inner redistribution interconnections in each inner redistribution structure, the inner vertical via structures in each inner die section, and the upper redistribution interconnections in the upper redistribution structure.

6. The multi-level 3D package of claim 4 wherein:

at least one inner die section includes a plurality of thinned dies, wherein the inner thinned die is included in the plurality of thinned dies;

the at least one inner die section includes a plurality of intermediary mold compounds, wherein the inner intermediary mold compound is included in the plurality of intermediary mold compounds;

each of the plurality of thinned dies is deposed over the inner redistribution structure and surrounded by the inner mold compound, wherein the inner mold compound extends vertically beyond a top surface of each of the plurality of thinned dies to define an opening over each of the plurality of thinned dies and within the inner mold compound;

each of the plurality of intermediary mold compounds resides over a corresponding one of the plurality of thinned dies and fills a corresponding opening within the inner mold compound;

each of the plurality of thinned dies includes no silicon substrate and has a thickness less than 100 micrometers; and a top surface of each of the plurality of intermediary mold compounds and a top surface of the inner mold compound are coplanar.

7. The multi-level 3D package of claim 1 further comprising a top protection structure over the upper die section of the upper package level, wherein:

the top protection structure is in contact with the upper mold compound and the upper intermediary mold compound in the upper die section;

the top protection structure is configured to provide chemical and gas/air contamination protection.

8. The multi-level 3D package of claim 7 further comprising a metal shield over the top protection structure, wherein the metal shield is configured to provide electromagnetic shielding of the multi-level 3D package.

9. The multi-level 3D package of claim 1 wherein:

the upper intermediary mold compound is formed of one of a group consisting of organic epoxy resin system, a molding material with a thermal conductivity higher than 50W/mK, a molding material with a magnetic permeability higher than 50, and a molding material with an electric permittivity higher than 10; and the lower intermediary mold compound is formed of one of a group consisting of organic epoxy resin system, a molding material with a thermal conductivity higher than 50W/mK, a molding material with a magnetic permeability higher than 50, and a molding material with an electric permittivity higher than 10.

10. The multi-level 3D package of claim 1 wherein the upper thinned die and the lower thinned die are different types of dies.

11. The multi-level 3D package of claim 10 wherein the upper intermediary mold compound and the lower intermediary mold compound are formed of different materials.

12. The multi-level 3D package of claim 1 wherein:

at least one of the upper thinned die and the lower thinned die is an active die, which includes an insulating layer, an active layer underneath the insulating layer, and a back-end-of-line (BEOL) portion underneath the active layer;

the active layer is configured to provide one or more active devices; and the BEOL portion includes dielectric layers and metal structures within the dielectric layers, wherein the metal structures are configured to connect the active devices in the active layer to each other and/or configured to connect the active devices in the active layer to external components.

13. The multi-level 3D package of claim 12 wherein:

the active die is formed from a silicon-on-insulator (SOI) structure;

the active layer of the active die is formed by integrating the one or more active devices in or on a silicon epitaxy layer of the SOI structure; and the insulating layer of the active die is a buried oxide layer of the SOI structure.

14. The multi-level 3D package of claim 1 wherein:

at least one of the upper thinned die and the lower thinned die is a passive die, which includes an insulating layer and a BEOL portion underneath the insulating layer; and the BEOL portion includes dielectric layers and metal structures within the dielectric layers, wherein the metal structures are configured to provide one or more passive devices and configured to connect the passive devices to external components.

15. The multi-level 3D package of claim 1 further comprising a top redistribution structure over the upper die section of the upper package level, wherein:

the upper die section further includes upper vertical via structures, each of which extends through the upper mold compound;

the top redistribution structure includes a top dielectric pattern and top redistribution interconnections within the top dielectric pattern; and the top redistribution interconnections are configured to be connected to the upper vertical via structures.

16. The multi-level 3D package of claim 15 further comprising one or more un-thinned components residing over the top redistribution structure, wherein:

each of the one or more un-thinned components has a thickness larger than 100 micrometers;

the upper redistribution structure includes an upper dielectric pattern and upper redistribution interconnections within the upper dielectric pattern; and the one or more un-thinned components are configured to be connected to the upper thinned die through the top redistribution interconnections, the upper vertical via structures, and the upper redistribution interconnections.

17. The multi-level 3D package of claim 16 wherein each of the one or more un-thinned components is one of a gallium arsenide (GaAs) die, a complementary metal-oxide-semiconductor (CMOS) die, and a surface mounted device (SMD).

18. The multi-level 3D package of claim 1 further comprising one or more un-thinned components residing underneath the lower redistribution structure of the lower die section, wherein:

each of the one or more un-thinned components has a thickness larger than 100 micrometers;

the lower redistribution structure includes a lower dielectric pattern and lower redistribution interconnections within the lower dielectric pattern; and the one or more un-thinned components are configured to be connected to the lower thinned die through the lower redistribution interconnections.

19. The multi-level 3D package of claim 18 further comprising a plurality of bump structures formed underneath the lower redistribution structure, wherein:

each of the plurality of bump structures is connected to the lower redistribution interconnections through the lower dielectric pattern;

each of the plurality of bump structures is separate from the one or more un-thinned components underneath the lower redistribution structure, and protrudes from the lower dielectric pattern;

each the plurality of bump structures has a same height and is taller than one or more un-thinned components; and the plurality of bump structures are copper pillars or solder balls.

20. The multi-level 3D package of claim 1 wherein:

the lower die section includes a plurality of thinned dies, wherein the lower thinned die is included in the plurality of thinned dies;

the lower die section includes a plurality of intermediary mold compounds, wherein the lower intermediary mold compound is included in the plurality of intermediary mold compounds;

each of the plurality of thinned dies is deposed over the lower redistribution structure and surrounded by the lower mold compound, wherein the lower mold compound extends vertically beyond a top surface of each of the plurality of thinned dies to define an opening over each of the plurality of thinned dies and within the lower mold compound;

each of the plurality of intermediary mold compounds resides over a corresponding one of the plurality of thinned dies and fills a corresponding opening within the lower mold compound;

each of the plurality of thinned dies includes no silicon substrate and has a thickness less than 100 micrometers; and a top surface of each of the plurality of intermediary mold compounds and a top surface of the lower mold compound are coplanar.

21. The multi-level 3D package of claim 1 wherein:

the upper die section includes a plurality of thinned dies, wherein the upper thinned die is included in the plurality of thinned dies;

the upper die section includes a plurality of intermediary mold compounds, wherein the upper intermediary mold compound is included in the plurality of intermediary mold compounds;

each of the plurality of thinned dies is deposed over the upper redistribution structure and surrounded by the upper mold compound, wherein the upper mold compound extends vertically beyond a top surface of each of the plurality of thinned dies to define an opening over each of the plurality of thinned dies and within the upper mold compound;

each of the plurality of intermediary mold compounds resides over a corresponding one of the plurality of thinned dies and fills a corresponding opening within the upper mold compound;

each of the plurality of thinned dies includes no silicon substrate and has a thickness less than 100 micrometers; and a top surface of each of the plurality of intermediary mold compounds and a top surface of the upper mold compound are coplanar.

22. The multi-level 3D package of claim 1 wherein:

the lower die section includes a plurality of first thinned dies and a plurality of first intermediary mold compounds, wherein:

the lower thinned die is included in the plurality of first thinned dies, and wherein the lower intermediary mold compound is included in the plurality of first intermediary mold compounds;

each of the plurality of first thinned dies is deposed over the lower redistribution structure and surrounded by the lower mold compound, wherein the lower mold compound extends vertically beyond a top surface of each of the plurality of first thinned dies to define a first opening over each of the plurality of first thinned dies and within the lower mold compound;

each of the plurality of first intermediary mold compounds resides over a corresponding one of the plurality of first thinned dies and fills a corresponding first opening within the lower mold compound;

each of the plurality of first thinned dies includes no silicon substrate and has a thickness less than 100 micrometers; and a top surface of each of the plurality of first intermediary mold compounds and a top surface of the lower mold compound are coplanar; and the upper die section includes a plurality of second thinned dies and a plurality of second intermediary mold compounds, wherein:

the upper thinned die is included in the plurality of second thinned dies, and wherein the upper intermediary mold compound is included in the plurality of second intermediary mold compounds;

each of the plurality of second thinned dies is deposed over the upper redistribution structure and surrounded by the upper mold compound, wherein the upper mold compound extends vertically beyond a top surface of each of the plurality of second thinned dies to define a second opening over each of the plurality of second thinned dies and within the upper mold compound;

each of the plurality of second intermediary mold compounds resides over a corresponding one of the plurality of second thinned dies and fills a corresponding second opening within the upper mold compound;

each of the plurality of second thinned dies includes no silicon substrate and has a thickness less than 100 micrometers; and a top surface of each of the plurality of second intermediary mold compounds and a top surface of the upper mold compound are coplanar.

23. The multi-level 3D package of claim 22 wherein the plurality of first thinned dies in the lower die section and the plurality of second thinned dies in the upper die section have different numbers of thinned dies.

24. The multi-level 3D package of claim 22 wherein the plurality of first thinned dies in the lower die section and the plurality of second thinned dies in the upper die section have different layouts.

25. The multi-level 3D package of claim 22 wherein the plurality of first thinned dies in the lower die section and the plurality of second thinned dies in the upper die section provide different functionalities.

26. The multi-level 3D package of claim 25 wherein:

the plurality of first thinned dies in the lower die section achieves a receiver functionality;

the plurality of second thinned dies in the upper die section achieves a transmitter functionality; and the upper redistribution structure between the lower die section and the upper die section include an isolation metal shield to isolate signals in the lower die section and the upper die section.

\* \* \* \* \*